(12) United States Patent
Suzuki et al.

(10) Patent No.: US 7,728,953 B2
(45) Date of Patent: Jun. 1, 2010

(54) EXPOSURE METHOD, EXPOSURE SYSTEM, AND SUBSTRATE PROCESSING APPARATUS

(75) Inventors: Hiroyuki Suzuki, Chofu (JP); Yuuiki Ishii, Yokohama (JP); Shinishi Okita, Nishi-tokyo (JP)

(73) Assignee: Nikon Corporation, Tokyo (JP)

( * ) Notice: Subject to any disclaimer, the term of this patent is extended or adjusted under 35 U.S.C. 154(b) by 787 days.

(21) Appl. No.: 11/513,161

(22) Filed: Aug. 31, 2006

(65) Prior Publication Data

US 2007/0052939 A1    Mar. 8, 2007

Related U.S. Application Data

(63) Continuation of application No. PCT/JP2005/003156, filed on Feb. 25, 2005.

(60) Provisional application No. 60/717,329, filed on Sep. 15, 2005.

(30) Foreign Application Priority Data

Mar. 1, 2004    (JP)    ............................. 2004-056167

(51) Int. Cl.
*G03B 27/52*    (2006.01)
*G03B 27/42*    (2006.01)
(52) U.S. Cl. ......................................... 355/55; 355/53
(58) Field of Classification Search .................. 355/52, 355/53, 55, 77; 430/311; 250/548; 356/399–401
See application file for complete search history.

(56) References Cited

U.S. PATENT DOCUMENTS

| | | | | |
|---|---|---|---|---|
| 5,120,134 A | * | 6/1992 | Kosugi | 356/401 |
| 5,525,808 A | * | 6/1996 | Irie et al. | 250/548 |
| 6,538,260 B1 | * | 3/2003 | Koga | 250/548 |
| 6,744,512 B2 | * | 6/2004 | Takahashi | 356/401 |
| 7,265,841 B2 | * | 9/2007 | Matsumoto | 356/401 |

FOREIGN PATENT DOCUMENTS

| | | |
|---|---|---|
| DE | 39 42 678 A1 | 6/1990 |
| JP | A 61-044429 | 3/1986 |
| JP | A 62-076622 | 4/1987 |
| JP | A 62-084516 | 4/1987 |
| JP | A 02-170515 | 7/1990 |
| JP | A 2000-036451 | 2/2000 |
| JP | A 2001-338860 | 12/2001 |
| JP | A 2001-345243 | 12/2001 |
| JP | A 2002-043217 | 2/2002 |
| JP | A 2002-353121 | 12/2002 |
| JP | A 2003-049421 | 2/2003 |

* cited by examiner

*Primary Examiner*—Hung Henry Nguyen
(74) *Attorney, Agent, or Firm*—Oliff & Berridge, PLC

(57) ABSTRACT high performance and high quality micro devices, etc. are produced highly efficiently at a high throughput. Before transferring a wafer W to an exposure apparatus 200 for exposing the wafer W, marks formed on the wafer W is measured by an in-line measurement device 400 and a measurement result and/or a result of performing calculation processing on the measurement result is notified to the exposure apparatus 200. In the exposure apparatus 200, a measurement condition is optimized based on the notified result and an alignment processing and other processing are performed.

13 Claims, 34 Drawing Sheets

OFFSET X (dx=Cx_00)

OFFSET Y (dy-Cy_00)

SCALING Y (dy=Cy_01×y)

ROTATION Y (dx=Cx_01×y)

ROTATION X (dy=Cy_10×x)

ECCENTRIC SCALING X ($dx = Cx\_20 \times x^2$)

ECCENTRIC SCALING Y ($dy = Cy\_02 \times y^2$)

TRAPEZOID X (dx=Cx_11×x×y)

TRAPEZOID Y (dy=Cy_11×y×x)

FAN-SHAPE X ($dx = Cx\_02 \times y^2$)

FAN-SHAPE Y (dy=Cy_20×x²)

C-SHAPE SCALING X (dx=Cx_30×x$^3$)

C-SHAPE SCALING Y ($dy = Cy\_03 \times y^3$)

ACCORDION X (dx=Cx_21×$x^2$×y)

ACCORDION Y $(dy = C_{y\_12} \times y^2 \times x)$

C-SHAPE DISTORTION X ($dx = Cx\_12 \times x \times y^2$)

C-SHAPE DISTORTION Y $(dy=Cy\_21 \times y \times x^2)$

RIVER FLOW X ($dx = Cx\_03 \times y^3$)

RIVER FLOW Y $(dy=Cy\_30 \times x^3)$

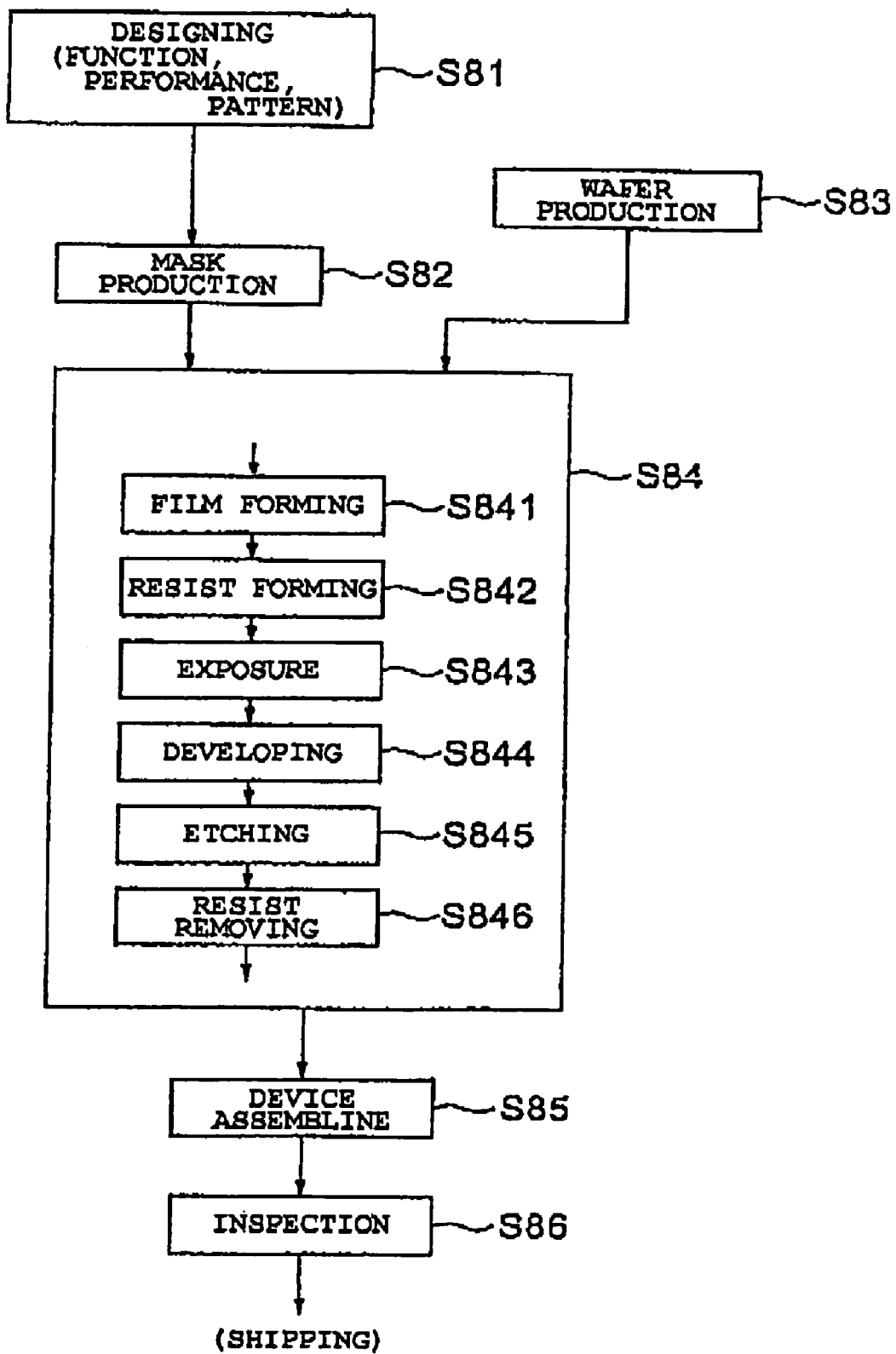

EXPOSURE METHOD, EXPOSURE SYSTEM, AND SUBSTRATE PROCESSING APPARATUS

TECHNICAL FIELD

This is a Continuation of International Application No. PCT/JP2005/003156 filed Feb. 25, 2005, which claims priority of Japanese Patent Application No. 2004-056167 filed Mar. 1, 2004. This application also claims priority of U.S. Provisional Application No. 60/717,329 filed Sep. 15, 2005. The disclosures of the prior applications are incorporated herein by reference in their entirety.

The present invention relates to a pre-measurement processing method, an exposure system and a substrate processing apparatus for forming a circuit pattern with high accuracy at high throughput in a photolithography step for producing, for example, a semiconductor element, liquid crystal display element, image pickup element and thin film magnetic head, etc.

BACKGROUND ART

Many of various devices, such as a semiconductor element, liquid crystal display element, image pickup element (CCD: charge coupled device) and thin film magnetic head, are produced by stacking a large number of layer patterns on a substrate and exposing the same by using an exposure apparatus. Therefore, when exposing patterns of the second layer or layers after that on the substrate, alignment of each shot region having a pattern already formed thereon and mask pattern image, that is, alignment of the substrate and reticle has to be performed accurately. For this purpose, marks for aligning called alignment marks are respectively formed in a form of being attached to respective shot regions (chip pattern regions) on the substrate, on which the first layer pattern is exposed, in a stage coordinate system.

When the substrate with alignment marks formed thereon is transferred to an exposure apparatus, mark positions (coordinate values) in the stage coordinate system is measured by a mark measurement device provided to the exposure apparatus. Next, based on the measured mark positions and designed positions of the marks, alignment for aligning one shot region on the substrate to the reticle pattern is performed.

An the alignment method, the die-by-die (D/D) alignment for aligning by measuring an alignment mark of each shot region on the substrate is known, however, in terms of improving the throughput, the enhancement global alignment (EGA) for accurately specifying regularity of an shot arrangement on the substrate by using a statistical method as disclosed in the Japanese Unexamined Patent Publications No. 61-44429 and No. 62-84516 has become mainstream currently.

The EGA is a method of measuring positions of alignment marks of a plurality (for example 7 to 15) of sample shots selected in advance, operating statistical calculation using the least-square method, etc., so that an error of the measured values from designed positions of the alignment marks becomes minimum, calculating positional coordinates of all shot regions (a shot arrangement) on the substrate, then, stepping the substrate stage based on the calculated shot arrangement. The EGA eliminates mainly linear errors (a remained rotation error of the substrate, an orthogonal degree error of the stage coordinate system (or shot arrangement), linear expansion and contraction (scaling) and offset (horizontal movement) of the substrate (the center position), etc.) arising on the shot arrangement.

Also, due to nonlinear deformation on the substrate caused by polishing and other processing and thermal expansion, a stage grid error (error between the stage coordinate systems) between exposure apparatuses and absorption state of the substrate, etc., a nonlinear shot arrangement error arises. As a technique for eliminating the nonlinear errors (random errors) as above, the grid compensation matching (GCM) is known.

As the GCM, there are a method of, during an exposure sequence (exposure processing on a process wafer), extracting nonlinear components by using a result of EGA as a criterion by making an EGA measurement again, holding an averaged value of extracted nonlinear components of a plurality of wafers as a map correction value, and correcting shot positions by using the map correction value in the exposure sequence after that (for example, refer to the Japanese Unexamined Patent Publication No. 2001-345243); and a method of measuring nonlinear components (a deviation amount of each shot) by using a standard wafer for each exposure condition and process in advance separately from the exposure sequence, storing the same as map correction files, and using a map correction file in accordance with the exposure condition to correct the respective shot positions (for example, refer to the Japanese Unexamined Patent Publication No. 2002-353121), etc.

Also, a technique of evaluating differences of positions of a shot arrangement after eliminating linear error components by the EGA method explained above and designed positions based on a predetermined evaluation function (nonlinear error components), determining a function for expressing the nonlinear components based on the evaluation results and, based thereon, correcting the shot arrangement has been applied by the present inventors (the Japanese Patent Application No. 2003-49421).

To furthermore improve accuracy of superimposition of circuit patterns, there is known super distortion matching (SDM), wherein a distortion of a projection optical system of the exposure apparatus used for exposure in the previous step is measured in advance and registered as distortion data to a database, and focusing characteristics, etc. of the projection optical system of the exposure apparatus in the next step is adjusted in units of lot, so that the same image distortion as image distortion based on the distortion in the previous step arises in the exposure apparatus used for exposure in the next stop from the distortion data and exposure history of the substrate (for example, refer to the Japanese Unexamined Patent Publications No. 2000-36451 and No. 2001-338860).

In addition, since a level difference due to circuit patterns, etc. formed in the previous stop exists on a substrate surface, on which a device is being formed, as a technique relating to focus adjusting, there is proposed a technique for providing a surface shape measurement device for measuring the surface shape of the substrate to the exposure apparatus, measuring a surface shape of a substrate during an exposure sequence, obtaining an optimal focal position and correcting based thereon (for example, refer to the Japanese Unexamined Patent Publication No. 2002-43217). Also, as a technique relating to determination of the best focal position to be a criterion of adjusting a focal position of the projection optical system of the exposure apparatus, there is a method of exposing and transferring a test pattern to a test substrate at a plurality of positions in the direction along an optical axis of the projection optical system, checking after development, and using a focal position where the finest pattern is exposed as the best focus.

As explained above, the substrate transferred to the exposure apparatus is subjected to measurement of a variety of information on the substrate, such as mark positions and surface shape, immediately before performing exposure processing, a correction value, etc. are suitably calculated based thereon, and alignment of the substrate is made by using the same to perform exposure processing, so that a circuit pattern is highly accurately formed on the substrate.

However, in the related arts explained above, since measurement of a variety of information on the substrate is made on the substrate transferred to the exposure apparatus immediately before performing the exposure processing, for example, when sufficiently highly accurate measurement cannot be made due to deformation and crush, etc. arising on the marks, there have been disadvantages that sufficient alignment accuracy cannot be secured, suspension of the exposure processing due to arising of an alignment error and re-measurement of other marks become necessary, and the throughput (a processing amount per unit time) declines in some cases. Particularly, in the EGA, GCM and SDM, etc., complicated calculation processing is performed, so that a certain time is necessary for obtaining a solution (correction coefficient) in some cases, so that the exposure processing on the substrate has to be in a standby state during that time. Therefore, calculation of the correction value has to be made in units of lot or process, and an optimal correction cannot be made for each substrate or each shot.

Also, when some abnormality arises in the previous step and a pattern formed on the substrate can not satisfy the required accuracy, performing of next exposure step becomes wasteful operation, so that it has to be effectively prevented.

Patent article 1: the Japanese Unexamined Patent Publications No. 61-44429

Patent article 2: the Japanese Unexamined Patent Publications No. 62-84516

Patent article 3: the Japanese Unexamined Patent Publications No. 2001-345243

Patent article 4: the Japanese Unexamined Patent Publications No. 2002-353121

Patent article 5: the Japanese Unexamined Patent Publications No. 2000-36451

Patent article 6: the Japanese Unexamined Patent Publications No. 2001-338860

Patent article 7: the Japanese Unexamined Patent Publications No. 2002-43217

DISCLOSURE OF THE INVENTION

Accordingly, an object of the present invention is to attain high throughput and high efficiency in producing high performance and high quality micro devices, etc.

According to the first aspect of the present invention, there is provided a pre-measurement processing method, comprising a pre-measurement step for measuring a mark formed on a substrate before transferring the substrate into an exposure apparatus for exposing the substrate (S21); and a notification step for notifying waveform data of the mark measured in the pre-measurement step to at least one device among the exposure apparatus, an analyzing device provided separately from the exposure apparatus, and a management device positioned higher than these devices for managing at least one of them (S22). Here, the "waveform data" is a measurement signal (so-called raw waveform data) output from a detection sensor of a CCD provided to a measurement device used when measuring the marks or a signal obtained by performing some (predetermined) processing (for example, electrical filtering processing or other pre-processing, etc.) on the measurement signal having substantially the same content as the measurement signal (information which results in substantially the same measurement result). Namely, in the present specification, the "waveform data" is a concept including "processed waveform data" obtained by performing predetermined processing as explained above on the raw waveform data in addition to "raw waveform data" as it is output from the detection sensor. Note that the above raw waveform data includes image data (for example, two-dimensional image data in the case of XY two-dimensional measurement marks). Also, as the above predetermined processing, compression processing, thinning out processing and smoothing processing, etc. are included.

In the present invention, pre-measurement is made before transferring marks of the substrate to the exposure apparatus, so that, for example, when main measurement is made on the marks in the exposure apparatus, marks with mark deformation and mark crash are omitted in advance, or a mark combination having small error is specified by performing statistic calculation processing, etc. in advance, etc. Therefore, at the time of main measurement in the exposure apparatus, optimal marks or an optimal measurement condition of marks can be selected. Accordingly, re-measurement of marks and suspension of processing due to an alignment error in the exposure apparatus are reduced, and sufficient alignment accuracy can be secured in one-time main measurement.

Also, since there is a certain time after measuring marks in the pre-measurement step until transferring of the substrate for being prepared for exposure processing, various complicated statistic calculation processing, etc. can be completed based on a measurement result by the pre-measurement during that time. Therefore, measurement of the marks for the statistic calculation processing in the exposure apparatus or the statistic calculation processing can be omitted. As a result, exposure processing can be performed promptly after transferring the substrate to the exposure apparatus, and optimal position correction can be made for each substrate or each shot.

Furthermore, waveform data is to be notified, so that, for example, by obtaining a characteristic difference between a measurement device used in the pre-measurement in the pre-measurement step and a measurement device used in the main measurement in the exposure apparatus (characteristic difference due to difference of sensors, focusing optical systems and illumination optical systems, etc. characteristic difference due to environmental changes and changes over time, and characteristic difference due to difference of signal processing algorithms, etc.) during lot processing or in advance and correcting the both to be matched, measurement results of the both can be evaluated based on the same criterion.

In the pre-measurement processing method according to the first aspect of the present invention, an evaluation step for evaluating the mark measured in the pre-measurement step based on a predetermined evaluation criterion (S22) is furthermore provided; and the notification step is capable of selecting notification of the waveform data and prohibition of the notification in accordance with an evaluation result in the evaluation step. In that case, the evaluation result may be notified when the waveform data is not notified. All of waveform data may be notified, but a data amount is generally large, so that it is not preferable to notify all in terms of a load on communication, etc. However, by applying the method as above, notification of the waveform data can be omitted in some cases and a load on communication, etc. can be reduced.

According to the second aspect of the present invention, there is provided a pre-measurement processing method, comprising a pre-measurement step for measuring a mark formed on a substrate before transferring the substrate to an exposure apparatus for exposing the substrate (S21); an evaluation step for evaluating the mark measured in the pre-measurement stop based on a predetermined evaluation criterion (S22); and a notification step for notifying an evaluation result obtained in the evaluation step or information relating to an evaluation to at least one of the exposure apparatus, an analyzing device provided separately from the exposure apparatus, and a management device positioned higher than these devices for managing at least one of them (S22).

In the present invention, since pre-measurement is made on the marks of the substrate before transferring into the exposure apparatus, in the same way as in the pre-measurement processing method according to the first aspect of the present invention explained above, arising of alignment error is reduced at the main measurement in the exposure apparatus, and an improvement of the throughput and securing of sufficient alignment accuracy can be realized. Also, by performing various calculation processing in advance, it is possible to promptly perform exposure processing on the substrate transferred to the exposure apparatus, and an improvement of the throughput and optimal position correction for each substrate or each shot become possible. Furthermore, for example, a measurement result indicating mark positions is notified instead of waveform data as above, so that a data amount to be transferred is small and a communication load is small.

According to a third aspect of the present invention, there is provided a pre-measurement processing method, comprising a pre-measurement step for measuring positions of a plurality of marks formed on a substrate before transferring the substrate into an exposure apparatus for exposing the substrate (S41); and a correction information calculation step for calculating correction information including a linear correction coefficient and nonlinear correction coefficient, by which an error from a designed position of each of the marks becomes minimum, based on a measurement result measured in the pre-measurement step (S42 to S49, S36 and S37).

In the invention, since a correction coefficient is calculated based on a pre-measured measurement result, in the exposure apparatus, the calculated correction information is used and the substrate is swiftly aligned and subjected to exposure processing, so that an improvement of the throughput and optimal position correction for each substrate or each shot become possible.

According to a fourth aspect of the present invention, there is provided a pre-measurement processing method, comprising a pre-measurement step for measuring positions of a plurality of marks formed on a substrate before transferring the substrate into an exposure apparatus for exposing the substrate (S61); an image distortion calculation step for calculating information on image distortion of a projection optical system of other exposure apparatus already exposed the substrate based on a measurement result measured in the pre-measurement step (S62 to S67 in S55A); and a correction information calculation step for calculating image distortion correction information for giving in the exposure apparatus image distortion generated in the other exposure apparatus based on information on image distortion of a projection optical system of the other exposure apparatus calculated in the image distortion calculation step and information on an image distortion of a projection optical system provided to the exposure apparatus obtained in advance (S55B and S55C).

In the invention, since image distortion arose in the previous step and image distortion correction information are calculated based on the pre-measured measurement result, in the exposure apparatus in the next step, the calculated image distortion correction information is used to change focusing characteristics, etc. of a projection optical system, and the transferred substrate can be promptly subjected to exposure processing, so that an improvement of the throughput and optimal image distortion correction for each substrate or each shot become possible.

According to a fifth aspect of the present invention, there is provided a pre-measurement processing method, comprising a pre-measurement step for measuring a phase shift focus mark formed on a substrate before transferring the substrate into an exposure apparatus for exposing the substrate; and a focus correction information calculation step for calculating focus correction information to be used at exposing the substrate in the exposure apparatus by obtaining a focus error at exposure by other exposure apparatus already exposed the substrate based on a measurement result measured in the pre-measurement step.

In the invention, since pre-measurement is made on phase shift focus marks formed on the substrate and focus correction information in calculated based on the measurement result, in the exposure apparatus in the next step, the calculated focus correction information is used and optimal focus adjustment is made to promptly perform exposure processing on the transferred substrata, consequently, an improvement of the throughput and optimal focus adjustment for each substrate or each shot become possible.

According to a sixth aspect of the present invention, there is provided a pre-measurement processing method, comprising a pre-measurement step for measuring a surface shape of a substrate before transferring the substrate into an exposure apparatus for exposing the substrate (S74); and correction information calculation step for calculating focus correction information to be used at exposing in the exposure apparatus based on a measurement result measured in the pre-measurement step (S76).

In the invention, pre-measurement is made on a surface shape of the substrate and focus correction information is calculated based on the measurement result, in the exposure apparatus in the next step, the calculated focus correction information is used and optimal focus adjustment is made to promptly perform exposure processing on the transferred substrate, consequently, an improvement of the throughput and optimal focus adjustment for each substrate or each shot become possible.

According to a seventh aspect of the present invention, there is provided a pre-measurement processing method, comprising a pre-measurement step for measuring positions of a plurality of marks formed on a substrate before transferring the substrate into an exposure apparatus for exposing the substrate; a temperature and/or humidity and/or air pressure measurement step for measuring a temperature change and/or humidity change and/or air pressure change in at least one device among a measurement device used for measuring in the pre-measurement step, a transfer device for transferring the substrate from the measurement device to the exposure apparatus, and the exposure apparatus; an estimation step for estimating changes of positions of the marks measured in the pre-measurement step based on a temperature change and/or humidity change and/or air pressure change measured in the temperature and/or humidity and/or air pressure measurement step; and a correction information calculation step for calculating correction information including a linear correction coefficient and nonlinear correction coefficient, by which an error from a designed position of each of the marks becomes minimum, based on an estimation result estimated in the estimation step.

In the invention, positions of the marks on the substrate is pre-measured in the same way as in the pre-measurement processing method according to the third aspect of the present invention, however, when a temperature change arises in the transferring step of the substrate actual positions of the pre-measured marks change in accordance with the temperature change due to expansion/contraction of the substrate. Changes of mark positions along with the temperature changes can be obtained by actually measuring a relation of temperature changes and mark position changes in advance by using a test substrate, etc. logically from a thermal expansion coefficient, etc. of the substrate, or actually measuring a relation of temperature changes and mark position changes during an exposure sequence to learn, etc. In the invention, changes of the mark positions along with temperature changes are predicted and, based on positional information corrected based thereon, correction information is calculated, so that more accurate position correction can be attained.

According to an eighth aspect of the present invention, there is provided a pre-measurement processing method, comprising a pre-measurement step for measuring at least one of mark positions on a substrate, a mark shape, a pattern line width, a pattern defect, a focus error, a surface shape, and a temperature, humidity and air pressure in other exposure apparatus already exposed the substrate before transferring the substrate into an exposure apparatus for exposing the substrate (S21); and a determination step for determining whether or not to continue transferring processing of the substrate to the exposure apparatus based on a measurement result measured in the pre-measurement step (S25, S26 and S29).

When some abnormality arises in the previous step and a pattern formed on the substrate is unable to be formed at required accuracy, performing of the next exposure step becomes wasteful. In the invention, marks and pattern, etc. on the substrate is pre-measured before being transferred to the exposure apparatus or environmental information, such as a temperature, etc. inside the exposure apparatus in the previous step is pre-measured, and when abnormality actually arises or when it is highly possible that abnormality arises, transferring of the substrate to the exposure apparatus can be stopped. Therefore, substantial operation availability of the exposure apparatus can be improved.

According to a ninth aspect of the present invention, there is provided a pre-measurement processing method, comprising a pre-measurement stop for measuring information on a substrate before transferring the substrate into an exposure apparatus for exposing the substrate; and an optimization stop for optimizing a measurement condition in the pre-measurement step in accordance with an operation state of the exposure apparatus. Here, the operation state of the exposure apparatus includes an actual state of calibration performed for matching an operation criterion and a predetermined criterion in the exposure apparatus when the two have a gap, etc., a retry state, such as re-measurement due to a measurement error of information, etc. on the substrate, or interruption or suspension state of exposure processing by the exposure apparatus. Also, the measurement condition includes measurement of mark positions, measurement of a surface shape of the substrate and other measurement items, the number of marks to be measured and other number of measurement, and a data amount per one measurement, etc. The measurement condition is preferably optimized to be maximum in a range of not causing a decline of the throughput of the exposure processing.

For example, when calibration or retry arise in the exposure apparatus, exposure processing delays exactly for time taken thereby. In other words, even if time taken by pre-measurement is made longer exactly for that time, throughput of the exposure processing is not adversely affected. In the pre-measurement step, the larger the number or measuring items, measurement number and data amount, etc. are, the more precise analysis and accurate calculation of correction values, etc. become possible. A measurement condition is optimized in accordance with an operation state of the exposure apparatus in the present invention, so that more precise analysis and accurate calculation of correction values become possible without declining the throughput and, furthermore, the exposure accuracy can be improved.

According to a tenth aspect of the present invention, there is provided a pre-measurement processing method, comprising a pre-measurement step for measuring information on a substrate before transferring the substrate into an exposure apparatus for exposing the substrate; and an optimization step for optimizing a measurement condition in the pre-measurement stop in accordance with periodicity obtained from a measurement result measured in the pre-measurement step. Here, the periodicity includes a cycle of taking in lots, a processing cycle of substrates in a lot and a cycle over time, such as year, month and day etc. Also, the measurement condition includes valid measurement items for analyzing abnormality causes, the number of measurement, and a data amount per one measurement, etc.

For example, if there is not any trouble or abnormality in the previous step, lots are often taken in at a certain cycle. When the cycle becomes long, it is presumed that some trouble or abnormality has arisen in the lot in the previous step. In this invention, a measurement condition in the pre-measurement stop is optimized in accordance with the periodicity, that is, pre-measurement is made under a valid measurement condition for analyzing causes of the trouble and abnormality, so that causes of troubles and abnormalities can be more accurately specified.

According to an eleventh aspect of the present invention, there is provided a pre-measurement processing method, comprising a pre-measurement step for pre-measuring information on a substrate before transferring the substrate into an exposure apparatus for exposing the substrate; and an optimization step for optimizing a measurement condition in the pre-measurement step in accordance with the number of errors obtained from a measurement result measured in the pre-measurement step. Here, the measurement condition includes valid measurement items for analyzing abnormality causes, the number of measurement and a data amount per one measurement, etc.

When errors frequently arise in the previous step, a cause of the errors has to be specified. Thus, in the present invention, since a measurement condition in the pre-measurement step is optimized in accordance with the number or errors, more specifically, pre-measurement under an effective measurement condition is made for analyzing a cause of the trouble and abnormality, the cause of the trouble and abnormality can be more accurately specified.

According to a twelfth aspect of the present invention, there is provided a pre-measurement processing method, comprising a pre-measurement step for pre-measuring information on a substrate before transferring the substrate into an exposure apparatus for exposing the substrate; and an optimization step for optimizing a collection condition of related data at the time of exposure of the substrate in the exposure apparatus based on a measurement result measured in the pre-measurement step. Here, the data collection condition includes whether or not to collect data, kinds of data to be collected and a data amount, etc.

In this invention, since data collection in the exposure apparatus is optimized based on a pre-measured result, for example, when the pre-measured result is preferable, it is considered unnecessary to collect same data as the pre-measurement in the exposure apparatus, while when the pre-measured result is defective, re-measurement is made to collect data or related other kind of data measurement is made, so that data collection can be made efficient.

According to a thirteenth aspect of the present invention, there is provided a pre-measurement processing method, comprising a pre-measurement stop for pre-measuring information on a substrate before transferring the substrate into an exposure apparatus for exposing the substrate; and an optimization step for optimizing a collection condition of data in the pre-measurement step based on a collection condition of data to be collected at the time of exposure of the substrate in the exposure apparatus.

In this invention, since a data collection condition at the time of pre-measurement is optimized based on the data collection condition in the exposure apparatus, for example, if data to be collected in the exposure apparatus is also collected in the pre-measurement, the same data is doubly collected and is not effective in some cases. In that case, by preventing double collection, data collection can be made highly effective.

Note that, in the pre-measurement processing method according to the first to thirteenth aspects explained above, the pre-measurement step is performed in the measurement device provided in the coating/developing device connected to the exposure apparatus by in-line, or performed in a measurement device provided separately from the exposure apparatus.

According to a fourteenth aspect of the present invention, an exposure system, comprising an exposure apparatus (200, 13) for exposing a substrate; a pre-measurement device (400) for measuring marks formed on a substrate before transferring the substrate to the exposure apparatus; and a notification device (400, 450 and connection cable) for notifying waveform data of the marks measured in the pre-measurement step to at least one device among the exposure apparatus, an analyzing device (600) provided separately from the exposure apparatus, and a management device (500, 700) positioned higher than these devices for managing at least one of the devices. In this case, it is preferable that an evaluation device (450, 600, 13) for evaluating the marks measured in the pre-measurement step based on a predetermined evaluation criterion is furthermore provided; and the notification device is capable of selecting notification of the waveform data and prohibition of the notification in accordance with an evaluation result by the evaluation device. The same effects can be attained as those in the pre-measurement processing method according to the first aspect of the present invention explained above.

According to a fifteenth aspect of the present invention, there is provided an exposure system, comprising an exposure apparatus (200, 13) for exposing a substrate; a pre-measurement device (400) for measuring marks formed on a substrate before transferring the substrate to the exposure apparatus; an evaluation device (450) for evaluating the marks measured in the pre-measurement step based on a predetermined evaluation criterion; and a notification device (400, 450 and connection cable) for notifying an evaluation result obtained by the evaluation device or information relating to an evaluation to at least one device among the exposure apparatus, an analyzing device (600) provided separately from the exposure apparatus, and a management device (500, 700) positioned higher than these devices for managing at least one of the devices. The same effects can be attained as those in the pre-measurement processing method according to the second aspect of the present invention explained above.

According to a sixteenth aspect of the present invention, there is provided an exposure system, comprising a pre-measurement device (400) for measuring at least one of mark positions on a substrate, a mark shape, a pattern line width, a pattern defect, a focus error, a surface shape, and a temperature, humidity and air pressure in other exposure apparatus already exposed the substrate before transferring the substrate into an exposure apparatus (200, 13) for exposing the substrate; and a determination device (450, 600, 13) for determining whether or not to continue transferring processing of the substrate to the exposure apparatus based on a measurement result measured in the pre-measurement device. The same effects can be attained as those in the pre-measurement processing method according to the eighth aspect of the present invention explained above.

According to a seventeenth aspect of the present invention, there is provided a substrate processing device (300) for performing predetermined processing on a substrate before or after exposure processing in an exposure apparatus (200) for exposing to transfer a pattern to the substrate, comprising a pre-measurement device (400) for measuring at least one of mark positions on a substrate, a mark shape, a pattern line width, a pattern defect, a focus error, a surface shape, and a temperature, humidity and air pressure in other exposure apparatus already exposed the substrate before transferring the substrate into an exposure apparatus for exposing the substrate via a mask pattern; and a determination device (450) for determining whether or not to continue transferring processing of the substrate to the exposure apparatus based on a measurement result measured in the pre-measurement device. The same effects can be attained as those in the pre-measurement processing method according to the third aspect of the present invention explained above.

Note that, as an example, in the exposure system according to the fourteenth to sixteenth aspects of the present invention explained above, the pre-measurement device is provided in the coating/developing device connected to the exposure apparatus by in-line.

According to the present invention, there is an effect that high performance and high quality micro devices, etc. can be produced at high throughput and high efficiency.

BRIEF DESCRIPTION OF DRAWINGS

FIG. 16 is a flowchart showing a production procedure of an electronic device.

BEST MODE FOR CARRYING OUT THE INVENTION

Figure 1:
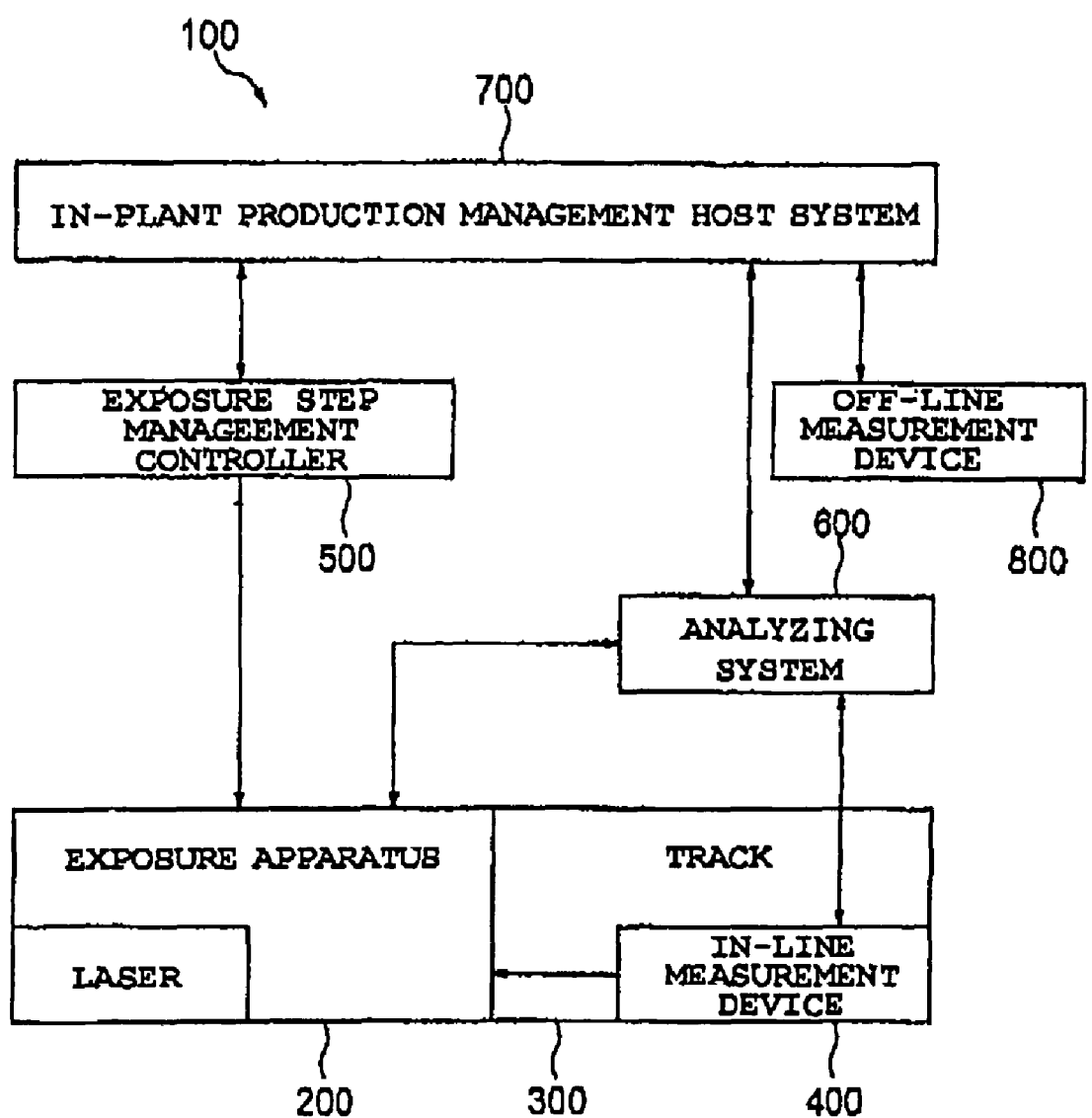
FIG. 1 in a block diagram showing the allover configuration of an exposure system according to an embodiment of the present invention.

Below, an embodiment of the present invention will be explained in detail based on the drawings.

Exposure System

First, the overall configuration of the exposure system according to the present embodiment will be explained with reference to FIG. 1. The exposure system 100 is installed in a substrate processing plant for processing substrates, such as semiconductor wafers and glass plates, and producing micro devices or other devices; and provided with, as shown in the same figure, an exposure apparatus 200 equipped with a light source, such as a laser light source, a coating/development device (indicated by "a truck" in the figure) 300 arranged adjacent to the exposure apparatus 200, and an in-line measurement device 400 arranged inside the coating/development device 300. In the figure, for convenience of illustrating, only one the exposure apparatus 200 and coating/development device 300 including the in-line measurement device 400 is illustrated as an integrated substrate processing apparatus, but a plurality of the substrate processing apparatuses are actually provided. The substrate processing apparatus performs a coating stop for applying a photosensitive agent, such as photoresist, to the substrate, an exposure stop for performing projection exposure of a pattern image of a mask or reticle on the substrate coated with the photoresist agent, and a developing step for developing the substrate finished with the exposure processing.

Also, the exposure system 100 is also provided with an exposure step management controller 500 for intensively managing the exposure step performed by each exposure apparatus 200, that is, positioning higher than the exposure apparatuses and managing the exposure apparatuses, an analyzing system 600 for performing various calculation processing and analyzing processing, an in-plant production management host system 700 positioning higher than an off-line measurement device 800, the analyzing system 600 (in-line measurement device 400) and the exposure step management controller 500 (exposure apparatus 200) and managing the same, and the off-line measurement device 800. Among the respective devices composing the exposure system 100, at least the respective substrate processing devices (200 and 300) and the off-line measurement device 800 are installed in a clean room, wherein the temperature and humidity are managed. The respective devices are connected by a LAN (Local Area Network) or other network or by an exclusive line (wired or unwired), and data communication can be made suitably between them.

In each of the substrate processing device, the exposure apparatus 200 and the coating/development device 300 are mutually connected by in-line. Here, the in-line connection means connecting between devices and processing units inside the device via a transfer device, such as a robot arm and a slider, for automatically transferring substrates. While an explanation will be made later on, the in-line measurement device 400 is provided as one of a plurality or processing units arranged in the coating/development device 300 and is a device for measuring various information on the substrate in advance before transferring the substrate into the exposure apparatus 200. The off-line measurement device 800 is a measurement device provided independently from other devices and provided to the exposure system 100 by the number of one or more.

Exposure Apparatus

The configuration of the exposure apparatus 200 equipped to each of the substrate processing apparatuses will be explained with reference to FIG. 2. The exposure apparatus 200 may be a step-and-scan type (scanning exposure type), but a step-and-repeat type (integral exposure type) exposure apparatus will be explained as an example here.

Note that, in the following explanation, an XYZ orthogonal coordinate system is set in FIG. 2, and positional relationships of respective members will be explained with reference to the XYZ orthogonal coordinate system. The XYZ orthogonal coordinate system is sat, so that the X-axis and the Z-axis become in parallel with the paper surface and the Y-axis is set to be in the orthogonal direction with respect to the paper surface. In the XYZ orthogonal coordinate system in the figure, the XY-plane is actually set to be a parallel plane with respect to the horizontal plane, and the Z-axis is set to be in the vertical upward direction.

Figure 2:
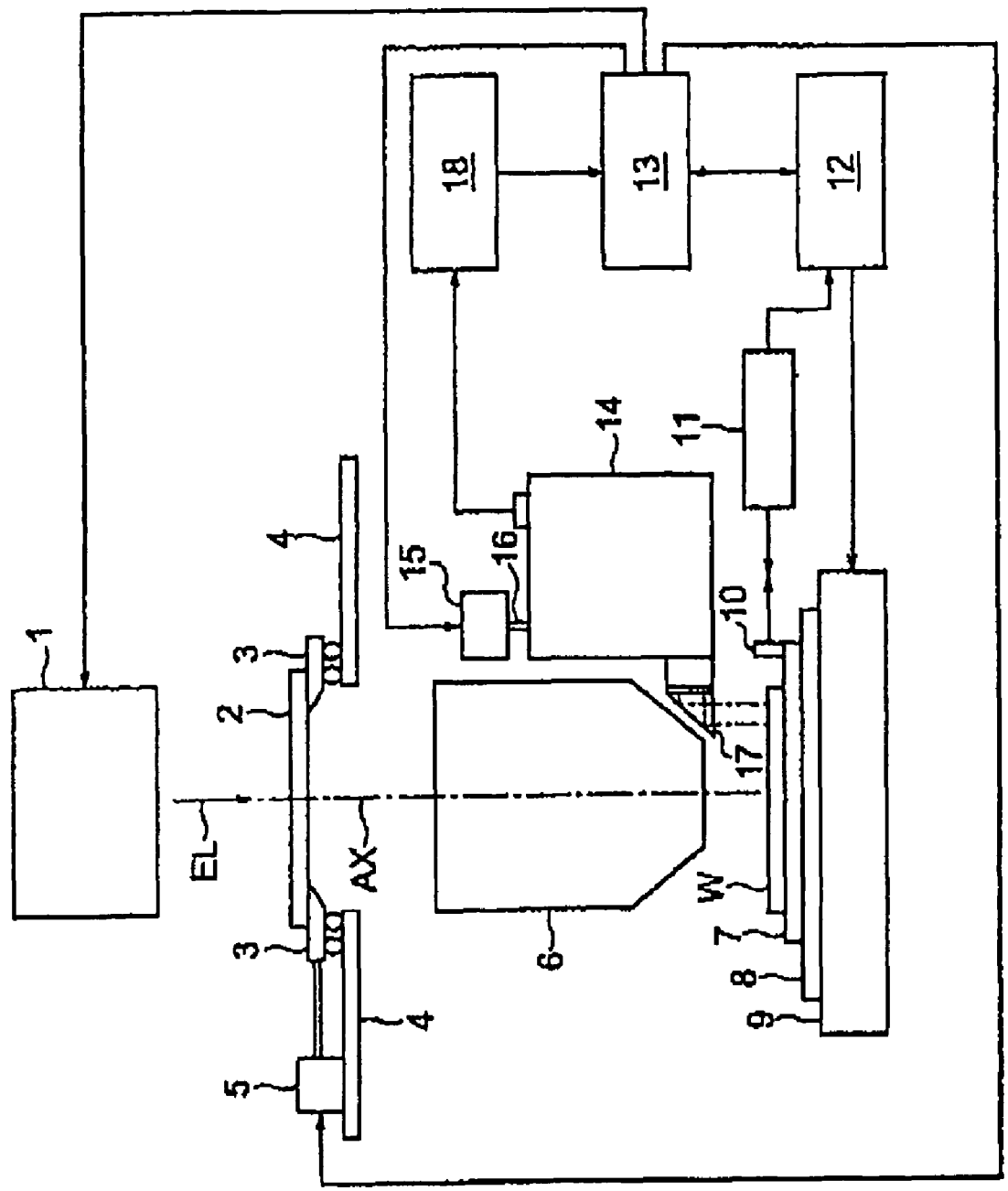
FIG. 2 is a view showing the schematic configuration of an exposure apparatus provided to the exposure system according to the embodiment of the present invention.

In FIG. 2, when a later explained exposure control device 13 outputs a control signal to instruct emission of an exposure light, the illumination optical system 1 emits an exposure light EL having almost uniform illuminance to illuminate a reticle 2. An optical axis of the exposure light EL is set to be in parallel with the Z-axis direction. As the exposure light EL, for example, a g-line (waveform: 436 mm), an i-line (waveform: 365 nm), a KrF excimer laser (waveform: 248 nm), an ArF excimer laser (waveform: 193 nm) and an $F_2$ laser (waveform: 157 nm) are used.

The reticle 2 has a fine pattern to be transferred to a wafer (substrate) W coated with a photoresist and held on a reticle holder 3. The reticle holder 3 is supported to be able to move on the XY-plane on a base 4 and finely rotate. The exposure control device 13 for controlling an operation of the entire apparatus controls an operation of the reticle stage 3 via a drive device 5 on the base 4 and sets a position of the reticle 2.

When the exposure light EL is emitted from the illumination optical system 1, a pattern image of the reticle 2 is projected to each shot region as a part to be a device on the wafer W via the projection optical system 6. The projection optical system 6 has an optical element, such as a plurality of lenses, and a glass material of the optical element is selected from quartz, fluorite or other optical material in accordance with a wavelength of the exposure light EL. The wafer W is mounted on a Z-stage 8 via a wafer holder 7. The optical element in the projection optical system can finely move in the Z-axis direction and finely rotate about the X-axis and Y-axis to adjust later explained focusing characteristics (magnification and distortion, etc.) of the projection optical system 6. Note that adjustment of the focusing characteristics of the projection optical system 6 may be performed by changing an air pressure between optical elements.

The Z-stage 8 is a stage for finely adjusting a position of the wafer W in the Z-axis direction and is mounted on the XY-stage 9. The XY-stage 9 is a stage for moving the wafer W on the XY-plane. Note that, while not illustrated, a stage for finely rotating the wafer W on the XY-plane and a stage for adjusting inclination of the wafer W with respect to the XY-plane by changing an angle with the Z-axis are also provided.

One end of an upper surface of the wafer holder 7 is attached an L-shaped movable mirror 10, and a laser interferometer 11 is provided at a position facing to the mirror surface of the movable mirror 10. In FIG. 2, while the illustration is simplified, the movable mirror 10 is configured by a plane mirror having a vertical mirror surface with respect to the X-axis and a plane mirror having a vertical mirror surface with respect to the Y-axis. Also, the laser interferometer 11 is configured by two X-axis laser interferometers for illuminating a laser beam to the movable mirror 10 along the X-axis and a Y-axis laser interferometer for illuminating a laser beam to the movable mirror 10 along the Y-axis. One of the X-axis laser interferometers and one Y-axis laser interferometer measures an X-coordinate and Y-coordinate of the wafer holder 7.

Also, a rotation angle of the wafer holder 7 on the XY-plane is measured by a difference of measurement values of the two X-axis laser interferometers. Information of the X-coordinate, Y-coordinate and rotation angle measured by the laser interferometers 11 is supplied to a stage drive system 12. The information is output as positional information from the stage drive system 12 to the exposure control device 13. The exposure control device 13 controls an alignment operation of the wafer holder 7 via the stage drive system 12 while monitoring the supplied positional information. Note that, while not shown in FIG. 2, the reticle holder 3 is also provided with the same movable mirror and laser interferometers as those provided to the wafer holder 7, and information on an XYZ-position, etc. of the reticle holder 3 is supplied to the exposure control device 13.

Next to the projection optical system 6 is provided an off-axis type imaging alignment sensor 14. The alignment sensor 14 is an FIA (Field Image Alignment) type alignment device. The alignment sensor 14 is a sensor for measuring alignment marks formed on the wafer W. The alignment sensor 14 is irradiated by an emission light for illuminating the wafer W from the halogen lamp 15 via the optical fiber 16. Here, the halogen lamp 15 is used as a light source of the illumination light, because a wavelength band of an emission light by the halogen lamp is 500 to 800 nm, which is a wavelength band not sensed by the photoresist coated on the upper surface of the wafer W; and an effect of a reflection rate of the wafer W surface on wavelength characteristics can be reduced due to the wide wavelength band.

The illumination light emitted from the alignment sensor 14 is reflected on a prism mirror 17 and 6 irradiates the upper surface of the wafer W. The alignment sensor 14 takes in the reflected light from the wafer W upper surface via the prism mirror 17, converts a detection result to an electric signal and outputs to an alignment signal processing system 18. The alignment signal processing system 18 obtains a position of an alignment mark on the XY-plane based on the detection result from the alignment sensor 14 and outputs the same as wafer positional information to the exposure control device 13.

The exposure control apparatus 13 controls an overall operation of the exposure apparatus based on the positional information output from the stage drive system 12 and the wafer positional information output from the alignment signal processing system 18. To explain specifically, the exposure control device 13 operates later explained various calculations based on the positional information output from the alignment signal processing system 18 and, in accordance with need, later explained various data supplied from the in-line measurement device 400 and, then, outputs a drive control signal to the drive system 12. The drive system 12 performs stepping drive on the XY-stage 9 and Z-stage 8 based on the drive control signal. At this time, the exposure control device 13 outputs a drive control signal to the drive system 12, so that a position of a standard mark formed on the wafer W is detected by the alignment sensor 14. When the drive system 12 drives the XY-stage 9, a detection result of the alignment sensor 14 is output to the alignment signal processing system 18. From the detection result, a base line amount as a deviation amount of, for example, the detected center of the alignment sensor 14 and the center of the projected image of the reticle 2 (an optical axis AX of the projection optical system 6) is measured. Then, based on a value obtained by adding the base line amount to the position of the alignment mark measured by the alignment sensor 14, the X-coordinate and Y coordinate of the wafer W are controlled and each shot region is aligned to its exposure position.

Coating Development Apparatus

Next, the coating/development device 300 and the substrate transfer device provided to each of the substrate processing apparatus will be explained with reference to FIG. 3. The coating/developing device 300 is installed to contact with a chamber surrounding the exposure apparatus 200 by an in-line method. In the coating/developing device 300, a transfer device line 301 for transferring the wafer W is arranged to cross the center part thereof. At one end of the transfer device line 301, a wafer carrier 302 for holding a large number of wafers, which are yet to be exposed or having bean subjected to processing by the substrate processing apparatus in the previous step, and a wafer carrier 303 for holding a large number of wafers W finished with the exposure step and development step by the present substrate processing apparatus are arranged; and at the other and of the transfer device line 301, a transfer device opening (not shown) having a shutter is provided on the chamber side surface of the exposure apparatus 200.

Also, a coater portion (coating portion) 310 is provided along one side of the transfer device line 301 provided to the coating/developing device 300, and a developer portion (developing portion) 320 is provided along with the other side. The coater portion 310 is configured to comprise a resist coater 311 for coating photoresist to a wafer W, a pre-baking device 312 composed of a hot plate for pre-baking the photoresist on the wafer W, and a cooling device 313 for cooling the pre-baked wafer W.

The developer portion 320 is configured to comprise a post-baking device 321 for performing so-called PEB (Post-Exposure Baking) for baking the photoresist on the wafer W after exposure processing, a cooling device 322 for cooling the wafer W subjected to the PEB, and a developing device 323 for developing the photoresist on the wafer W.

Furthermore, in the present embodiment, an in-line measurement device 400 for pre-measuring information on the wafer W is installed by in-line before sending the wafer W to the exposure apparatus 200.

While not illustrated, a measurement device for measuring a shape of a photoresist pattern formed on the wafer W developed in the developing device 323 may be also installed by in-line. The measurement device is for measuring a shape (for example, a line width of the pattern and a superimposition error of the pattern, etc.) of a resist pattern formed on the wafer W. Note that, in the present embodiment, an error of such a pattern shape is also measured by the incline measurement device 400 in terms of a cost reduction of the apparatus.

Figure 3:
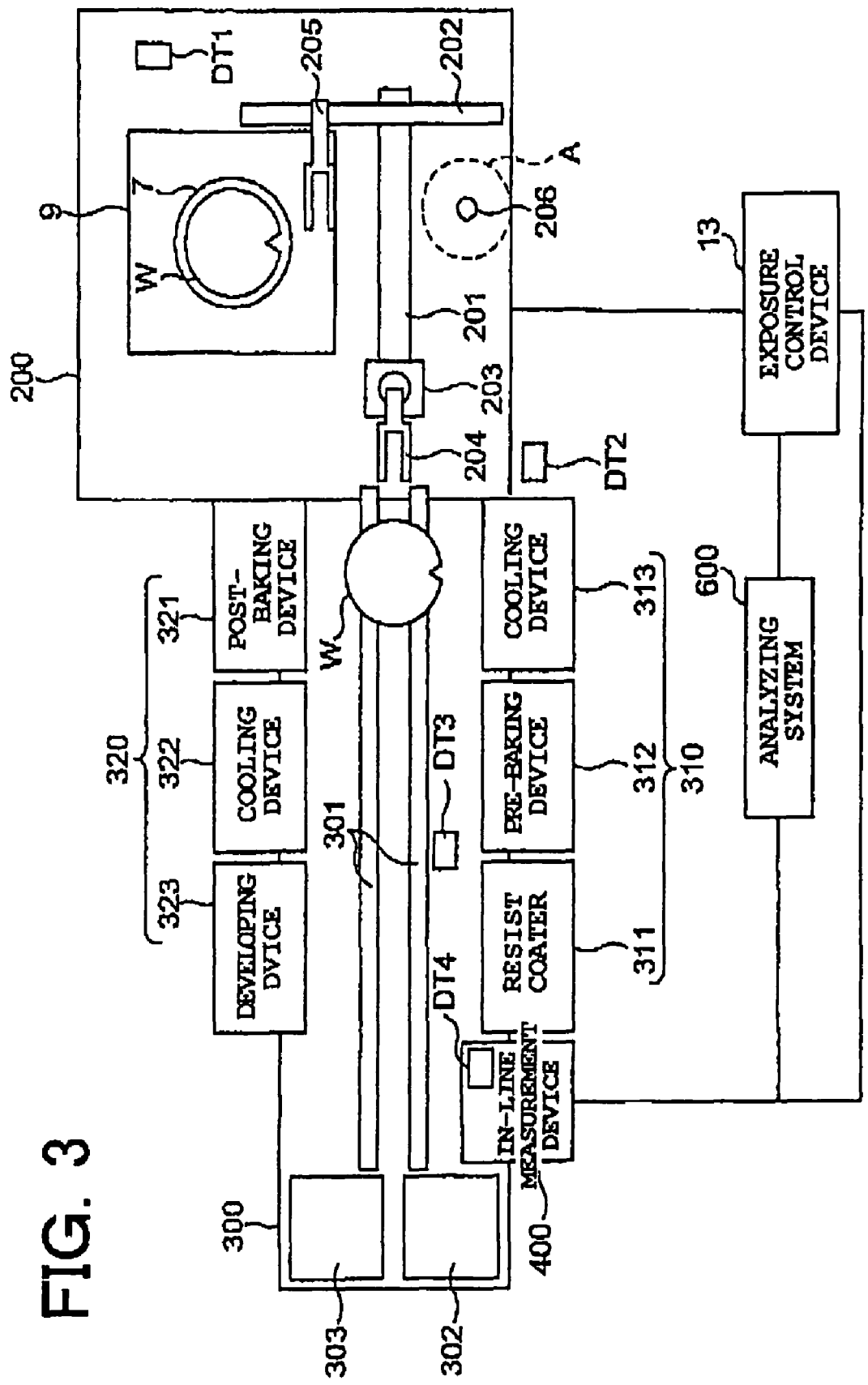
FIG. 3 is a view showing the schematic configuration of a coating/developing device, etc. connected to the exposure apparatus by in-line in the embodiment of the present invention.

Note that illustration in FIG. 3 of the respective units (the resist coater 311, pre-baking device 312 and a cooling device 313) composing the coater portion 310, the respective units (the post-baking device 321, cooling device 322 and developing device 323) composing the developer portion 320, and configuration and arrangement of the in-line measurement device 400 are for convenience and, actually, a plurality of other processing units and buffer units, etc. are furthermore provided, the respective units are arranged spatially, and a robot arm and elevator, etc. for transferring wafers W between the respective units are also provided. Also, an order of processing is not always the same, and through what path the wafers W pass between the respective units to be processed is optimized in terms of processing contents of processing units and a high speed of processing time as a whole and may be dynamically changed in some cases.

The exposure control apparatus 13 as the main control system provided to the exposure apparatus 200, the coater portion 310, the developer portion 320, the in-line measurement device 400 and the analyzing system 600 are connected with or without wire, and a signal indicating a start of processing and an end of processing for each of them is exchanged. Also, raw signal waveform data (a primary output from a later explained image pickup element 422 or data obtained by performing signal processing thereon, which can be restored to the same content as the original signal waveform data or to the original waveform data) measured by the in-line measurement device 400, a measurement result obtained by processing the same by a predetermined algorithm, or an evaluation result obtained by evaluating based on the measurement result are sent (notified) to the exposure control apparatus 13 directly or via the analyzing system 600. The exposure control device 13 records the sent information in a memory device, such as a hard disk, etc. attached to the exposure control device 13.

Inside the exposure apparatus 200, a first guide member 201 is arranged to be approximately along with an extended line of the center axis of the transfer device line 301 provided to the coating/developing device 300, and a second guide member 202 is arranged above an end portion of the first guide member 201 in a state of being orthogonal thereto.

The first guide member 201 is provided with a slider 203 formed to be able to slide along the first guide member 201, and the slider 203 is provided with a first arm 204 for holding a wafer W in a way of freely rotating and moving upward and downward. Also, the second guide member 202 is provided with a second arm 205 formed to be able to slide along the second guide member 202 in a state of holding a wafer W. The second guide member 202 extends to a loading position of a wafer of the wafer stage 9, and the second arm 205 is also provided with a mechanism for sliding in the orthogonal direction to the second guide member 202.

Also, a transfer pin 206 capable of rotating and moving upward and downward for pre-aligning a wafer W is provided near a position where the first guide member 201 crosses with the second guide member 202. Around the transfer pin 206 is provided with a position detection device (not shown) for detecting a notched part of an outer circumferential portion of the wafer W and positions of two wafer edge portions or an orientation flat formed on the outer circumferential portion of the wafer W and wafer edge portion. A wafer loader system (substrate transfer device) is configured by the first guide member 201, the second guide member 2002, the slider 203, the first arm 204, the second arm 205 and the transfer pin 206.

Also, a temperature sensor for measuring a temperature inside the chamber of the exposure apparatus 200, a humidity sensor for measuring humidity, an environment sensor DT1 for measuring a temperature outside of the substrate processing device (that is, inside a clean room), a humidity sensor for measuring humidity, an environment sensor DT2, such as an air pressure sensor, for measuring an air pressure, an environment sensor DT3 for measuring a temperature, humidity and air pressure, etc. around the transfer device line 301, and an environment sensor DT4 for measuring a temperature, humidity and air pressure, etc. inside the in-line measurement device 400 are provided; and detection signals from the sensors DT1 to DT4 are supplied to the exposure control device 13 and recorded in a memory device, such as a hard disk, attached to the exposure control device 13 for a certain time.

In-line Measurement Device

Next, the in-line measurement device 400 will be explained. The in-line measurement device 400 is provided with a pre-measurement sensor, and the pre-measurement sensor is provided at least one corresponding to a kind of information on the substrate, that is, a measurement item. For example, a sensor for measuring an alignment mark or other mark formed on a wafer, a line width, shape and defect, a sensor for measuring a surface shape (flatness) of the wafer, and a focus sensor, etc. may be mentioned as examples. To flexibly deal with measurement items, a state of a wafer and a resolution degree, etc., a plurality of kinds of sensors are preferably provided and selected in accordance with the condition for use. Note that the same sensors may be used for the off-line measurement device 800, so that the explanation thereon will be omitted. Note that the in-line measurement device 400 and the off-line measurement device 800 to be applied may be different in a measurement method (including measurement principles) and measurement items.

Below, as an example, an in-line measurement device using a pre-measurement sensor for measuring a position of an alignment mark formed on a wafer will be explained with reference to FIG. 4.

Figure 4:
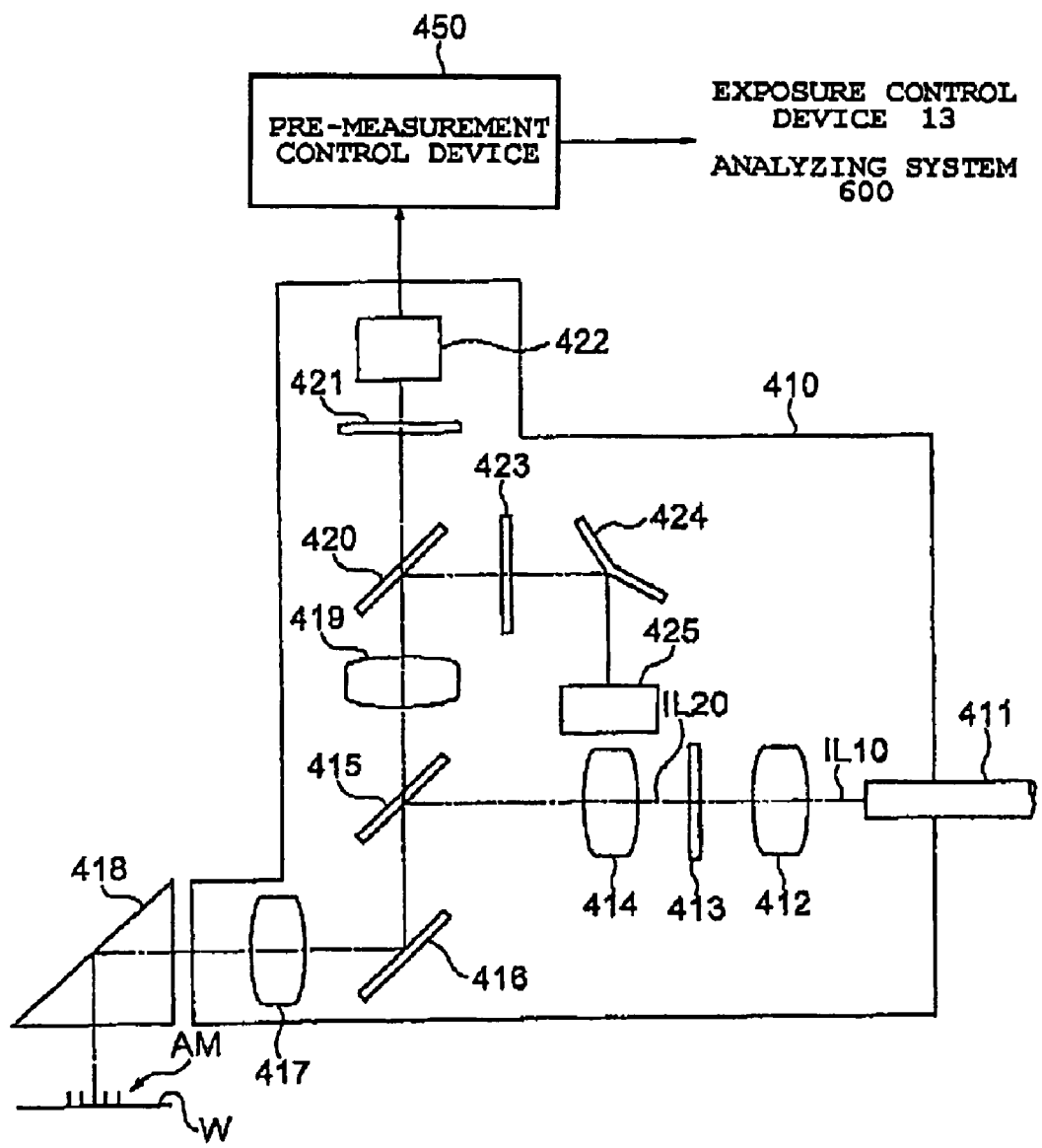
FIG. 4 is a view showing an example of a pre-measurement sensor applied to an in-line measurement device and an off-line measurement device in the embodiment of the present invention.

As shown in FIG. 4, the in-line measurement device 400 is configured to comprise a pre-measurement sensor 410 and a pre-measurement control device 450. Also, while not illustrated, a stage device for adjusting a position in the XYZ-axis direction and an inclination with respect to the Z-axis of a wafer to be measured and a laser interference system for measuring a position and posture of the wafer W are also provided. The stage device is configured to comprise an XY-stage, Z-stage and a wafer holder, and they have the same configurations as those of the XY-stage 9, Z-stage 8 and wafer holder 7 explained above in the exposure apparatus 200. The laser interference system also has the same configuration as those of the movable mirror 10 and the laser interferometer 11 of the exposure apparatus 200.

The pre-measurement sensor 410 in the in-line measurement device 400 is a sensor for measuring a position of an alignment mark formed on a wafer W, and basically the same sensor as that in the imaging alignment sensor 14 provided to the exposure apparatus 200 may be used. Here, as an example, a sensor used for the FIA (Field Image Alignment) method will be explained, but it may be a sensor used for the LSA (Laser Step Alignment) method or the LIA (Laser Interferometric Alignment) method.

Note that the LSA method sensor is an alignment sensor for measuring a position of an alignment mark by irradiating a laser light to the alignment mark formed on the substrate and using the diffracted and scattered light. The LIA method alignment sensor is an alignment sensor for irradiating laser lights having slightly different wavelength from two directions to an alignment mark in a diffraction grating formed on the substrate surface, bringing two diffracted lights generated thereby to interfere with each other, and detecting positional information of the alignment mark from a phase of the interfering light. In the in-line measurement device 400, in the same way as in the case of the exposure apparatus 200, it is preferable that two or more sensors are provided among the sensors if three methods so as to be used separately in accordance with the characteristics and states. Furthermore, as disclosed in the Japanese Unexamined Patent Publication No. 2003-224057, a sensor for measuring asymmetry of a mark to be measured may be provided.

In FIG. 4, an illumination light IL10 from an illumination light source, such as an external halogen lamp, is guided to the pre-measurement sensor 410 via an optical fiber 411. The illumination light IL10 is irradiated to a view field split diaphragm 413 via a condenser lens 412. On the view field split diaphragm 413, while the illustration is omitted, a mark illumination diaphragm formed by a wide rectangular shaped opening at the center and focus detection slits formed by a pair of narrow rectangular shaped openings arranged to sandwich the mark illumination diaphragm.

The illumination light IL10 is split by the view field split diaphragm 413 to a first light flux for mark illumination for illuminating an alignment mark region on the substrate W and a second light flux for focus position detection prior to alignment. The view field split illumination light IL20 passes through a lens system 414, reflected by a half mirror 415 and mirror 416, reflected by a prism mirror 418 via an object lens 417 and irradiates a mark region including an alignment mark AM formed on the wafer W and around it.

A reflected light on the surface of the substrate W when irradiating the illumination light IL20 is reflected by the prism mirror 418, passes through the object lens 417, reflected by the mirror 416, transmits the half mirror 415 and, then, reaches a beam splitter 420 via a lens system 419, and the reflected light is split in two directions. The first branch light transmitted the beam splitter 420 focuses an image of an alignment mark AM on an index plate 421. A light from the image and index mark on the index plate 421 irradiates the image pickup element 422 composed of a two-dimensional CCD, and images of the mark AM and index mark are focused on a light receiving surface of the image pickup element 422.

On the other hand, the second branch light reflected on the beam splitter 420 irradiates a light block plate 423. The light block plate 423 blocks a light irradiated on a predetermined rectangular region and lets a light irradiated on other regions transmit. Accordingly, the light block plate 423 blocks a branch light corresponding to the first light flux explained above and lets a branch light corresponding to the second light flux pass through. A branch light transmitted through the light block plate 423 irradiates a line sensor 425 composed of a one-dimensional CCD in a state that the telecentric property is broken down by pupil dividing mirror 424, and an image of focus detection slits is focused on a light receiving surface of the line sensor 425.

Here, since a telecentric property is secured between the substrata W and the image pickup device 422, when the substrate W displaces in the parallel direction with an optical axis of the illumination light and reflection light, an image of an alignment mark AM focused on the light receiving surface of the image pickup device 422 is defocused without changing the position on the light receiving surface of the image pickup element 422. On the other hand, the reflection light entered to the line sensor 425 has the telecentric property broken down as explained above, so that when the substrate displaces in the parallel direction with an optical axis of the illumination light and reflection light, a position of an image of focus detection slits focused on the light receiving surface of the line sensor 425 is deviated in the crossing direction with respect to an optical axis of the branch light. By using such a property, by measuring a deviation amount of the image on the line sensor 425 with respect to the standard position, a position (focal position) in the optical direction of the illumination light and reflection light or the substrate W is detected. Please refer to, for example, the Japanese Unexamined Patent Publication No. 7-321030 for details of this technique.

Note that the pre-measurement step by the in-line measurement device 400 is performed after transferring the wafer W to the coating/developing device 300 and preferably after the resist coating and before alignment processing in the exposure apparatus 200. Note that an installed position of the in-line measurement device 400 is not limited to that in the present embodiment and may be, for example, inside the coating/developing device 300 or inside the chamber of the exposure apparatus, alternately, a device exclusive to measurement may be provided separately from these devices and connected by a transfer device. However, when the in-line measurement device 400 is installed in the coating/developing device 300, there is an advantage that a size and shape of an exposure resist pattern can be immediately measured.

Wafer Process

Figure 5:
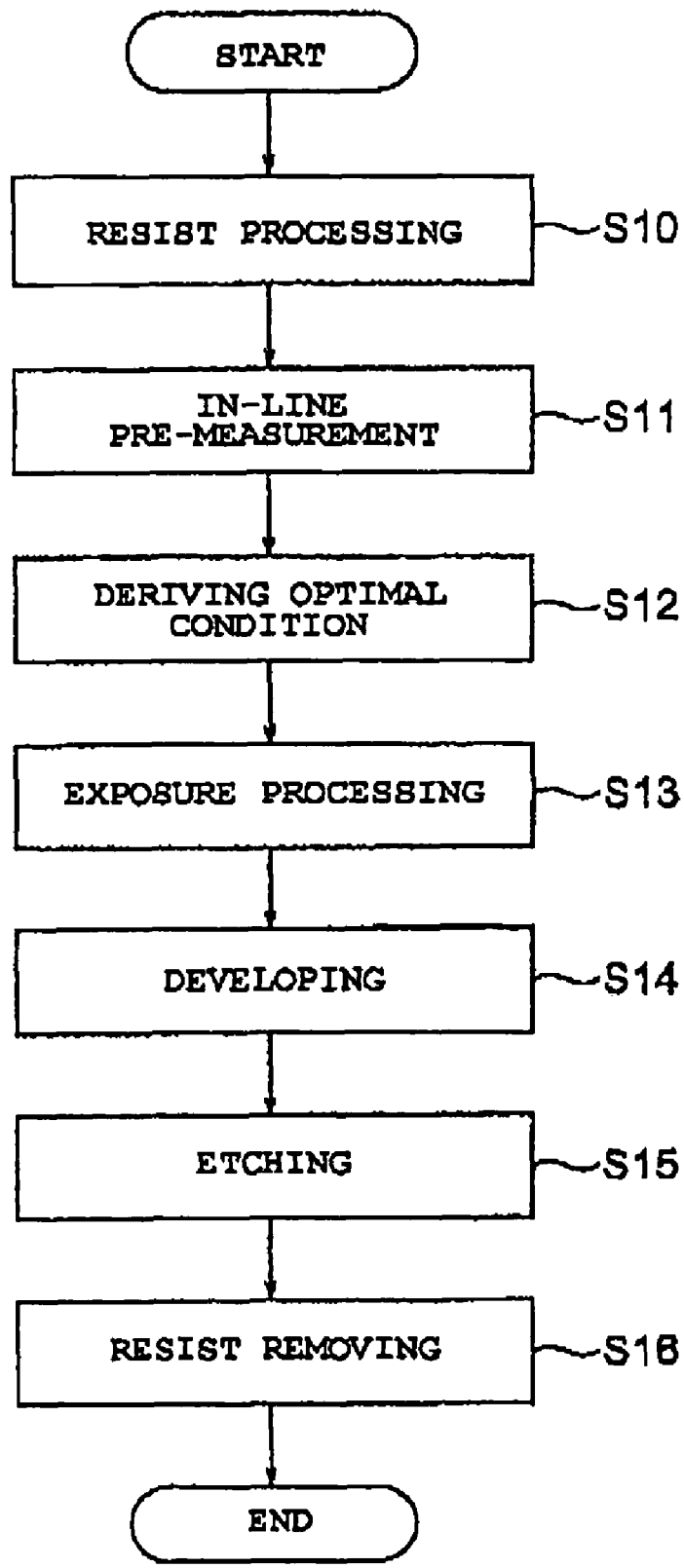
FIG. 5 is a flowchart showing a flow of processing of the embodiment of the present invention.

Next, processing on the wafer W shown in FIG. 5 will be plainly explained as well as operations of respective devices. First, a processing start instruction is output from an in-plant production management host system 700 shown in FIG. 1 to the exposure control device 13 via a network and an exposure step management controller 500. Based on the processing start instruction, the exposure control device 13 outputs various control signals to the exposure apparatus 200, coater portion 310, developer portion 320 and in-line measurement device 400. When the control signal is output, one wafer taken out from the wafer carrier 302 passes through the transfer device line 301 and transferred to the resist coater 311, coated with photoresist, successively passes through the pre-baking device 312 and the cooling device 313 along the transfer device line 301 (S10), transferred to a stage device of the in-line measurement device 400, and subjected to pre-measurement processing of an alignment mark (S11). Note that, here, the pre-measurement processing (S11) is performed after the resist processing (S10), but the order may be reversed.

In the pre-measurement processing (S11) in the in-line measurement device 400, a position of an alignment mark formed on the wafer W is measured. A measurement result (for example, coordinate positional information of the mark, etc.) of the pre-measurement processing (S11) together with raw signal waveform data as an output of the image pickup device 422 of the pre-measurement sensor 410 itself is notified to the exposure control device 13 through a communication line directly or via the analyzing system 600. Based on the notified data, the exposure control device 13 performs processing for optimizing a mark at the time of measuring an alignment mark of the wafer W (mark to be measured), the number of marks, an illumination condition (for example, an illumination wavelength, illumination intensity, dark-field illumination or bright-field illumination, and whether to adopt illumination via a phase difference plate, etc.) in the exposure apparatus 200 (S12). Note that to reduce a processing load on the exposure control device 13, a part or all of the optimizing processing may be performed by the analyzing system 600 and the analysis result may be sent to the exposure control device 13.

After the processing (S12) or in parallel with the processing, the wafer W finished with the pre-measurement processing (S11) is transferred to the first arm 204 of the exposure apparatus 30. After that, when the slider 203 reaches near the transfer pin 206 along the first guide member 201, the first arm 204 rotates and the wafer W is transferred from the first arm 204 to a position A on the transfer pin 206, where adjustment (pre-alignment) of the center position and rotation angle of the wafer W is made based on the contour standard. After that, the wafer W is transferred to the second arm 205, transferred to a loading position of the wafer along the second guide member 202, and loaded (transferred) to the wafer holder 7 on the wafer stages 8 and 9 there.

Than, after performing alignment processing including mark measurement under an optimized measurement condition, a pattern of a reticle is exposed and transferred to each shot region on the wafer W (S13).

The wafer W finished with the exposure processing is transferred to the transfer device line 301 of the coating/developing device 300 along the second guide member 202 and the first guide member 201, then, successively passed through the post-baking device 321 and the cooling device 322 along the transfer device line 301 and sent to the developing device 323. Then, a resist pattern having convexoconcave corresponding to a device pattern of the reticle is formed on each shot region of the wafer W developed by the developing device 323 (S14). As to the thus developed wafer W, a line width of the formed pattern and a superimposition error, etc. are inspected in accordance with need by the in-line measurement device 400 or by a measurement device when it is provided separately, and the wafer W is held in the wafer carrier 303 by the transfer device line 301. After finishing the lithography step, for example, one lot of wafers in the wafer carrier 303 is transferred to other processing apparatus, where etching (S15) and resist removal (S16), etc. are performed.

Note that, in the above explanation, pre-measurement of the wafer W is made by the in-line measurement device 400 provided inside the coating/developing device 300, but it may be made by the off-line measurement device 800.

The wafer processing explained above is performed in each of the substrate processing apparatuses, and each substrate processing apparatus is integrally controlled and managed by the exposure step management controller 500. Namely, the exposure step management controller 500 accumulates various information for controlling processes of each lot or each wafer to be processed in the exposure system 100 and various information, such as various parameters therefor or exposure history data, etc. Based on the information, each exposure apparatus 200 is controlled and managed for performing suitable processing on each lot. Also, the exposure step management controller 500 obtains an alignment condition (the number and arrangement of sample shots, multi-point type or single-point type in a shot, and a waveform processing algorithm used at signal processing, etc.) used for aligning processing in each exposure apparatus 200 and a condition (an alignment correction amount, etc. considering later explained SDM and GCM) used at the time of alignment and registers the same to each exposure apparatus 200. The exposure step management controller 500 also stores various data, such as EGA log data measured by the exposure apparatus 200, and suitably controls and manages each exposure apparatus 200 based thereon.

Also, the analyzing system 600 collects various data from various devices, such as the exposure apparatus 200, the coating/developing device 300, a light source of the exposure apparatus 200, the in-line measurement device 400 and the off-line measurement device, via a network and analyzes the same.

Pipeline Processing

Figure 6:
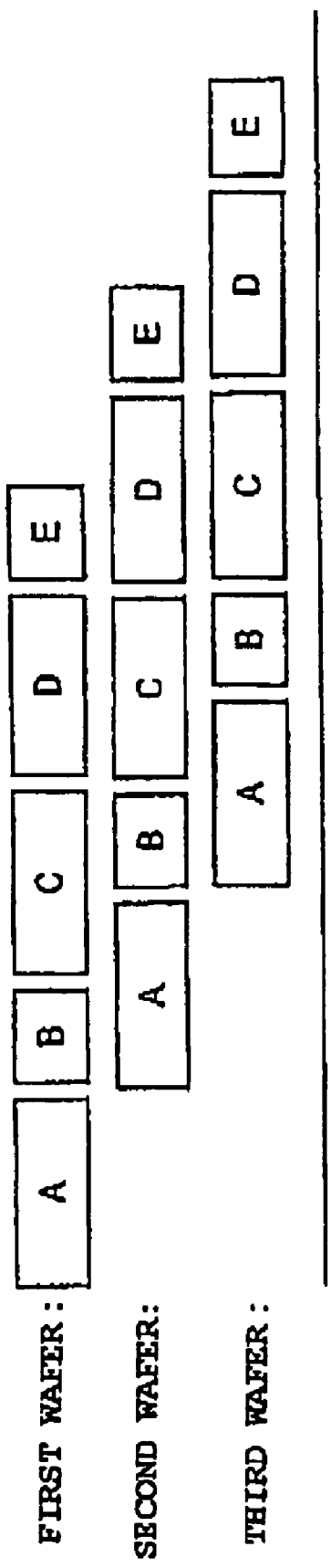
FIG. 6 is a view for explaining pipeline processing of the embodiment of the present invention.

As a result of adding an in-line pre-measurement step by the in-line measurement device 400 explained above, it cannot be denied that a delay arises in the wafer processing, however, the delay can be controlled by applying pipeline processing as explained below. This will be explained with reference to FIG. 6.

As a result of adding an in-line pre-measurement step, the wafer processing is composed of six steps: a resist processing step A for forming a resist film, a pre-measurement step B by the in-line measurement device 400, an exposure step C for alignment and exposure, a development step D for performing thermal processing and development after exposure, and a pattern size measurement step E when measuring a resist pattern. In the six steps, pipeline processing for processing in parallel is performed on several wafers W (three in the figure). Specifically, by performing the pre-measurement step B of the wafers W and the precedent exposure step C of the wafers in parallel, an effect given to the entire throughput can be suppressed extremely small.

Also, when performing the resist size measurement step E after performing the development step D, by measuring in the pre-measurement step B and resist size measurement step E by pipeline processing in the in-line measurement device 400 at timing of not overlapping to each other, a resist size measurement device does not have to be provided separately, and the throughput is not adversely affected much.

Alignment Optimization

Figure 7:
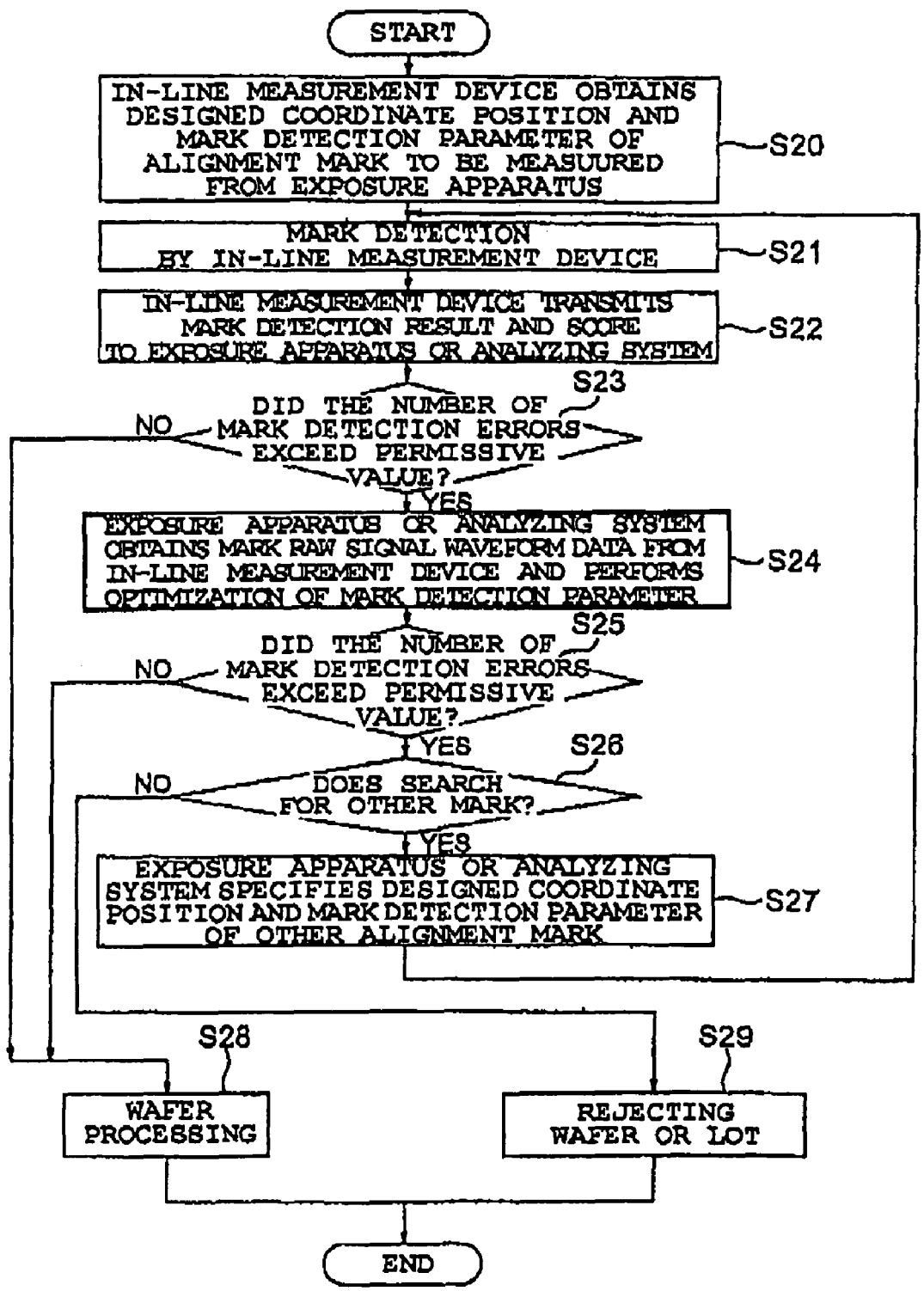
FIG. 7 is a flowchart showing a sequence of alignment optimization by in-line pre-measurement of the embodiment of the present invention.

FIG. 7 shows a sequence flow of alignment optimization by the in-line pre-measurement. First, the in-line measurement device 400 retrieves designed positional information of an alignment to be measured in the exposure apparatus (alignment sensor 14) and a mark detection parameter (a parameter on processing algorithm of a signal waveform, for example, a slice level) by communication with the exposure apparatus 200, the analyzing system 600 or the in-plant production management host system 700 (S20). Next, the in-line measurement device 400 drives the stage device and successively aligns a mark for alignment of the wafer W to near a detection position of the pre-measurement sensor 410 while measuring a position of the alignment mark (S21).

Next, the in-line measurement device 400 evaluates adequacy of the mark as a mark to be detected by the exposure apparatus 200 based on a predetermined evaluation standard based on mark raw signal waveform data output from the image pickup element 422 or signal processed data, and calculates a score indicating the evaluation level. In the present embodiment, the evaluation and calculation of the score are performed in the pre-measurement control device 450, but in the case of transmitting all of the pre-measurement results to the analyzing system 600 and exposure apparatus 200 (exposure control device 13), the evaluation and score calculation may be performed on the receiving side. Note that an explanation on the score will be made later on. When the score is superior to a predetermined threshold value, the score and information (OK) indicating that the mark is adequate as a mark to be measured in the exposure apparatus 200 are transmitted to the exposure apparatus 200; while when the score is inferior to a predetermined threshold, the score and information (NG) indicating that the mark is not adequate as a mark to be measured in the exposure apparatus 200 are transmitted to the exposure apparatus 200 (S22). Note that when it is determined defective, mark raw signal waveform data is preferably transmitted as well as the score and NG information. Note that, principally, it is preferable to transmit signal waveform data of all marks measured in the in-line measurement device to the exposure apparatus 200, but when transmitting signal waveform data of all measurement marks, the communication takes time, which may result in a decline of the throughput, and there also arises a load of preparing a memory medium having a large memory capacity on the data receiving side. Therefore, in the present embodiment, measured mark signal waveform data of only marks determined to be inadequate and marks determined immeasurable (measurement error marks) is transmitted. Note that, in the present embodiment, it is configured that an operation of determining whether or not to transmit data is also performed in the pre-measurement control device 450. These information and later explained information notified from the in-line measurement device 400 to the exposure apparatus 200 may be notified to the exposure apparatus 200 via the analyzing system 600, but for simplification of the explanation, it is assumed to be directly notified to the exposure apparatus 200 in the explanation below. Note that when sending information to the exposure apparatus 200 via the analyzing system 600, a part or all of processing performed in the exposure apparatus 200 may be performed in the analyzing system 600 and the result may be sent to the exposure apparatus 200.

Also, it may be configured that information of the analyzing system 600 is sent to the exposure apparatus 200 via the in-plant production management host system 700 and the exposure step management controller 500.

Also, in a system of logging in a memory in the exposure apparatus results of measuring marks on the wafer (mark positional information and mark signal waveform data, etc.) in the exposure apparatus (alignment sensor 14) and transmitting and logging to a memory in the analyzing system 600, measurement result of only marks determined to be inadequate or immeasurable (measurement error marks) based on an evaluation on the measurement result by the alignment sensor 14 in the exposure apparatus may be logged.

On receiving the information transmitted in the step S22, in the exposure apparatus 200 receiving the information, it is determined whether there are mark detection errors (NG) in an amount of a permissive number or larger (S23) and, when there are mark detection errors in an amount of the predetermined permissive number or larger and mark raw signal waveform data is sent, optimization processing of a mark detection parameter is performed based on the data, while the mark raw signal waveform data is not sent, all or a part of corresponding raw signal waveform data is retrieved from the in-line measurement device 400 and the optimization processing of the mark detection parameter is preformed (S24). Note that the optimization processing of the mark detection parameter may be performed in the pre-measurement control device 450 of the in-line measurement device 400. In s23, when the number of the mark detection errors is in short of the predetermined permissive number, transferring processing or wafer W to the exposure apparatus 200 is performed and exposure processing continues (S28).

After executing the optimization processing of the mark detection parameter, it is again determined whether or not there are mark detection errors in an amount of a predetermined permissive number or larger (S25) and, when the mark detection error is in short of the predetermine permissive number, the transferring processing of the wafer W to the exposure apparatus 200 is performed and exposure processing continues (S28). After performing optimization of the mark detection parameter, when there are mark detection errors in an amount of the predetermined permissive number or larger, it is determined whether or not to search for other mark by following pre-registered information based on priorities predetermined at a designed coordinate position of other mark in a search region specified in advance (S26).

When it is determined to search for other mark position in S26, the exposure apparatus 200 additionally specifies other alignment mark position to be measured and mark detection parameter and notifies the in-line measurement device 400 (S27). The in-line measurement device 400 returns back to the mark detection processing in S21 to repeat the pre-measurement processing.

If there are mark detection errors in an amount of a predetermined permissive number or larger despite of measuring all marks in a predetermined region (candidates of marks to be measured), the wafer W is not transferred to the exposure apparatus 200 and rejected (removed from the processing steps) (S29). Also, when the number of rejected wafers W exceeds a predetermined number in S29, all wafers W in the lot including the wafers W are rejected.

Note that the reject processing of the wafer W is not limited to the case explained in the above embodiment. The reject processing is performed on wafers in the same way as in the above embodiment when it is determined to be unfavorable to continue pattern exposure processing on the wafer no more (preferable devices are not obtained) based on later explained results of all pre-measurement (not only mark positional information, but a focus error, a pattern line width, a pattern defect and a wafer deformation amount predicted based on a temperature difference in the apparatus, etc.).

It is necessary to correct a difference between sensors between the in-line measurement device 400 and the exposure apparatus 200 (a difference of characteristics between the pre-measurement sensor 410 and the alignment sensor 14 including a difference of signal processing algorithms). The mark row signal waveform data sent from the in-line measurement device 400 is matched with the mark raw signal waveform data of the same mark by the exposure apparatus 200 (alignment sensor 14), and the score correction value is optimized, so that a score based on a measurement result by the in-line measurement device 400 matches with a score based on a measurement result on the same mark by the exposure apparatus 200 (alignment sensor 14). Note that, normally, in the alignment processing in the exposure apparatus 200, since mark raw signal waveform data of at least marks generated a detection error is logged, the score correction value may be optimized by transmitting the mark raw signal waveform data, detection parameter and detection error information to the analyzing system 600 or to the in-line measurement device 400, so that the detection scores of the same mark matches with mark raw signal waveform data measured by the in-line measurement device 400.

Note that the correction processing of a characteristic difference between sensors explained above was explained on the case between the in-line measurement device 400 and the exposure apparatus 200, but the same processing may be performed on a characteristic difference between sensors between the off-line measurement device 800 and the exposure apparatus 200.

Next, the above detection result score will be explained. After obtaining a plurality of characteristic amounts, such as a mark pattern width error as a characteristic amount in a mark signal pattern, for each pattern, weighing optimized to each characteristic amount is performed, and the sum is calculated to obtain the total value, which is defined as a detection result score and used for determining an existence of a mark by comparing with a predetermined threshold. Hero, to correctly determine "adequacy and inadequacy of mark raw signal waveform data", it is preferable that weighing for a plurality of characteristic amounts is optimized for each exposure process, lot and mark configuration.

More specifically, an edge portion of the mark raw signal waveform data is detected to obtain regularity of a pattern width (for ale, uniformity) and regularity of pattern intervals (for example, uniformity) as characteristics as the mark as the characteristic amount. Here, the "edge" indicates, for example, like a boundary between a line portion and a space portion in a line-and-space-mark, a boundary between a pattern portion for forming a mark and a non-pattern portion.

Figure 8A:
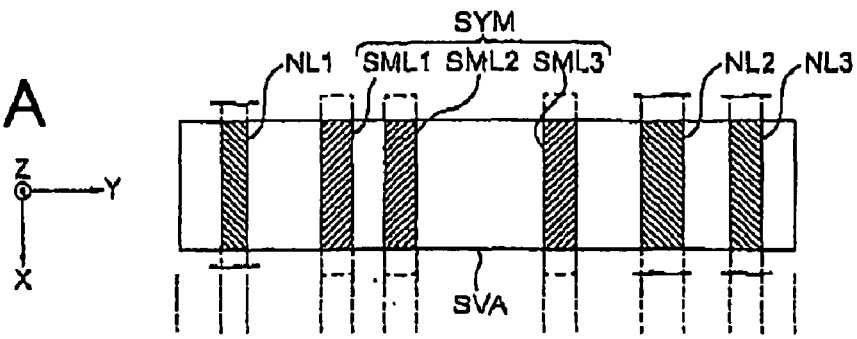
FIG. 8A is a view showing an example of a search alignment mark of the embodiment of the present invention.
Figure 8B:
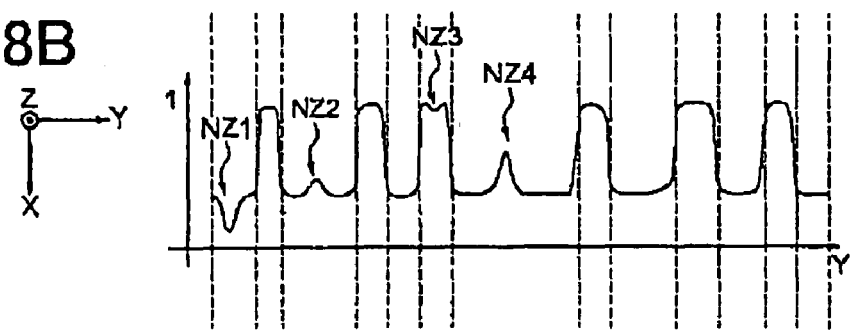
FIG. 8B is a view showing an average signal intensity distribution of measurement signals of search alignment marks in FIG. 8A.
Figure 8C:
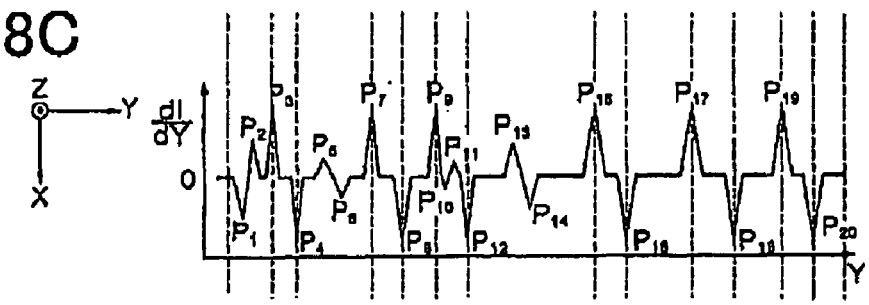
FIG. 8C is a view showing a differentiation waveform of the signal intensity distribution in FIG. 8B.
Figure 8D:
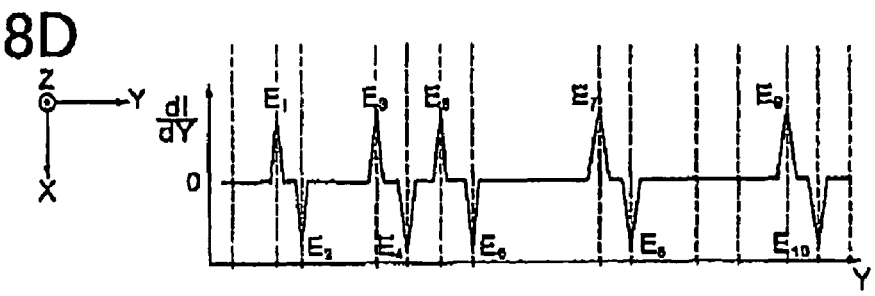
FIG. 8D is a view showing edge candidates after performing reduction processing on the differentiation waveform in FIG. 8C.

This will be explained by taking a search alignment Y mark (three lines mark) as an example. First, an average of a plurality of measurement signals is obtained and noise is cancelled, then, the waveform is flattened to obtain an average signal intensity distribution shown in FIG. 8B. Next, by calculating a differential waveform of a signal intensity distribution shown in FIG. 8C, detecting 20 peaks P1 to P20 as edge candidates as a boundary of a line pattern and a space pattern, and checking three conditions described below, edge candidates of line patterns SML1, SML2 and SML3 are reduced and edge candidates E1 to E10 shown in FIG. 8D remains.

[Condition 1] The peak value is in a range or a permissive value. Accordingly, peaks P5, P6, P10 and P11 by noises NZ2 and NZ3 are omitted from edge candidates.

[Condition 2] In the case of a waveform relating to edges of a line pattern, a negative peak comes after a positive peak when tracing the waveform in the Y direction. Accordingly, the peaks P1 and P2 by the noise NZ1 are omitted from edge candidates.

[Condition 3] When tracing the waveform in the Y-direction, a distance from a positive peak to a negative peak in the Y-direction is considered as a Y-direction width of the line pattern, but it is in a range of a permissive value an Y-direction widths of line patterns SML1, SML2 and SML3 of the Y-mark SYM. Accordingly, the peaks P13, P14, P17 and P18 by the noise NZ4 and line pattern NL2 are omitted from the edge candidates.

Next, starting from an edge candidate E1 having a smallest Y-coordinate value, information of 6 edge candidates E1 to E6 is read in an order of a size of the Y-coordinate value and a pattern characteristic amount described below is calculated.

[Characteristic 1] From calculation of a characteristic amount A1 relating to the fact that "a line pattern width is a predetermined value (=DLW)":

$$\Delta W1 = (YE2 - YE1) - DLW$$

$$\Delta W2 = (YE4 - YE3) - DLW$$

$$\Delta W3 = (YE6 - YE5) - DLW$$

line pattern width errors $\Delta Wk$ (k=1 to 3) are obtained, and a standard deviation of the line pattern width errors $\Delta Wk$ is calculated as a characteristic amount A1. (Y-coordinate values of the edge candidates E1 to E6 are indicated as YE1 to YE6.)

[Characteristic 2] From calculation of a characteristic amount A2 relating to the fact that "a line pattern width is a predetermined value (=DLD1, DLD2)":

$$\Delta D1 = (YE3 - YE2) - DLD1$$

$$\Delta D2 = (YE5 - YE4) - DLD2$$

line pattern interval errors $\Delta Dm$ (m=1, 2) are obtained, and a standard deviation of the line pattern interval errors $\Delta Dm$ is calculated as a characteristic amount A2.

[Characteristic 3] Calculation of a characteristic amount A3 relating to "edge shape uniformity":

It is obtained by calculating a standard deviation of peak values of the edge candidates E1 to E6.

The smaller the variation from designed values are, the better the line pattern width and the line pattern intervals are. Also, the smaller the variation of edge shape uniformity is, the higher the "adequacy of the mark waveform signal" is determined. In that case, the lower the score, the better. When using a relative algorithm for mark waveform detection, the relative value may be used as the score. In that case, the higher the score, the better.

In in-line pre-measurement, the number of marks, a mark arrangement, alignment focus offset, an alignment illumination condition (an illumination wavelength, bright/dark-field, illumination intensity and existence of phase difference illumination, etc.) and an EGA calculation mode may be objects of the optimization in addition to optimization of marks and mark detection parameters. In that case, EGA residual error components of each processing condition are obtained, and a processing condition with minimum residual error components is applied.

Shot Arrangement Deformation Correction (GCM)

First, a shot arrangement deformation calculation model to be used in the EGA is explained.

(1) A shot arrangement deformation calculation model in the normal EGA (up to primary order) is as below.

$$\Delta X = Cx\_10 * Wx + Cx\_01 * Wy + Cx\_sx * Sx + Cx\_sy * SY + Cx\_00 \quad \text{(formula 1)}$$

$$\Delta Y = Cy\_10 * Wx + Cy\_01 * Wy + Cy\_sx * Sx + Cy\_sy * SY + Cy\_00 \quad \text{(formula 2)}$$

Meanings of respective variables are as below.

Wx, Wy: a position of a measurement point with its origin at the center of the wafer Sx, Sy: a position of a measurement point with its origin at the center of the shot Cx__10: wafer scaling X
Cx__01: wafer rotation Y
Cx_sx: shot scaling X
Cx_sy: shot rotation Y
Cx__00: offset X
Cy__10: wafer rotation X
Cy__01: wafer scaling Y
Cy_sx: shot rotation X
Cy_sy: shot scaling Y
Cy__00: offset Y Note that when expressing by using the above variables, a wafer orthogonal degree is $-(Cx\_01 + Cy\_10)$ and a shot orthogonal degree is $-(Cx\_sy + Cy\_sx)$.

Note that, hereinafter, depending on which of the above parameters is used, an EGA calculation model (statistic processing mode) will be also referred to as a 6-parameter model (normal EGA model), a 10-parameter model (multi-point per shot model) and an average in shot model. The 6-parameter model is a model using the wafer scaling X and Y, wafer rotation and offset X and Y from the above parameters. The 10-parameter model is a model using those used in the 6-parameter model added with a total of 4 parameters, the shot scaling X and Y and shot rotation. The average in shot model is a model for averaging measurement values of a plurality of marks in a shot, calculating one representative value of the shot, and using the same to operate the EGA calculation at each shot position by using the same parameters (6 parameters) as the 6-parameter model explained above.

(2) A shot arrangement deformation calculation model up to quadratic coordinates is as below.

$$\Delta x = Cx\_20 * Wx^2 + Cx\_11 * Wx * Wy + Cx\_02 * Wy^2 + Cx\_10 * Wx + Cx\_01 * Wy + Cx\_00 + Cx\_sx * Sx + Cx\_sy * Sy \quad \text{(formula 3)}$$

$$\Delta x = Cy\_20 * Wx^2 + Cy\_11 * Wx * Wy + Cy\_02 * Wy^2 + Cy\_10 * Wx + Cy\_01 * Wy + Cy\_00 + Cy\_sx * Sx + Cy\_sy * Sy \quad \text{(formula 4)}$$

(3) A shot arrangement deformation calculation model up to cubic stage coordinates is as below.

$$\Delta x = Cx\_30 * Wx^3 + Cx\_21 * Wx^2 * Wy + Cx\_12 * Wx * Wy^2 + Cx\_03 * Wy^3 + Cx\_20 * Wx^2 + Cx\_11 * Wx * Wy + Cx\_02 * Wy^2 + Cx\_10 * Wx + Cx\_01 * Wy + Cx\_00 + Cx\_sx Sx + Cx\_sy Sy \quad \text{(formula 5)}$$

$$\Delta x = Cy\_30 * Wx^3 + Cy\_21 * Wx^2 * Wy + Cy\_12 * Wx * Wy^2 + Cy\_03 * Wy^3 + Cy\_20 * Wx^2 + Cy\_11 * Wx * Wy + Cy\_02 * Wy^2 + Cy\_10 * Wx + Cy\_01 * Wy + Cy\_00 + Cy\_sx * Sx + Cy\_sy * Sy \quad \text{(formula 6)}$$

Note that, in the case of measuring one point per shot, the shot correction coefficients Cx_sx, Cx_sy, Cy_sx and Cy_sy in the formulas 1 to 6 are omitted (that is, "0" is substituted).

Figure 9:
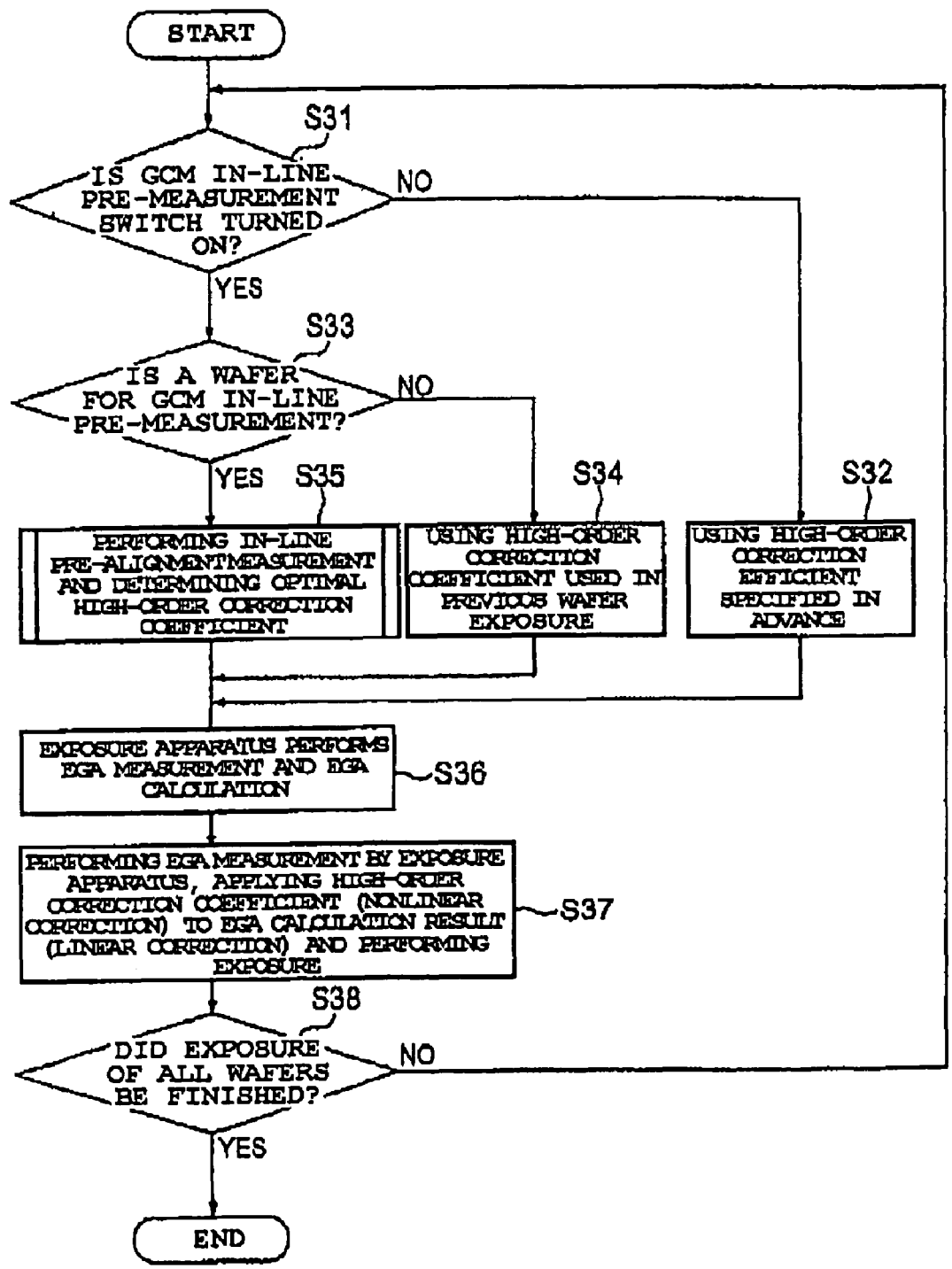
FIG. 9 is a flowchart showing an operation sequence of shot arrangement correction (GCM) by in-line pre-measurement of the embodiment of the present invention.

An operation sequence of shot arrangement correction (GCM) by in-line pre-measurement is shown in FIG. 9.

In the GCM (Grid Compensation for Matching), a difference of stage grids between the apparatuses and a shot arrangement nonlinear error by process deformation are corrected.

First, it is determined whether a GCM in-line pre-measurement switch (a switch, a switching of which can be freely set by the user) specified in advance is turned on (ON) or off (OFF) (S31) and, when the GCM in-line pre-measurement switch is turned off, it is determined to use a high-order correction coefficient specified (prepared) in advance (S32), EGA measurement/calculation is performed in the exposure apparatus 200 (S36), and the high-order correction coefficient determined in S32 is adopted to the EGA measurement/calculation result in S36 to perform exposure processing (S38).

In S31, when the GCM in-line pre-measurement switch is turned on, it is determined whether it is a wafer to be subjected to GCM in-line pre-measurement (S33) and, when it is not, it is determined to use the high-order correction coefficient used in exposure of precedent wafer (S34), the EGA measurement/calculation in the exposure apparatus 200 are performed (S36), and the high-order correction coefficient determined in S34 is adopted to the EGA measurement/calculation result in S36 to perform exposure processing (S38).

Figure 10:
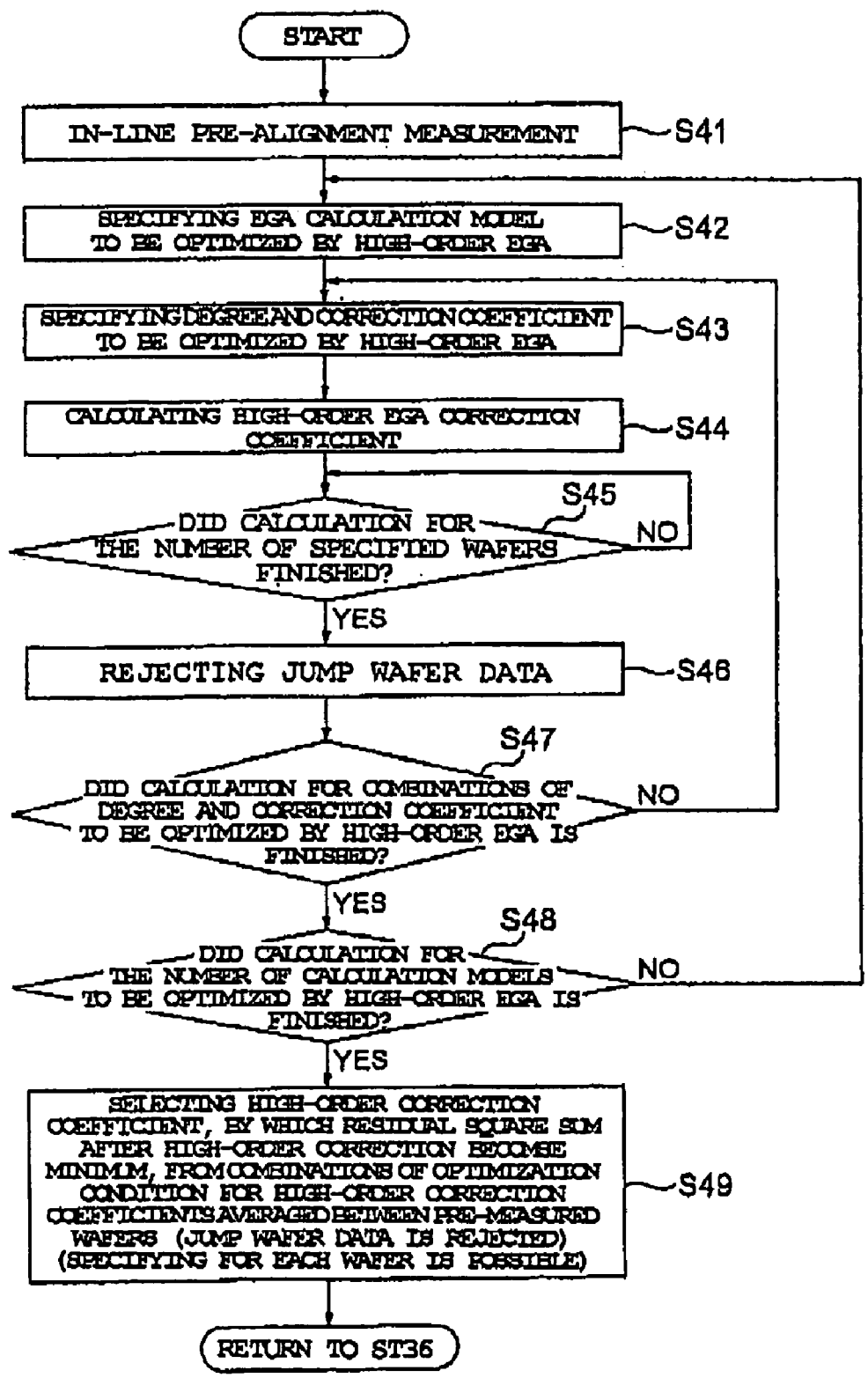
FIG. 10 is a flowchart showing an optimization sequence of a high-order correction coefficient (GCM correction value) by in-line pre-measurement of the embodiment of the present invention.
Figure 11A:
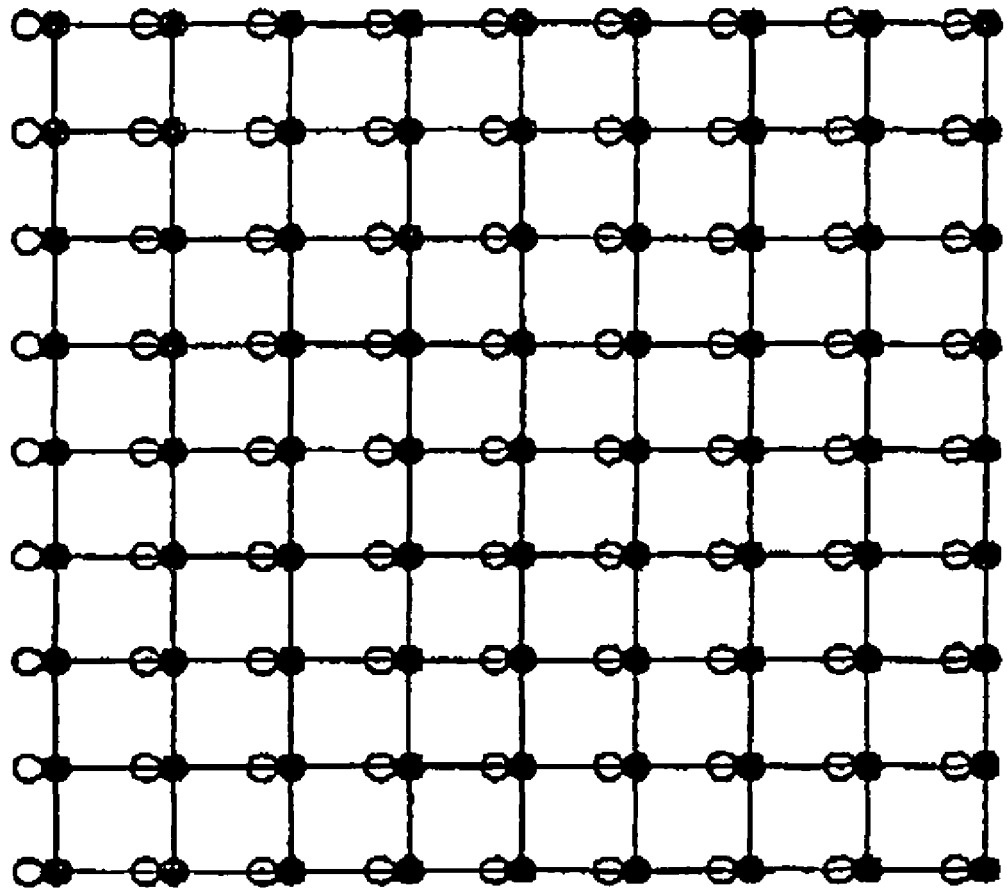
FIG. 11A is a view showing a content of "offset x (dx=Cx__00)" components of a correction coefficient in the embodiment of the present invention.
Figure 11B:
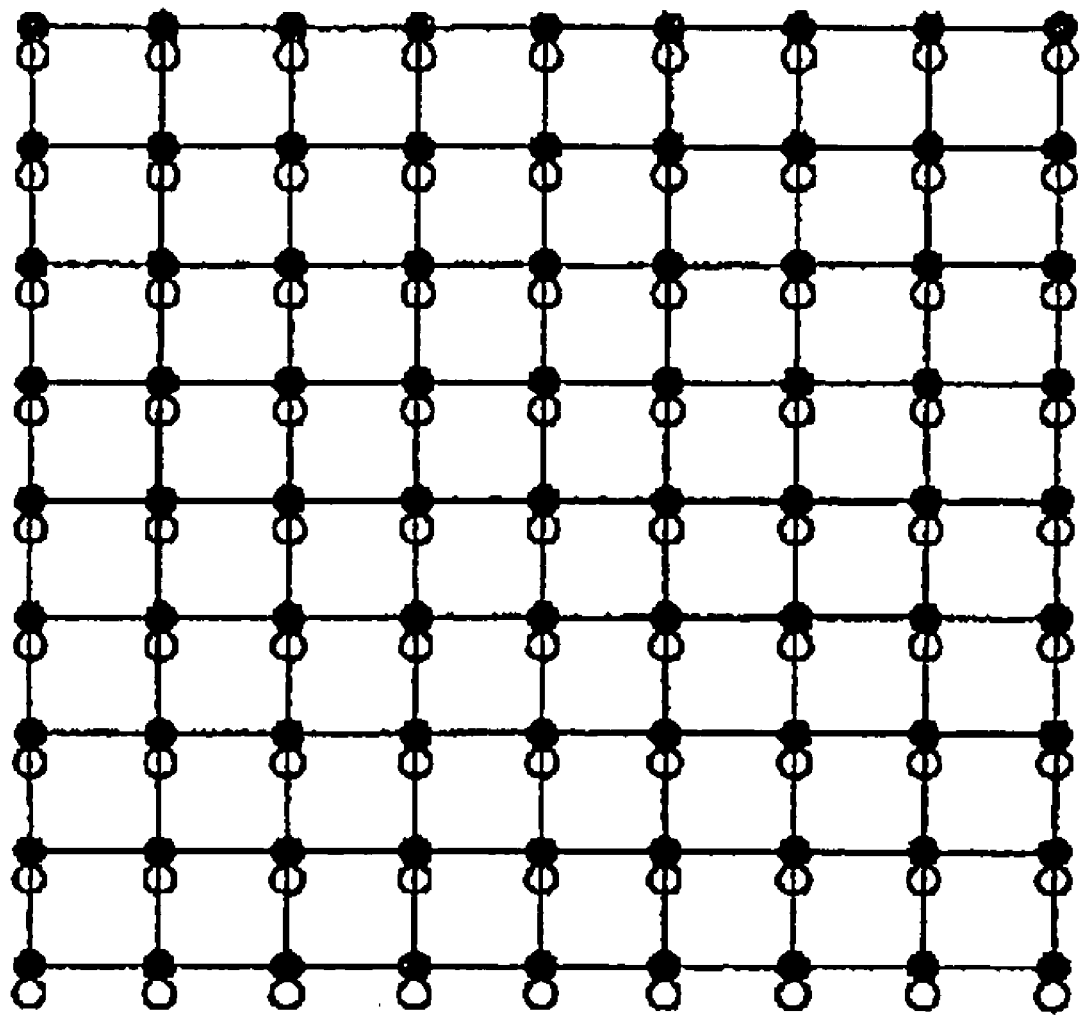
FIG. 11B is a view showing a content of "offset y (dy=Cy__00)" components of a correction coefficient in the embodiment of the present invention.
Figure 11C:
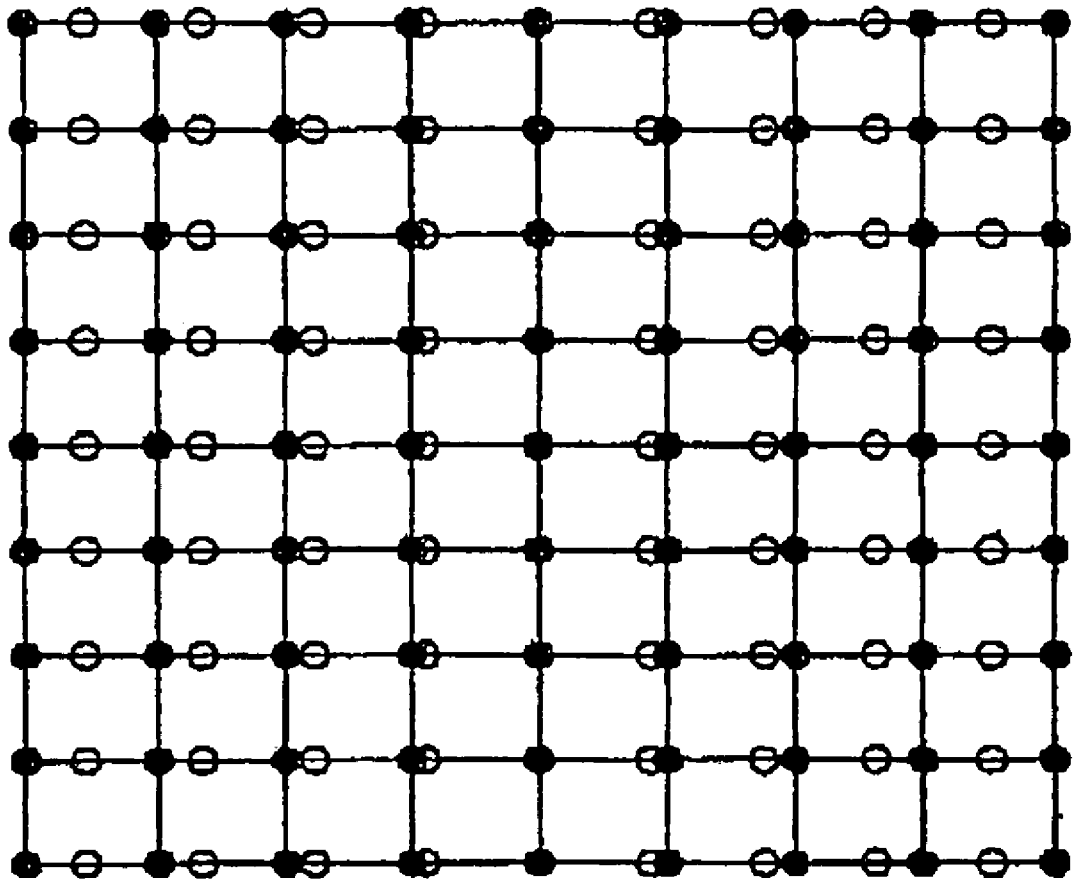
FIG. 11C is a view showing a content of "scaling x (dx=Cx__10*x)" components of a correction coefficient in the embodiment of the present invention.
Figure 11D:
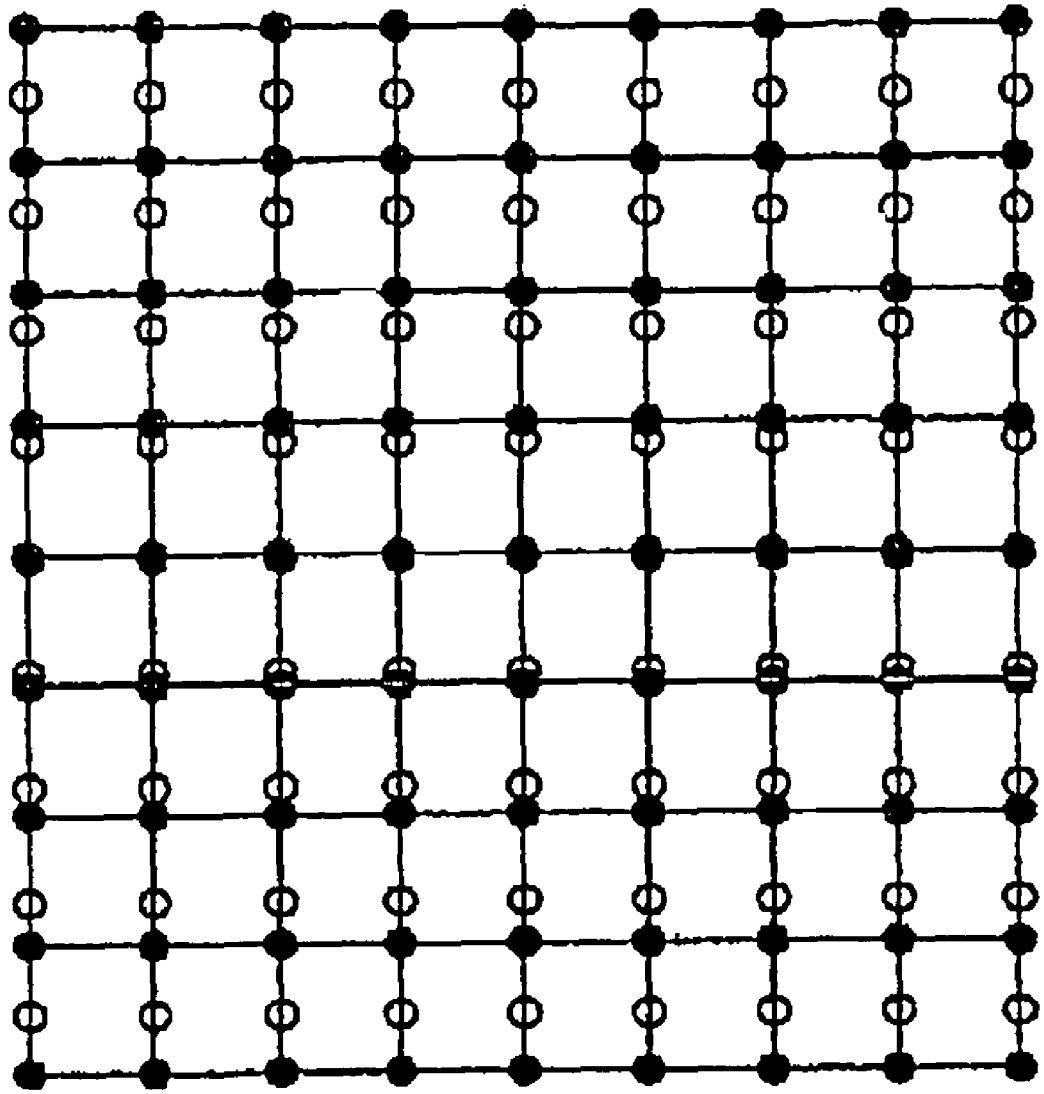
FIG. 11D is a view showing a content of "scaling y (dy=Cy__01*y)" components of a correction coefficient in the embodiment of the present invention.
Figure 11E:
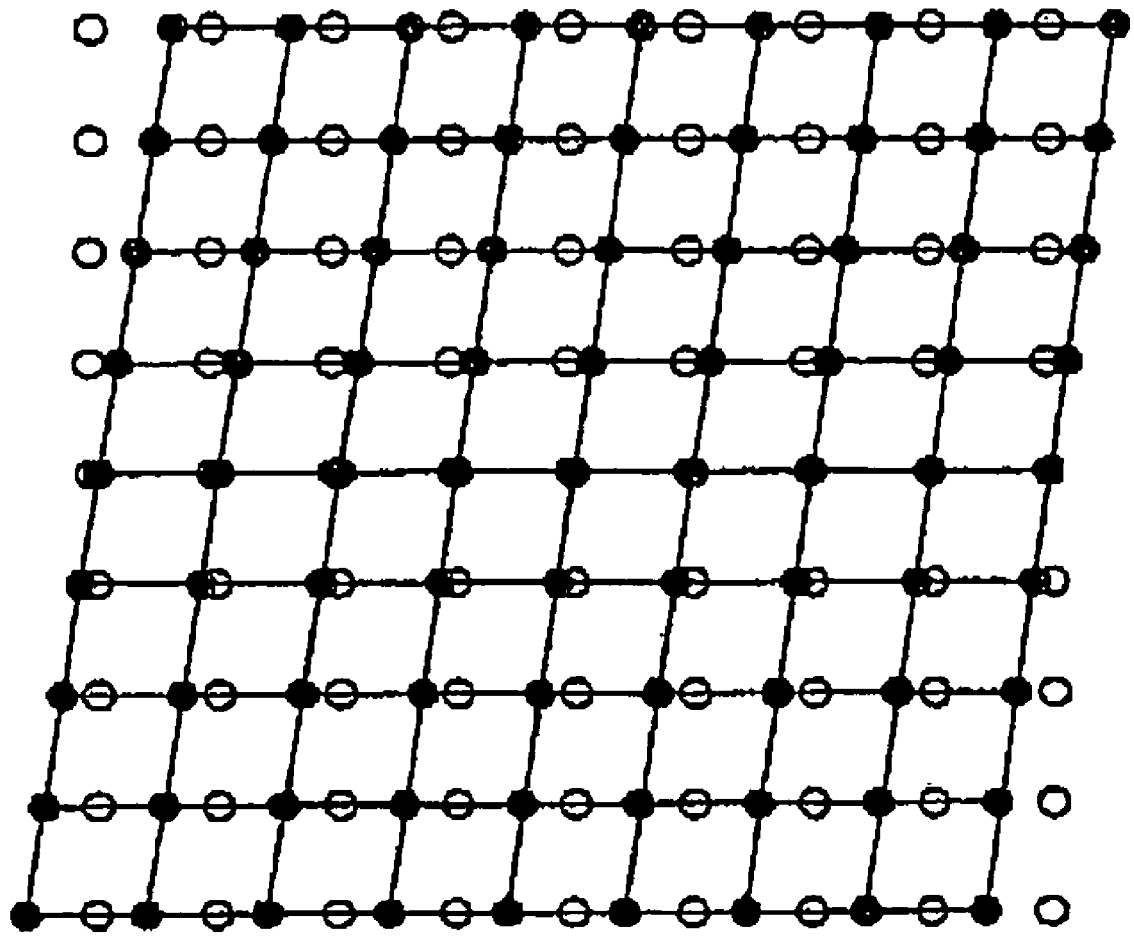
FIG. 11E is a view showing a content of "rotation y (dx=Cx__01*y)" components of a correction coefficient in the embodiment of the present invention.
Figure 11F:
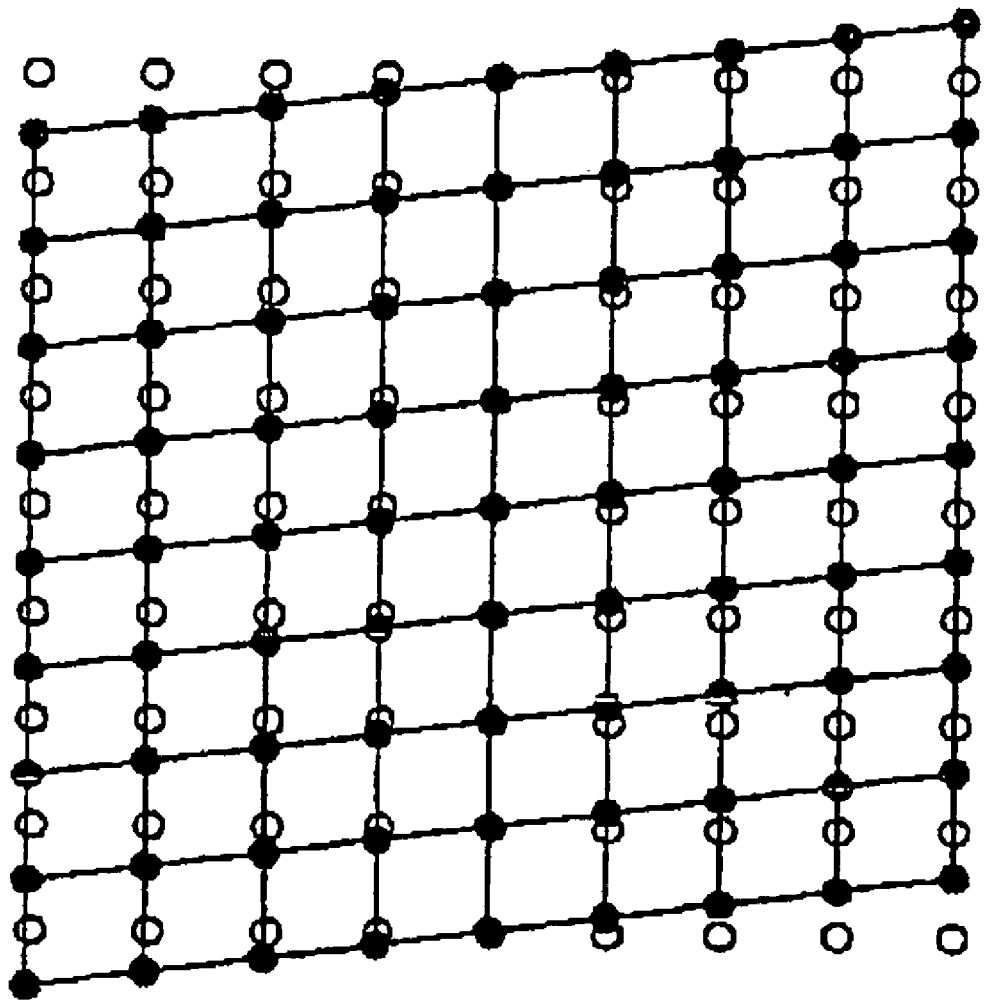
FIG. 11F is a view showing a content of "rotation x (dy=Cy__10*x)" components of a correction coefficient in the embodiment of the present invention.
Figure 11G:
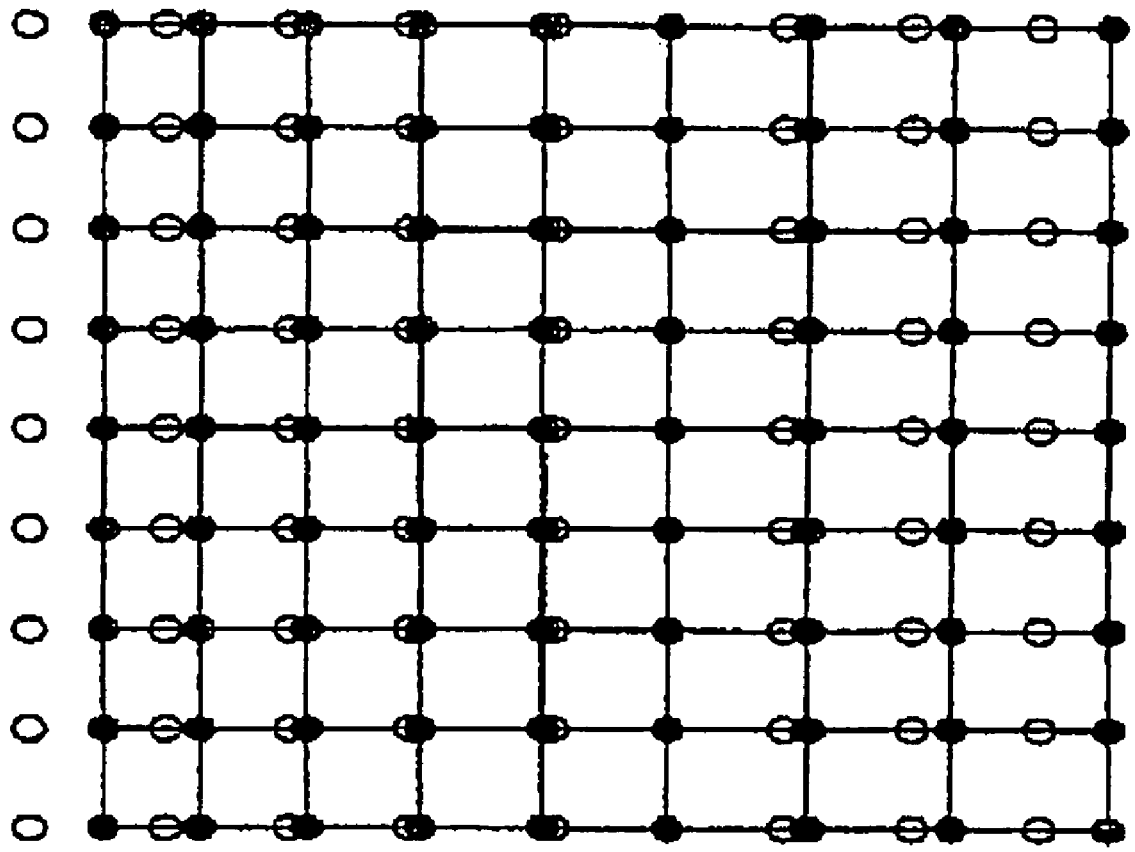
FIG. 11G is a view showing a content of "eccentric scaling x (dx=Cx__20*$x^2$)" components of a correction coefficient in the embodiment of the present invention.
Figure 11H:
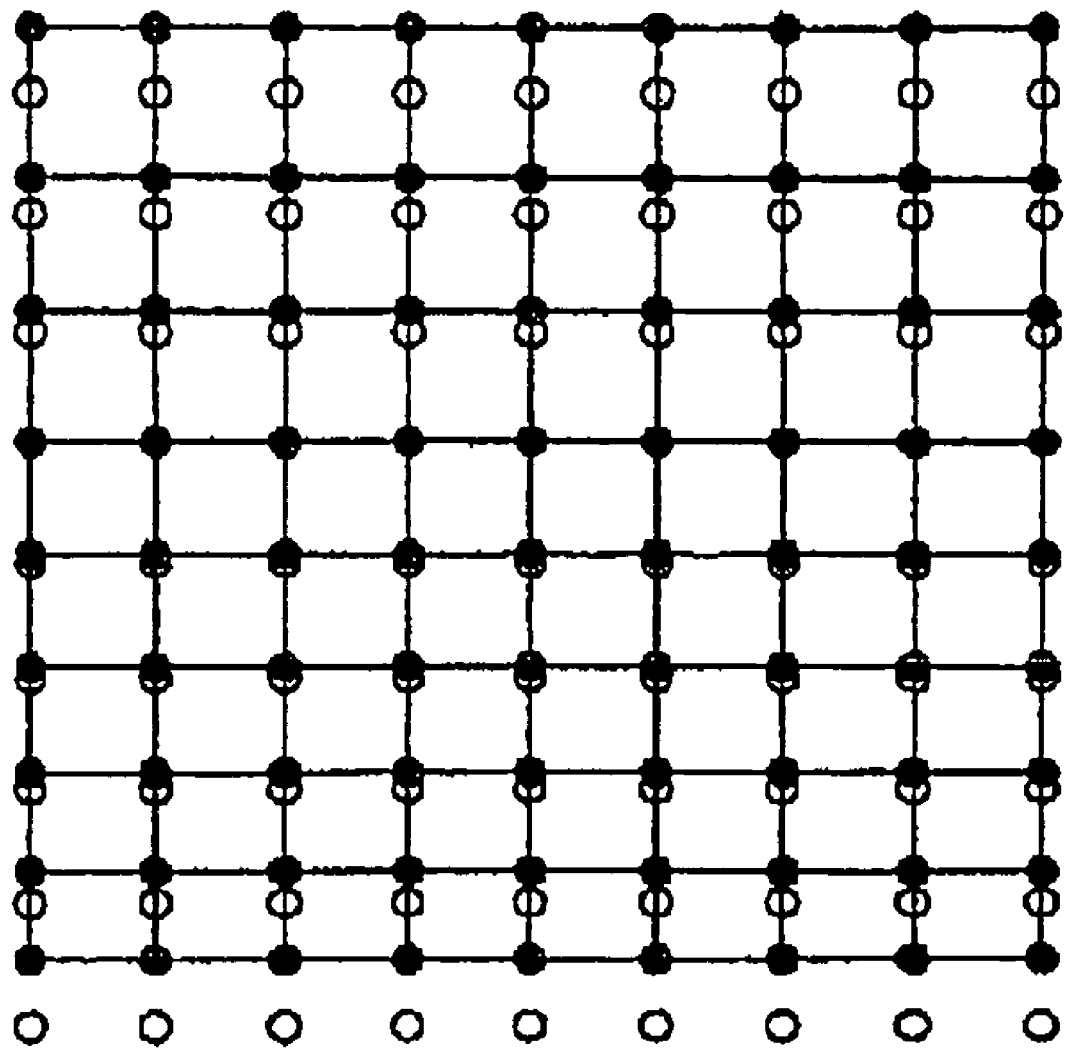
FIG. 11H is a view showing a content of "eccentric scaling y (dy=Cy__02*$y^2$)" components of a correction coefficient in the embodiment of the present invention.
Figure 11:
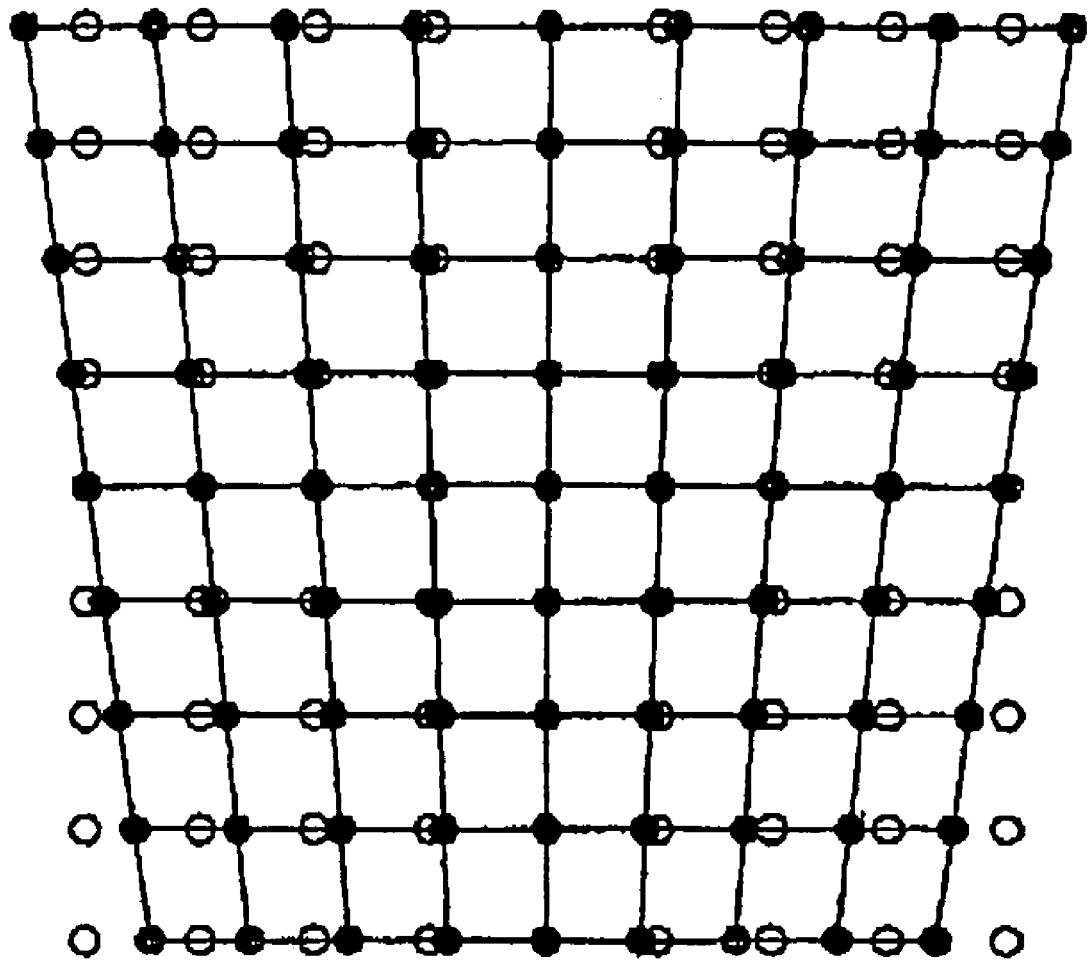
FIG. 11I is a view showing a content of "trapezoid x (dx=Cx__11*x*y)" components of a correction coefficient in the embodiment of the present invention.
FIG. 11J is a view showing a content of "trapezoid y (dy=Cy__11*y*x)" components of a correction coefficient in the embodiment of the present invention.
Figure 11J:
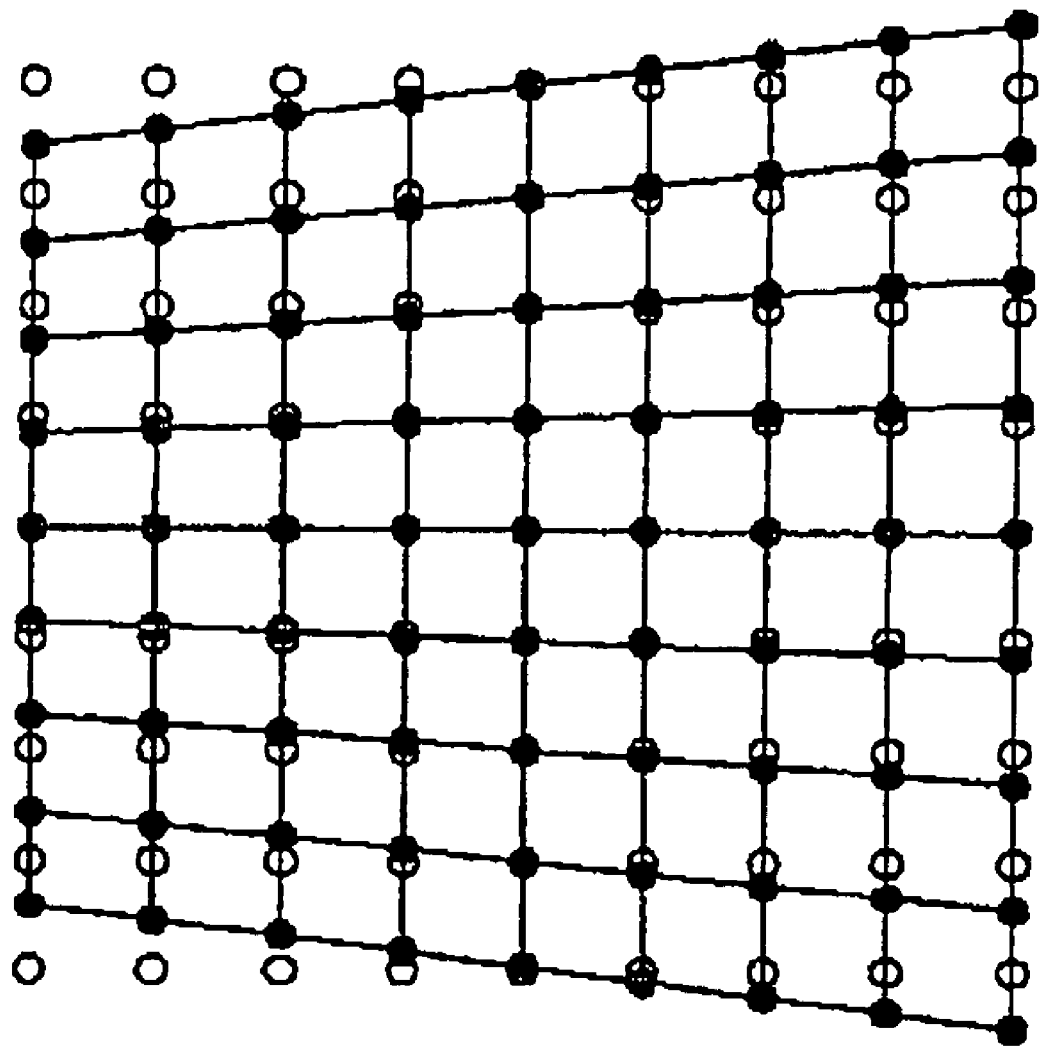
Figure 12A:
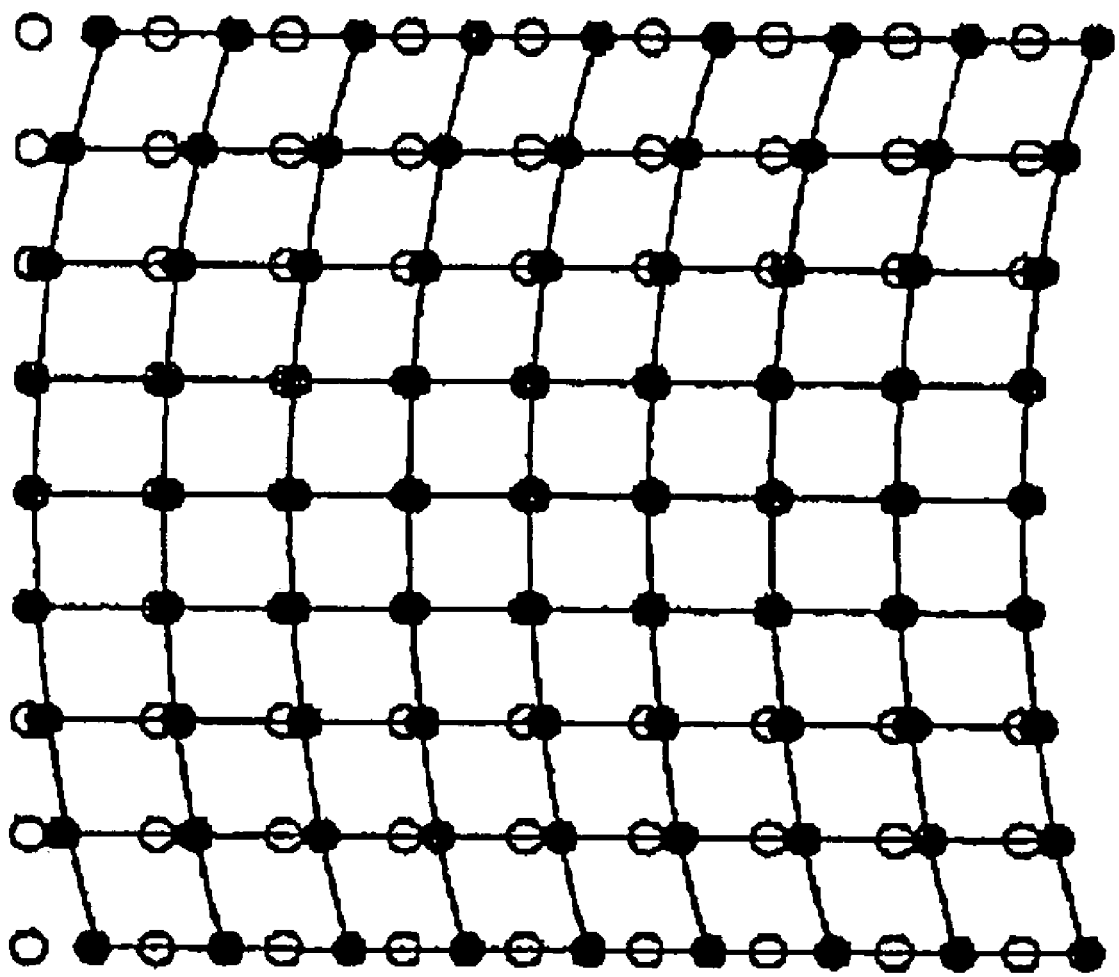
FIG. 12A is a view showing a content of "fan-shape x (dx=Cx__02*$y^2$)" components of a correction coefficient in the embodiment of the present invention.
Figure 12B:
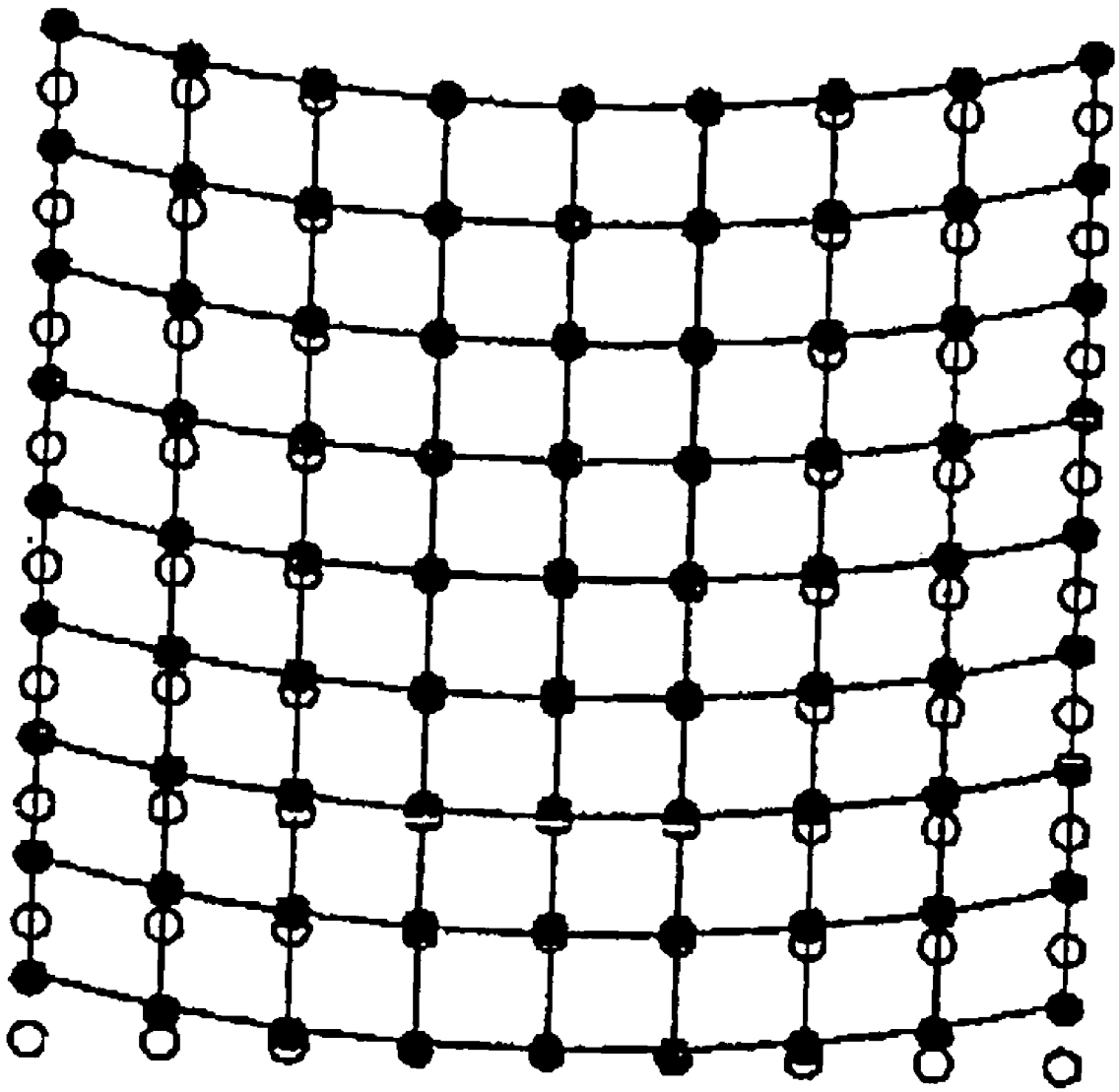
FIG. 12B is a view showing a content of "fan-shape y (dy=Cy__20*$x^2$)" components of a correction coefficient in the embodiment of the present invention.
Figure 12C:
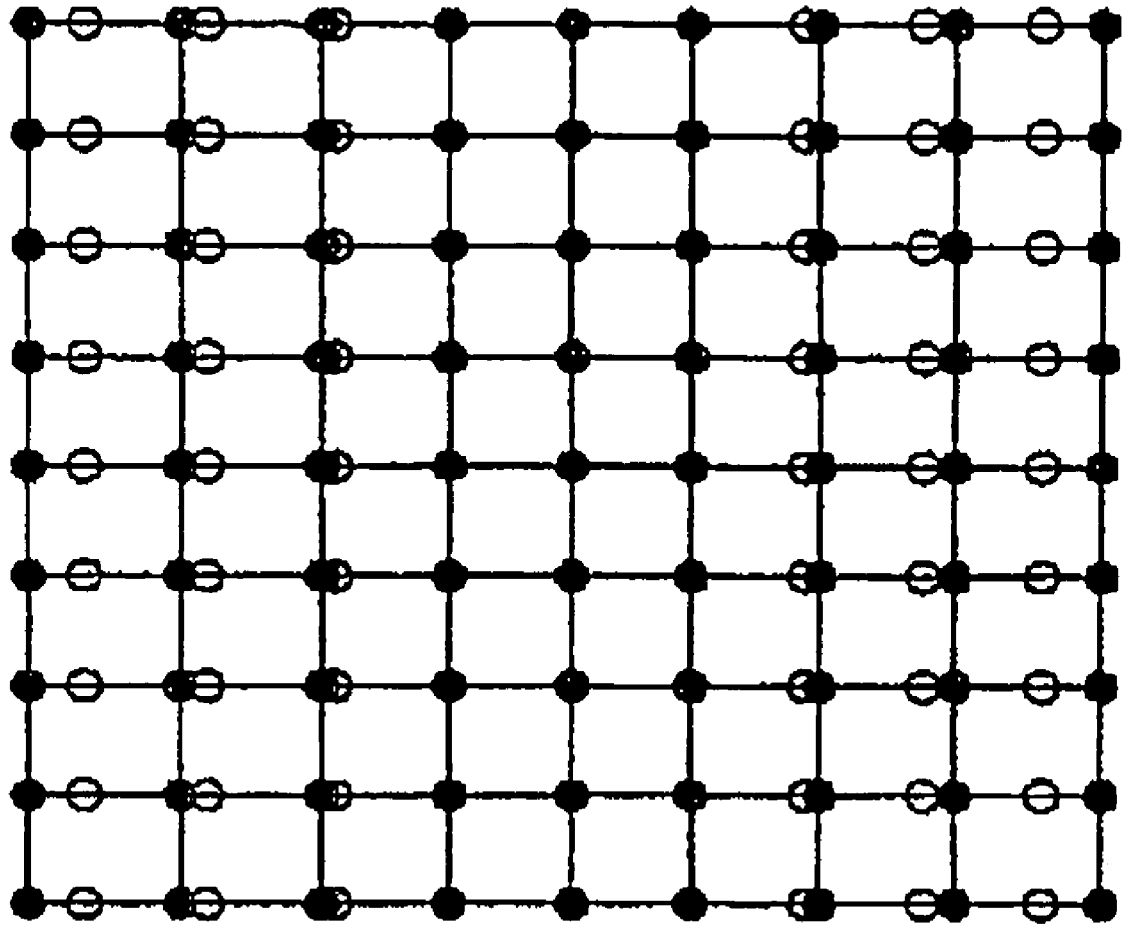
FIG. 12C is a view showing a content of "C-shape scaling x (dx=Cx__30*$x^3$)" components of a correction coefficient in the embodiment of the present invention.
Figure 12D:
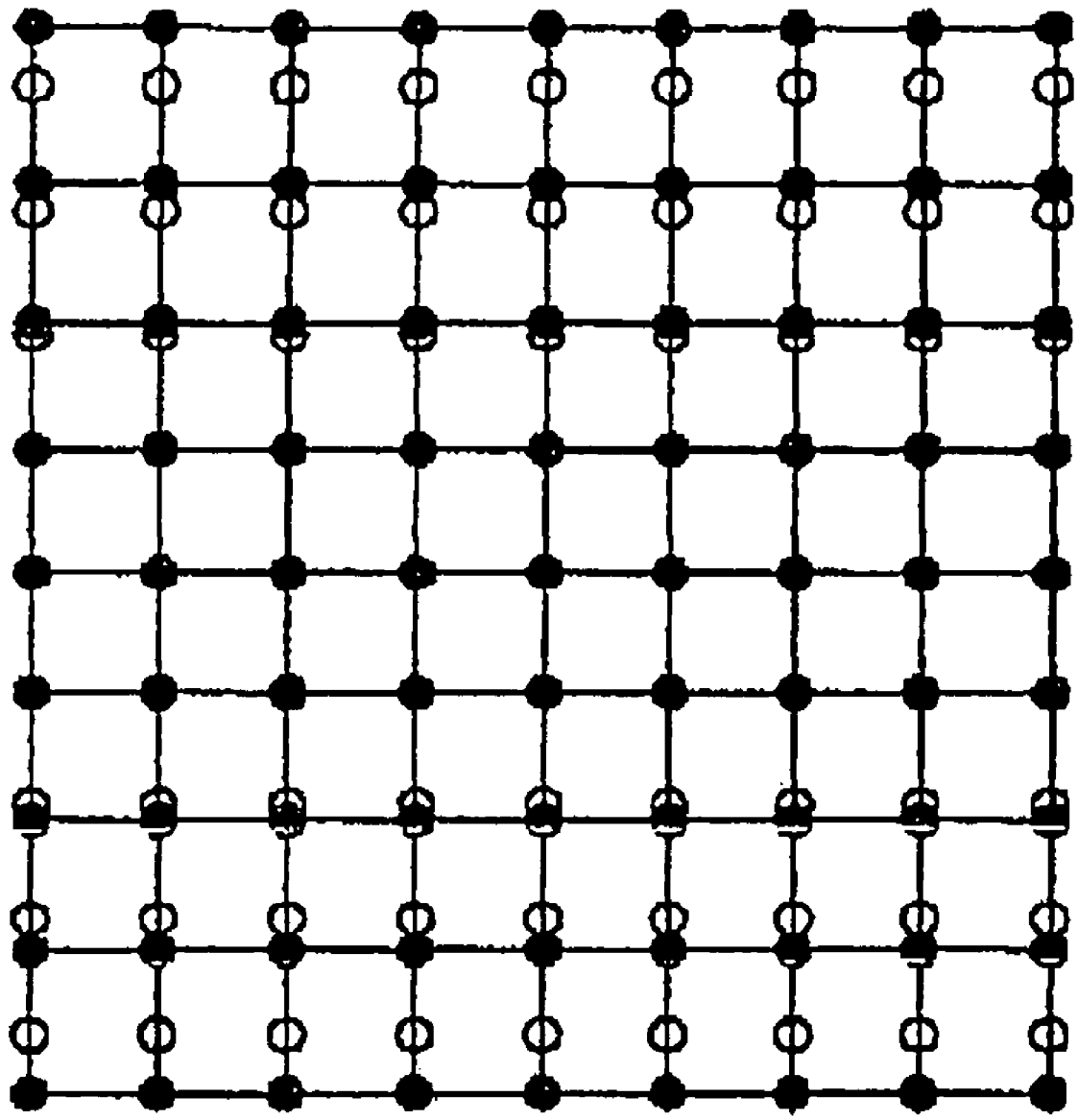
FIG. 12D is a view showing a content of "C-shape scaling y (dy=Cy__03*$y^3$)" components of a correction coefficient in the embodiment of the present invention.
Figure 12E:
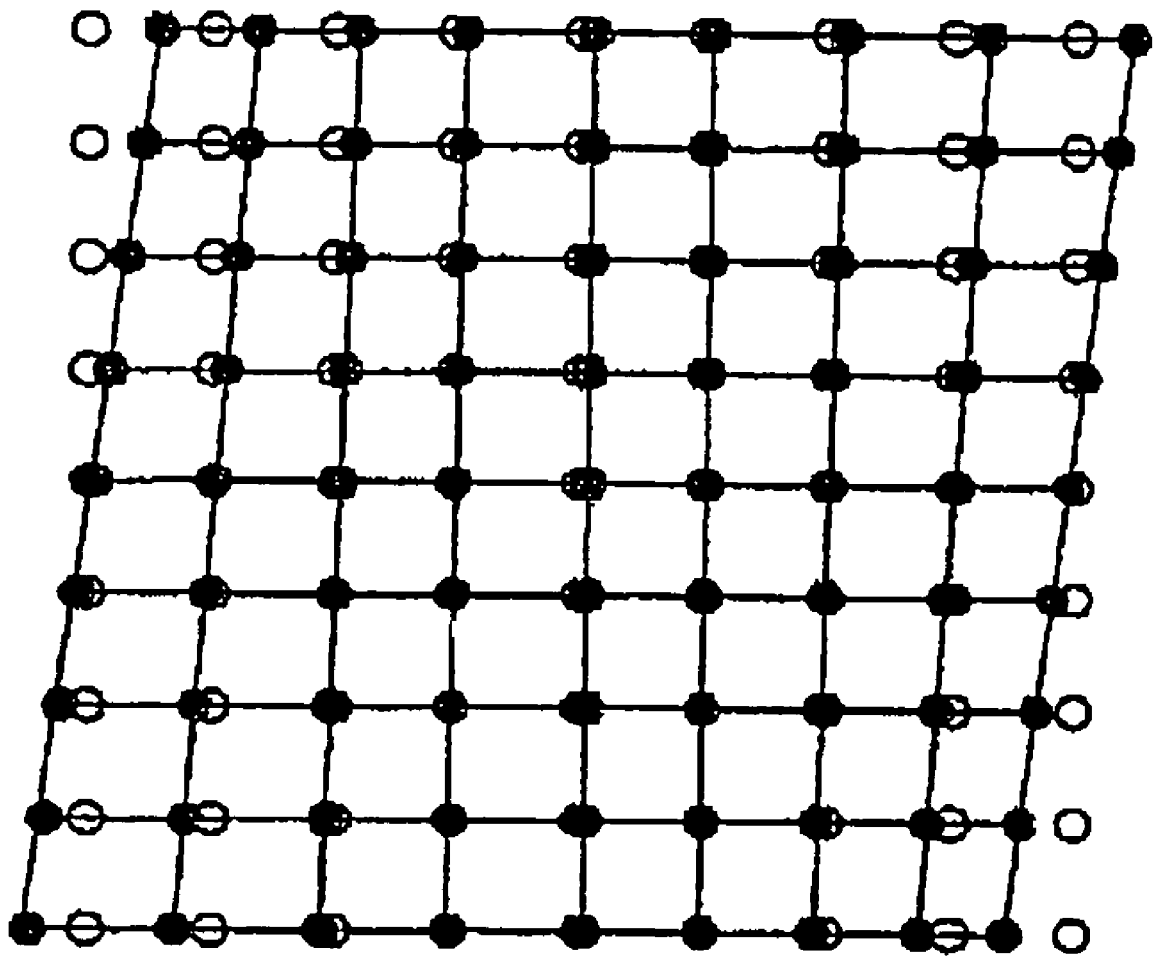
FIG. 12E is a view showing a content of "accordion x (dx=Cx__21*$x^2$*y)" components of a correction coefficient in the embodiment of the present invention.
Figure 12F:
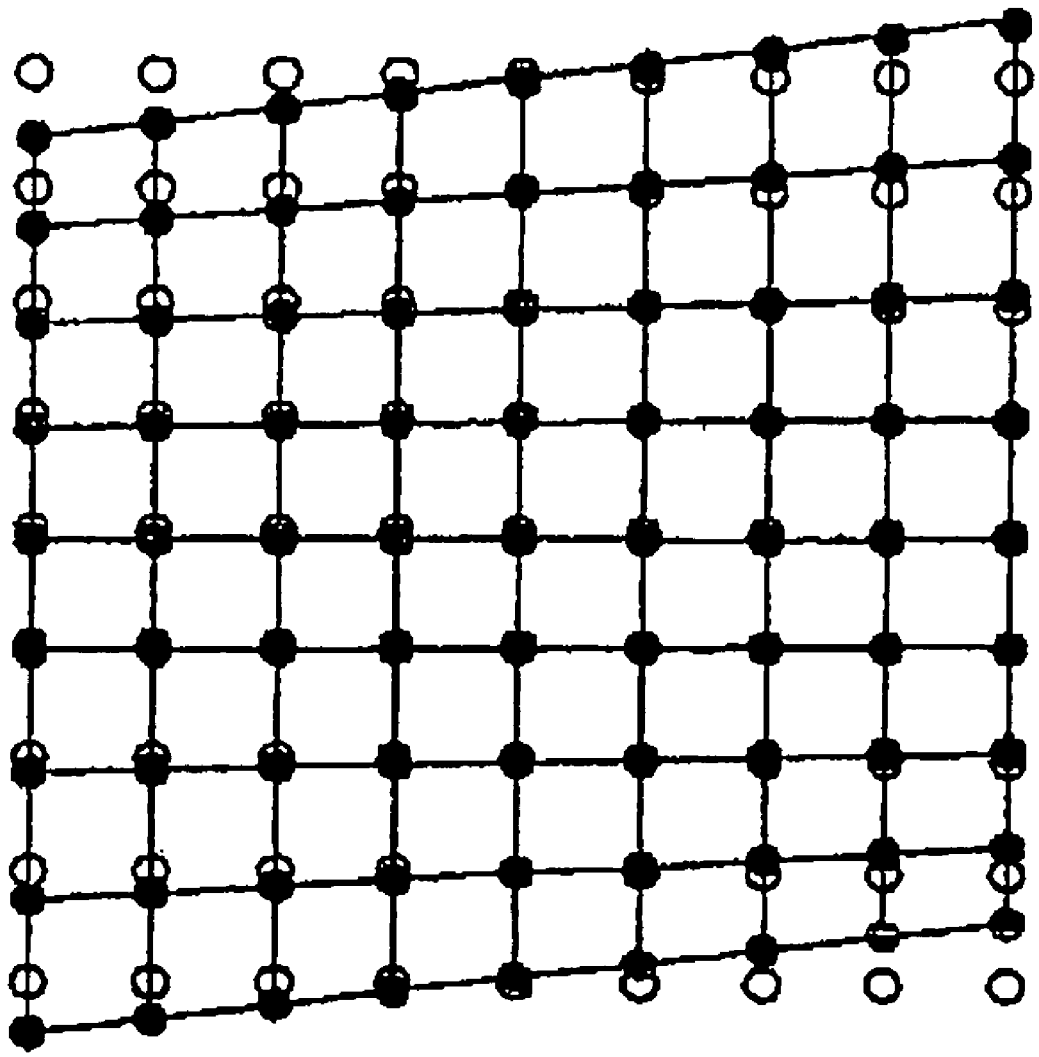
FIG. 12F is a view showing a content of "accordion y (dy=Cy__12*$y^2$*x)" components of a correction coefficient in the embodiment of the present invention.
Figure 12G:
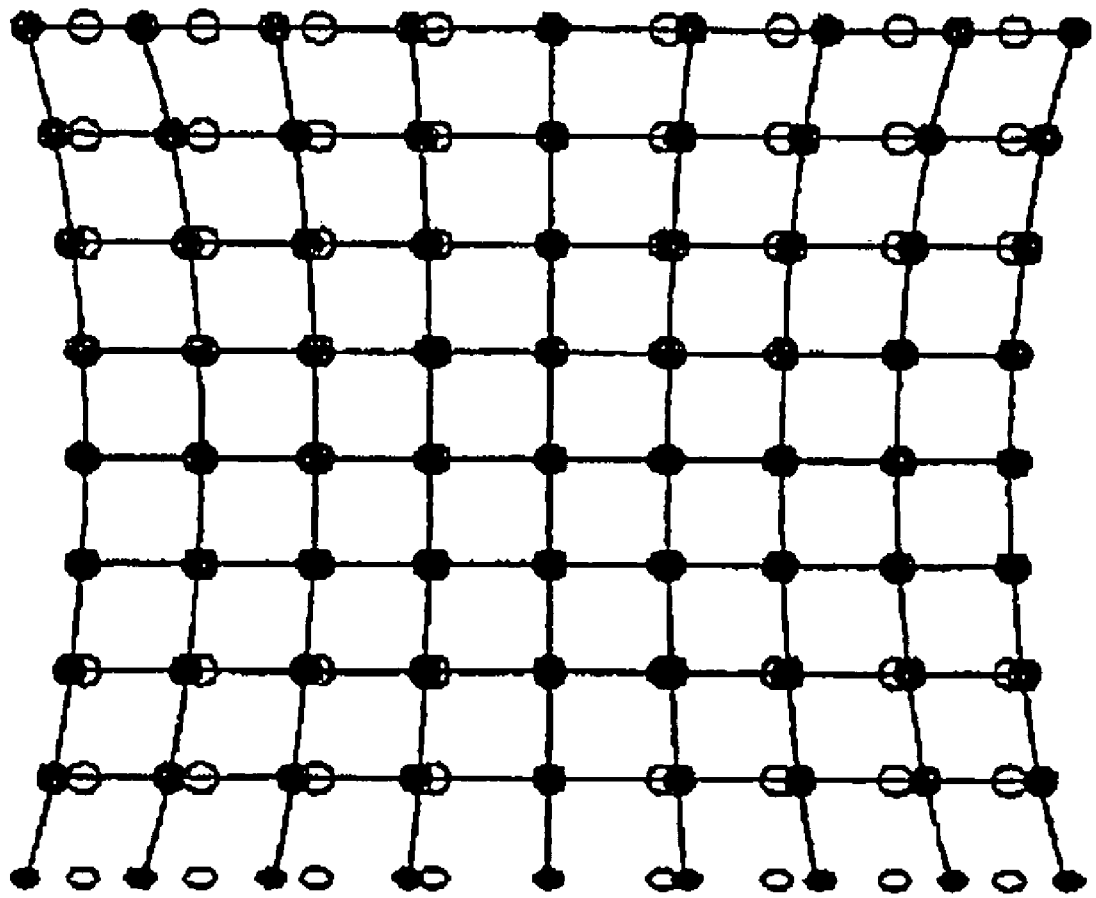
FIG. 12G is a view showing a content of "C-shape Distortion x (dx=Cx__12*x*$y^2$)" components of a correction coefficient in the embodiment of the present invention.
Figure 12H:
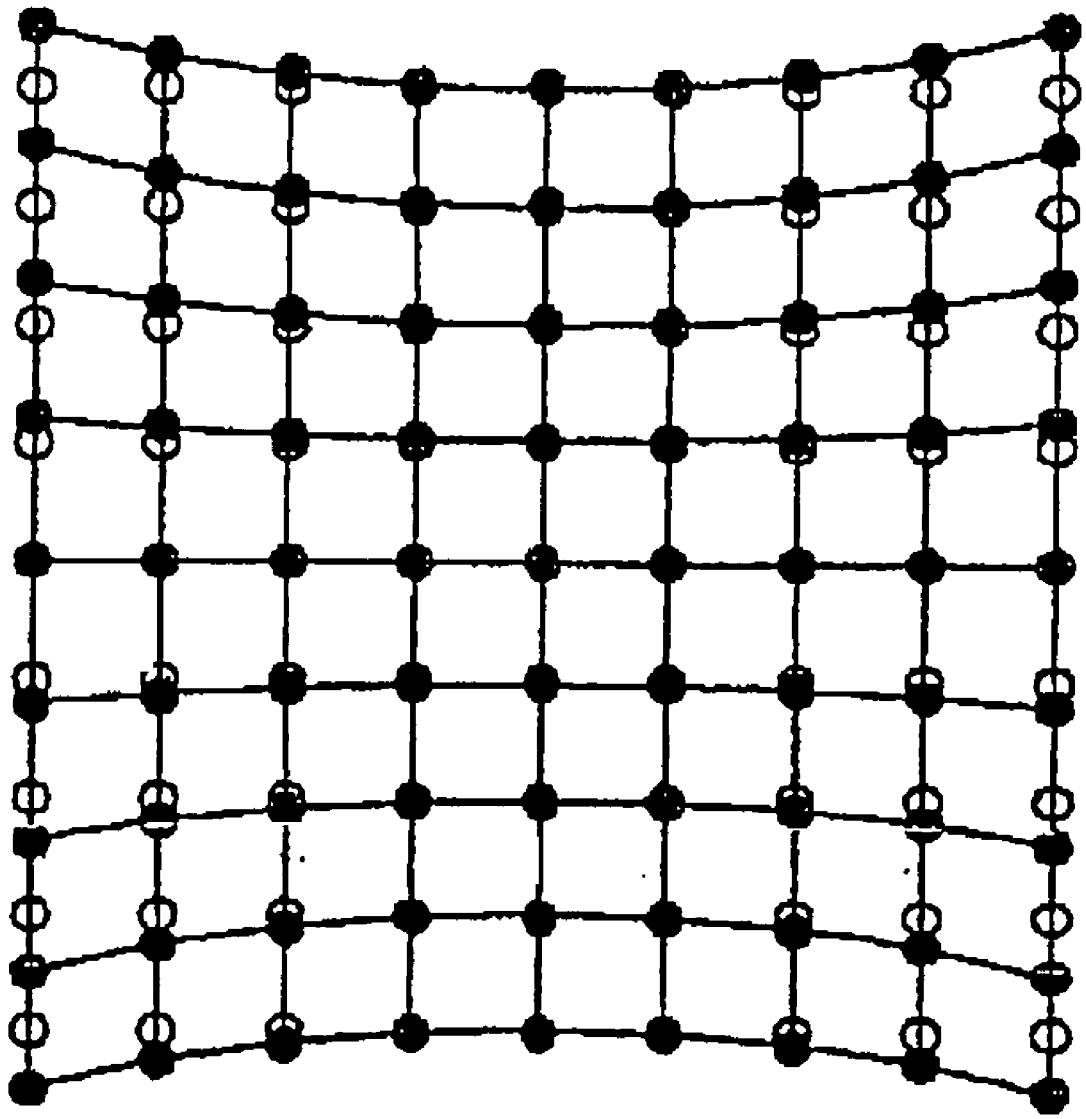
FIG. 12H is a view showing a content of "C-shape Distortion y (dy=Cy__21*y*$x^2$)" components of a correction coefficient in the embodiment of the present invention.
Figure 12I:
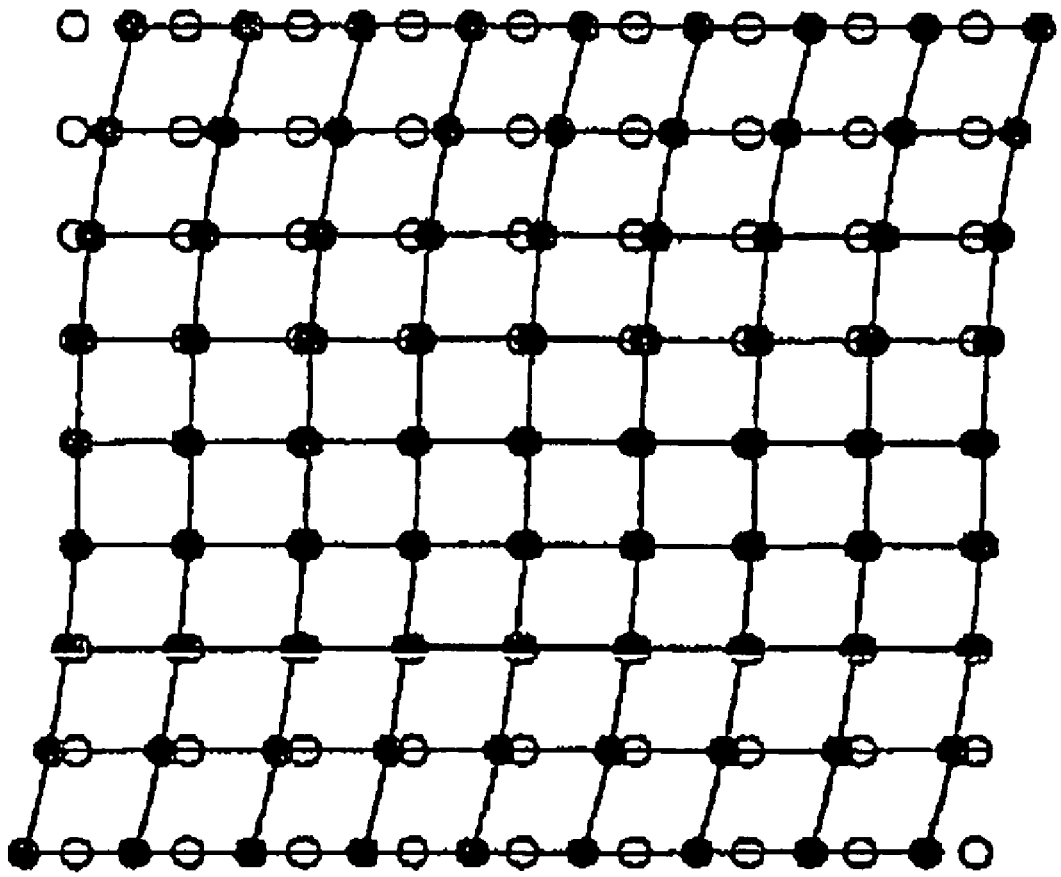
FIG. 12I is a view showing a content of "river flow x (dx=Cx__03*$y^3$)" components of a correction coefficient in the embodiment of the present invention.
Figure 12J:
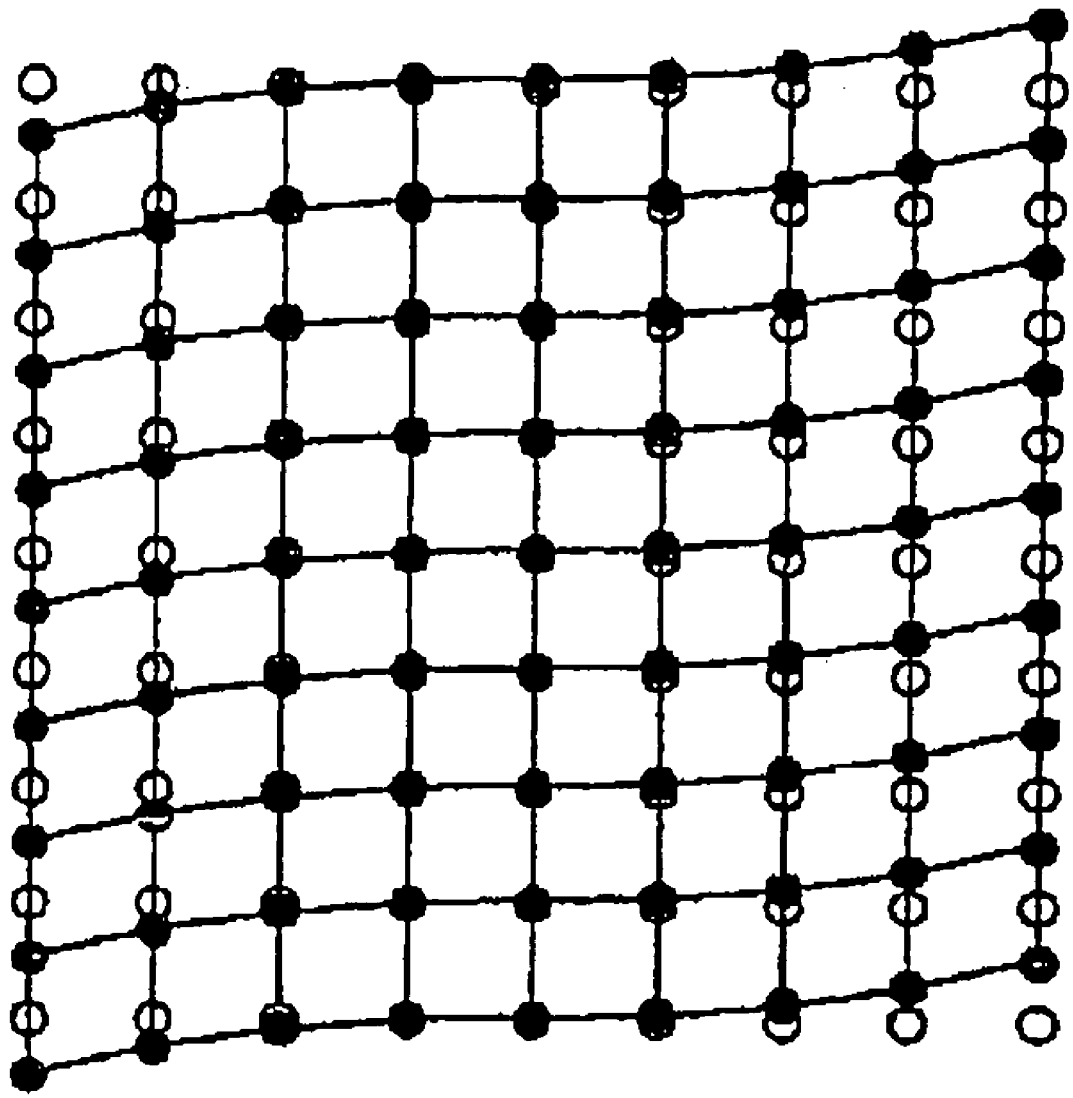
FIG. 12J is a view showing a content of "river flow y (dy=Cy__30*$x^3$)" components of a correction coefficient in the embodiment of the present invention.

In S33, in the case of a wafer to be subjected to GCM measurement, alignment measurement is made on a measurement shot specified in advance in the in-line measurement device 400 and, based on the measurement result, by following an optimization processing flow of a high-order correction coefficient shown in FIG. 10 as a sub-routine, an optimized high-order correction coefficient is calculated (S35). The optimization processing of the high-order correction coefficient will be explained later on.

Next, the EGA measurement calculation in the exposure apparatus 200 is performed (S36), and a high-order correction coefficient determined in S35 is put in the EGA measurement/calculation result in S36 to perform exposure processing (S38).

As to a difference of nonlinear components caused by devices (nonlinear components of wafer deformation obtained by measuring wafer deformation (wafer marks)) between the in-line measurement device 400 and the exposure apparatus 200, it is necessary to calculate a correction value for matching by using a reference wafer in advance. At this time, either one of the EGA measurement result measured on the standard wafer or superimposition measurement result is used. Note that based on an approximate tendency of shot arrangement deformation calculated by the in-line measurement device 400 in the in-line pre-measurement stop, a high-order correction coefficient corresponding to an optimal degree and a correction coefficient may be selected from a plurality of high-order correction coefficients registered in the exposure apparatus 200 side in advance for each corresponding degree (normally, up to cubic, but quartic or higher may be also used).

In the exposure apparatus 200, linear correction (correction of linear components) of wafer deformation is performed based on a result of normal EGA calculation of a measured shot, and shot arrangement deformation correction is performed by also using nonlinear correction (correction of a nonlinear component error) of the wafer deformation by the high-order correction coefficient explained above, and exposure processing is performed.

Here, when calculating the high-order correction coefficient from the EGA measurement/calculation result, zero-order and primary components are corrected doubly, so that zero-order and primary correction coefficients calculated in the normal EGA have to be subtracted from the zero-order and primary correction coefficients. As to existence of deformation components of a shot itself, conditions are made identical for the high-order EGA and normal EGA for calculation. As to a high-order correction coefficient, a calculation result of the high-order EGA is used as it is. When calculating a high-order correction coefficient by dividing components of high-order (quadratic or higher) and lower-order (zero-order and primary), a result of the normal EGA does not have to be subtracted. Also, when calculating a high-order correction coefficient from a superimposition measurement result, an uncorrected residual error is obtained so that a sign of the correction coefficient is inverted for use.

Next, optimization processing of a high-order correction coefficient (GCM correction value) by in-line pre-measurement will be explained with reference to FIG. 10.

First, pre-measurement of an alignment mark on the wafer W is made by the in-line measurement device 400 (S41). Next, an EGA calculation model for optimizing by a high-order EGA, and a degree and correction coefficient to be optimized are specified (S42 and S43). After that, a high-order EGA correction coefficient is calculated (S44), and the calculation of a correction coefficient is repeated for the number of specified wafers (S44 and S45). As the EGA calculation model for optimizing by a high-order EGA, there are a 6-parameter model, a 10-parameter model and an average in shot model, etc. In the case of single-point measurement per shot, the 6-parameter model is designated. In the case of multi-point measurement per shot, the 10-parameter model, average in shot model, and 6-parameter model using any one point per shot is designated.

For specifying a degree to be optimized by a high-order EGA, shot arrangement deformation calculation models expressed by the calculation formulas (5) and (6) are used if it is cubic; and shot arrangement deformation calculation models expressed by the calculation formulas (3) and (4) are used if it is quadratic. Please refer to meanings of respective components of zero-order to cubic correction coefficients of the formulas (5) and (6) shown in FIG. 11A to FIG. 11J and FIG. 12A to FIG. 12J.

Specification of a correction coefficient to be optimized by a high-order EGA is to omitting (=0) correction coefficients having high correlation 80 as to stabilize a high-order correction result. For example, in the case of a cubic term, by omitting correction coefficients $Wx^2Wy$ and $WxWy^2$ from coefficients $Wx^3$, $Wx^2Wy$, $WxWy^2$ and $Wy^3$, a stabilized result of high-order correction is obtained in some cases. The higher the degree becomes, the more effective the omitting of correction coefficients having high correlation becomes.

When calculation of correction coefficients for the number of specified wafers is finished in S45 in FIG. 10, jump wafer data is rejected (S46). The rejection of jump wafer data is processing for omitting wafer data, wherein a residual square sum after high-order correction for each wafer exceeds a threshold. Instead of the residual square sum, a value obtained by dividing a variance of a high-order correction position by a variance of a measurement result position (called a determination coefficient being in a range of 0 to 1. The closer it is to 0, the larger the residual becomes. A variance of the measurement result position is added with a variance of high-order correction point and that of residual.) may be used as a threshold.

Next, it is determined whether calculation of a high-order correction coefficient is finished to all combinations of conditions of degrees and correction coefficients to be optimized by a high-order EGA (S47), when not finished, the procedure returns back to S43 to repeat the processing and, when finished, proceeds to S48 and determines whether calculation for the number of calculation models to be optimized by a high-order EGA is finished. When not finished, the procedure returns back to S42 to repeat the processing and, when finished, proceeds to S49. Next, for each of corresponding degrees (quadratic, cubic, quartic, quintic and higher) of a high-order EGA, from high-order correction coefficients averaged between a plurality of wafers (after rejecting jump wafer data), a high-order correction coefficient having a minimum residual square sum after high-order correction is selected among combinations of optimization conditions and used (S49).

Note that, in the present embodiment, high-order EGA up to cubic was explained, but cases of quartic or higher high-order EGA will be the same.

When notifying the exposure apparatus 200 of a result of pre-measurement by the in-line measurement device 400 or a result of calculating a shot arrangement correction value using EGA or GCM by the pre-measurement control device 450, if an environment for wafers W changes (temperature changes) between the inside of the in-line measurement device 400, a transferring path from taking out from the in-line measurement device 400 to transferring into the exposure apparatus 200, and inside of the exposure apparatus 200, the wafers W thermally expand or contract according to a self thermal expansion rate in response to the temperature change, so that the measurement result or calculation result includes an error in accordance with that.

Thus, in the present embodiment, as shown in FIG. 3, a plurality of sensors for measuring a temperature, etc. are arranged at various places inside the substrate processing apparatus (the exposure apparatus 200 and the coating/developing device 300). A detected temperature from each sensor is supplied to the exposure control device 13, and 13 estimates expansion/contraction of wafers W based on the detected temperature from the sensors and corrects the notified measurement result or calculation result based thereon. Accordingly, even if the temperature changes, errors caused thereby can be suppressed small.

The estimation may be logically made from a temperature change and a thermal expansion rate of the wafer W. Alternately, by measuring a same mark on a same substrate during the exposure sequence or on a trial basis in the in-line measurement device 400 and the exposure apparatus 200, and obtaining a relationship with temperature changes of respective sensors DT1 to DT4 at this time, the estimation can be made based thereon. Note that by obtaining and learning them during the exposure sequence, more accurate estimation can be made.

Note that, among the sensors DT1 to DT4, it is preferable to estimate expansion/contraction of a wafer by using at least measured values by the sensors DT1, DT3 and DT4 in a path (inside the apparatus) for the wafer to pass after pre-measuring the wafer by the in-line measurement device 400 until exposure processing is performed in the exposure apparatus 200. However, it may be configured that the estimation is made only from outputs of freely selected plurality of sensors (for example, a combination of DT1 and DT4, DT1 and DT3 or DT3 and DT4) among the sensors or only from an output of any one sensor.

Distortion Correction (SDM)

Normally, the SDM (Super Distortion Matching) is a function for obtaining a distortion of devices subjected to exposure in the past for each lot based on distortion data and lot history of a projection optical system of each exposure apparatus registered to a database, comparing with a distortion of devices before being exposed, and performing optimal distortion matching on the lot.

When performing distortion correction, a parameter file, stage parameter file and reticle production error file of an optical element, such as a lens, for each exposure apparatus 200 are obtained. By controlling a focusing characteristic adjusting device (MAC1) mounted for controlling focusing characteristics of the projection optical system of the exposure apparatus and for adjusting a position and inclination of an optical element, such as a lens, in the projection optical system, a distortion shape is changed and matching between apparatuses is optimized. Note that when the exposure apparatus is a scanning type, the focusing characteristics can be also adjusted by changing the stage parameter.

In the present invention, by performing in-line/off-line distortion pre-measurement, in addition to distortion correction in units of a lot by comparing between exposure apparatuses in a previous step and subsequent step, distortion correction can be made in units of a specified number of wafers and specified number of shots.

Figure 13:
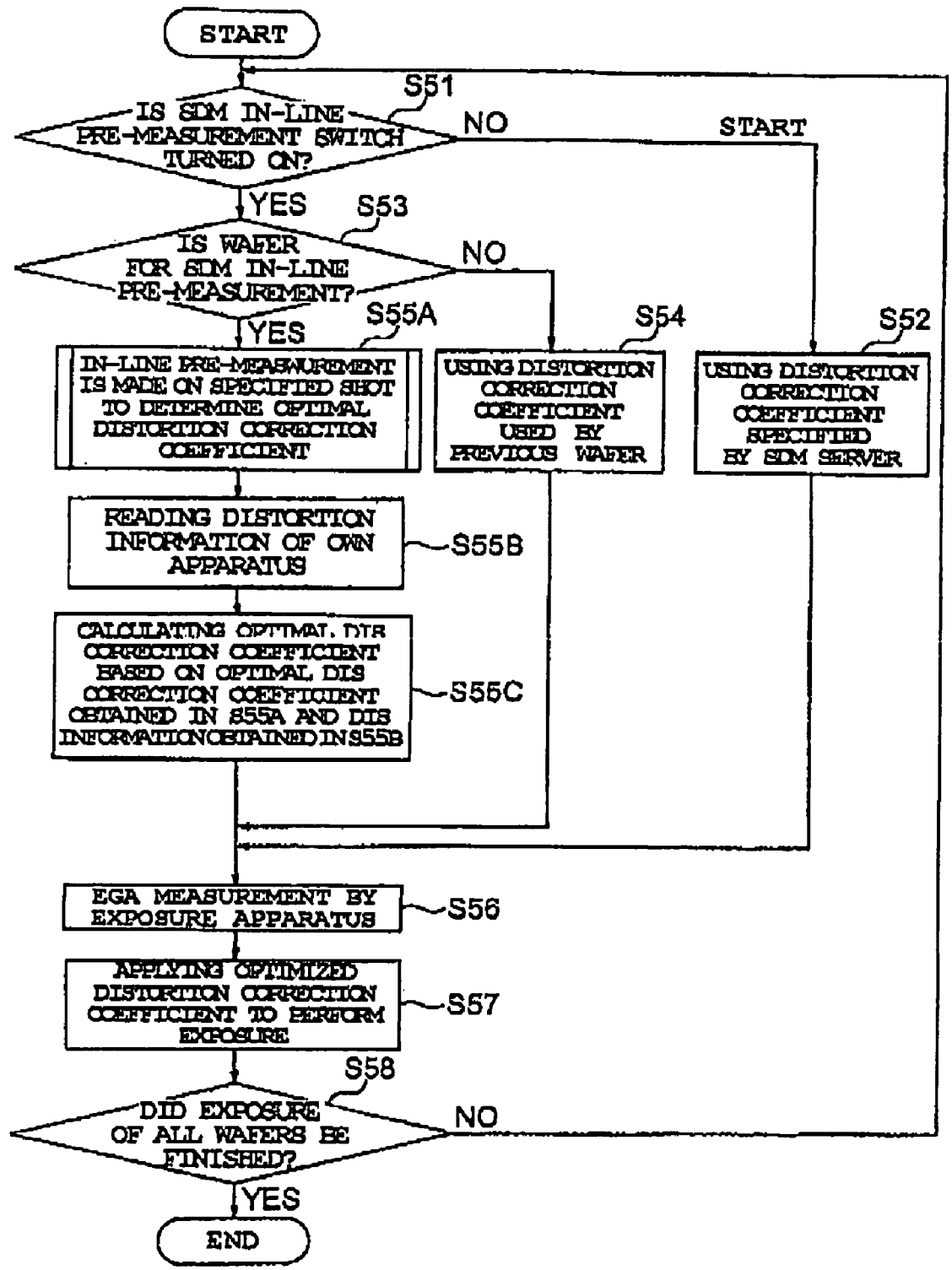
FIG. 13 is a flowchart showing an operation sequence of in-line pre-measurement distortion correction (SDM) of the embodiment of the present invention.

An operation sequence of distortion correction (SDM) by in-line pre-measurement is shown in FIG. 13.

First, it is determined whether an SDM in-line pre-measurement switch (a switch, a switching of which can be freely set by the user) specified in advance is turned on or off (S51) and, when turned off, it is determined to use a distortion correction coefficient specified (prepared) by an SDM server (here, it is a part of the exposure step management controller 500 in FIG. 1) (S52) and EGA measurement in the exposure apparatus 200 is performed (S56), and the distortion correction coefficient determined in S52 is applied to the EGA measurement result in S56 to perform exposure processing (S57). Note that the distortion correction coefficient determined in the S52 is an optimized distortion correction coefficient for performing exposure over again by the own apparatus in consideration of a difference of a distortion of a projection optical system of other apparatus (an exposure apparatus, which burned a pattern of the previous layer on the wafer) and distortion of a projection optical system of the own apparatus (an exposure apparatus to be used in the present step of superimposing on the previous layer from now).

In S51, when the SDM in-line pre-measurement switch is turned on, it is then determined whether it is a wafer to be subjected to SDM in-line pre-measurement (S53) and, when it is not a wafer to be subjected to SDM in-line pre-measurement, use of the distortion correction coefficient used in exposure of the previous wafer (previous lot) is determined (S54), then, EGA measurement in the exposure apparatus 200 is performed (S56), and the distortion correction coefficient determined in the S54 is applied to the EGA measurement result of S56 to perform exposure processing (S57). Note that the distortion correction coefficient determined in the S54 is also an optimized (timing of the optimization is of the previous wafer or previous lot) distortion correction coefficient for performing exposure over again by the own apparatus in consideration of a difference of a distortion of a projection optical system of other apparatus (an exposure apparatus, which burned a pattern of the previous layer on the wafer) and distortion of a projection optical system of the own apparatus (an exposure apparatus to be used in the present step of superimposing on the previous layer from now).

Figure 14:
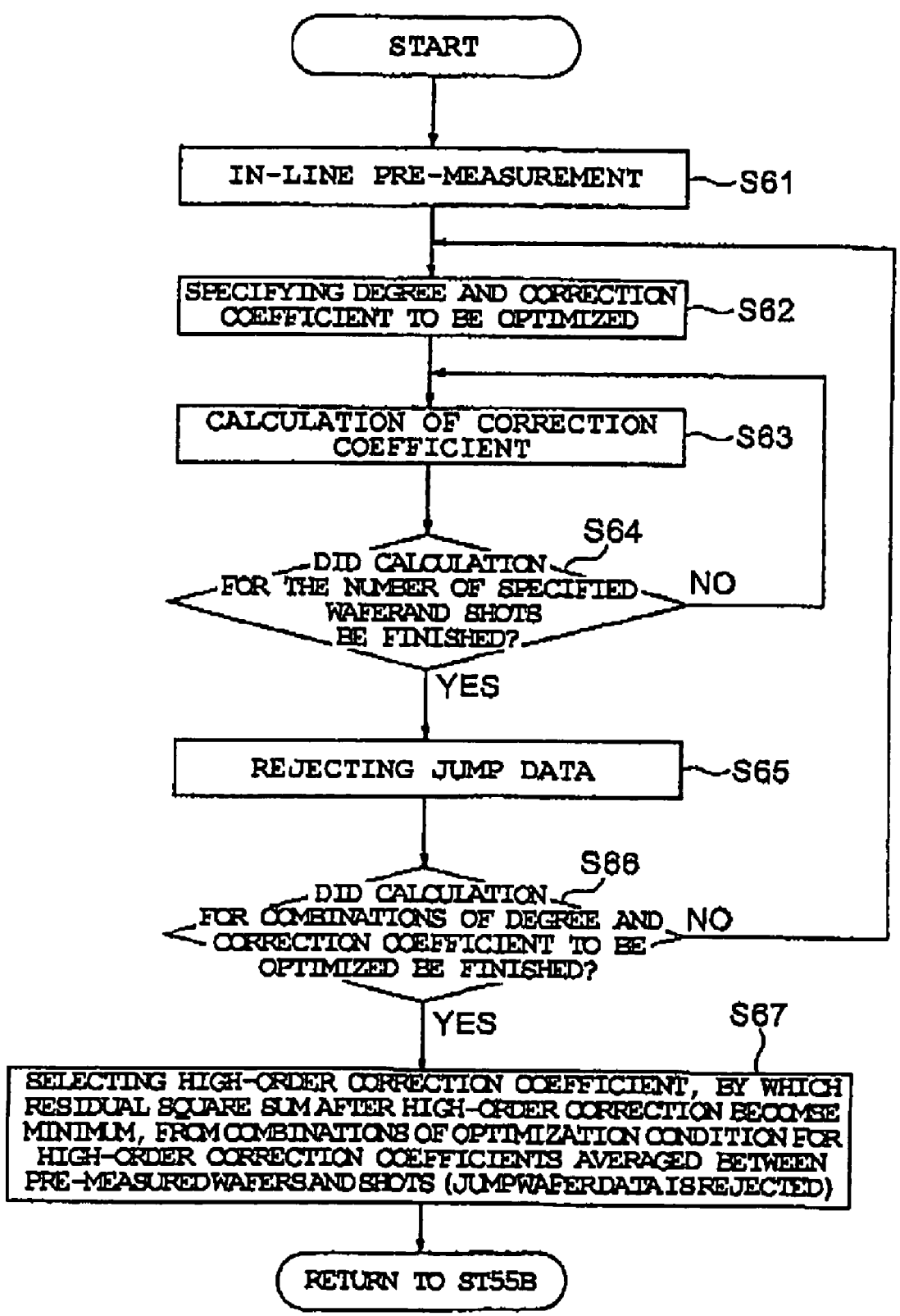
FIG. 14 is a flowchart showing an optimization sequence of a distortion correction coefficient (SDM correction value) by in-line pre-measurement of the embodiment of the present invention.

In S53, when it is a wafer to be subjected to the in-line pre-measurement, in-line pre-measurement is performed in the in-line measurement device 400 on a measurement shot specified in advance and, by following an optimization processing flow (explained later on) shown in FIG. 14, an optimized high-order correction coefficient (information on image distortion of a projection optical system of other exposure apparatus) is calculated (S55A).

Next, distortion information of a projection optical system of an exposure apparatus 200 to be used in the present step (information on image distortion of the projection optical system used in the present step) stored and managed in advance in an internal memory of the exposure apparatus 200, a memory attached to the management controller 500 (the SDM server explained above), or a memory attached to a host system 700 is read (S55B).

Next, based on the high-order correction coefficient (information on distortion of other apparatus) calculated in the S55A and distortion information of the own apparatus read in the S55B (by comparing the both information), an optimal distortion correction coefficient when performing exposure over again by the own apparatus (a correction coefficient and image distortion correction information optimized to match a distortion degree of a pattern to be formed on the wafer by exposure by the own apparatus with a distortion degree of a pattern (a pattern of the previous layer) already formed on the wafer by other apparatus) is calculated (S55C).

Next, in the exposure apparatus (own apparatus) 200, while applying the optimized (obtained in the step S55C) distortion correction coefficient, setting a drive amount (parameter) of a means for adjusting focusing characteristics of the projection optical system (means for driving a lens in the projection optical system and controlling an air pressure between lenses) or setting a stage parameter, such as a scanning speed of a stage during transferring a pattern, in the case of a scanning exposure apparatus; exposure processing is performed with the set parameters (S57).

As to a difference of nonlinear components caused by apparatuses between the in-line measurement device 400 and the exposure apparatus 200, a matching correction value has to be calculated by using a standard wafer in advance. Either one of an EGA measurement result measured on the standard wafer or a superimposing measurement result is used. Note that, based on a distortion shape and approximate inclination calculated based on the in-line pre-measurement, a correction coefficient corresponding to an optimal degree may be selected form a plurality of distortion correction coefficient registered in the SDM server side in advance.

Next, an optimization processing sequence of a distortion correction coefficient (SDM correction value) by the in-line pre-measurement will be explained with reference to FIG. 14.

First, in-line pre-measurement is performed in the in-line measurement device 400 (S61). Next, a degree and correction coefficient to be optimized in the distortion correction are specified (S62), and a correction coefficient is calculated (S63). When specifying a degree to be optimized, calculation models expressed by the calculation formulas (5) and (6) are used if it is cubic, and calculation models expressed by the calculation formulas (3) and (4) are used if it is quadratic. Note that, I the case of distortion correction, shot correction coefficients Cx_sx, Cx_sy, Cy_sx and Cy_sy are omitted (=0) in the formulas 1 to 6.

Specification of a correction coefficient is to omit (=0) correction coefficients having high correlation so as to stabilize the correction result. For example, in the case of a cubic term, by omitting correction coefficients $Wx^2Wy$ and $WxWy^2$ from coefficients $Wx^3$, $Wx^2Wy$, $WxWy^2$ and $Wy^3$, a stabilized result of high-order correction is obtained in some cases. The higher the degree becomes, the more effective the omitting of correction coefficients having high correlation becomes.

Next, it is determined whether calculation for all specified wafers and specified shots are finished (S64) and, when not finished, calculation of a correction coefficient is repeated, while finished, jump data is rejected (S65), then, it is determined whether calculation is finished to all combinations of degrees and correction coefficients to be optimized (S66). When not finished in S66, the procedure returns back to S52 to repeat the processing and, when finished, for each of corresponding degrees (quadratic, cubic, quartic, quintic and higher), from wafers and shots after pre-measurement (jump data is rejected), a high-order correction coefficient having a minimum residual square sum after high-order correction is selected among combinations of optimization conditions and used for distortion correction (S67).

Also, in the rejection of jump data in S65 is for omitting data, wherein a residual square sum after high-order correction for each shot exceeds a threshold. Instead of the residual square sum, a value obtained by dividing a variance of a high-order correction position by a variance of a measurement result position (called a determination coefficient being in a range of 0 to 1. The closer it is to 0, the larger the residual becomes. A variance of the measurement result position is added with a variance of high-order correction point and that of residual.) may be used as a threshold.

Note that, in the present embodiment, distortion correction up to cubic was explained, but correction of quartic or higher high-order will be the same.

Focus Level Difference Correction

Figure 15:
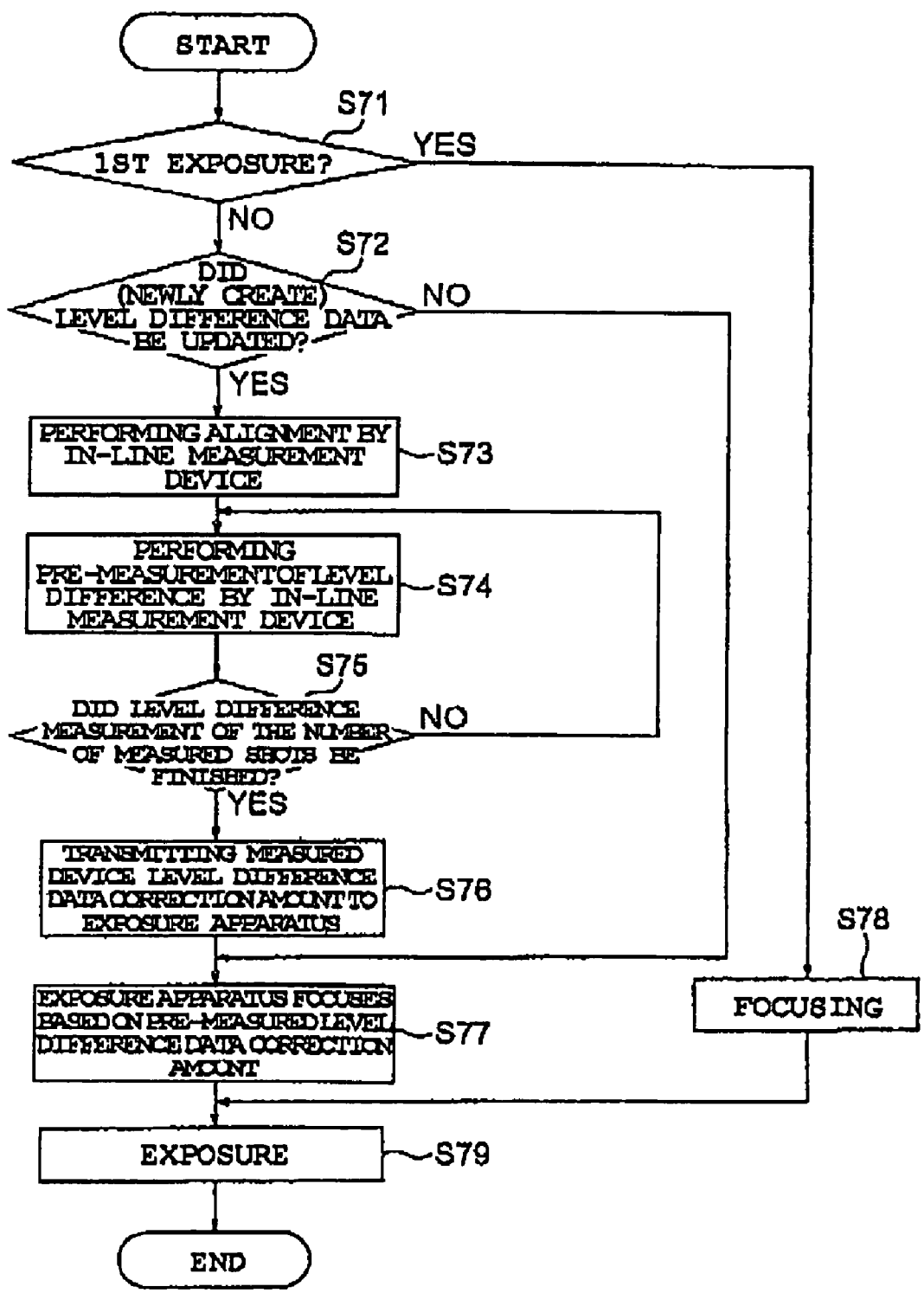
FIG. 15 is a flowchart showing an operation sequence of focus level difference correction by in-line pre-measurement.

An operation sequence of focus level difference by the in-line pre-measurement is shown in FIG. 15.

First, it is determined whether it is 1ST exposure (exposure for the first layer) or not (S71) and, when it is the 1ST exposure, exposure is performed by focusing without device level difference correction (S78). In S71, when it is not the 1ST exposure, update of level difference data (when there is no previous data, level difference data is newly created) or not is determined (S72) and, when updating level difference data, a device level difference measurement is made for the number of measurement shots (S74 and S75) after performing alignment in the in-line measurement device 400 (S73).

Next, a level difference correction amount (data) is calculated and transmitted to the exposure apparatus 200 (S76). When calculating the level difference correction amount, level difference data of each measurement shot is road for the number of measurement times, converted to a coordinate system in the shot, and averaging in the same shot is performed. At this time, positional deviation of a detection point is compensated by least square approximation, spline or Fourier series, etc. and matching of the position in level difference data is performed. For each measurement shot, lattice-like data arranged at specified pitches in the X and Y directions based on the shot center position is obtained. Also at this time, a compensation function in accordance with need is used.

For data of a selected position in the lattice-like data, a suitable offset and weight are set and an approximation plane is calculated for each measurement shot. The approximation plane may be a flat surface or a curved surface. Then, level data of each measurement shot is converted to differential data (offset data) from the approximation data. Note that level data being away from the approximation surface by a first threshold specified by a parameter or more is excepted from approximation plane calculation.

Also, data being away from the approximation plane by a second threshold specified as a parameter or more (abnormal value data) is detected, a measurement shot having abnormal value data in an amount specified as a parameter or larger is considered as an unsuccessful shot, level difference data of only successful shot is averaged, and a device level difference correction amount is calculated. Also, at the averaging here, compensation in accordance with need is performed. Also, abnormal value data, etc. detected at this time is transmitted to the in-plant production management host system 700.

The in-plant production management host system 700 transmits abnormal value data to an external wafer defect check device or to the off-line measurement device 600 composed of a review station, etc. From the above, a correction amount is obtained.

The exposure apparatus 200 performs focus adjustment based on the level difference data correction amount measured in advance (s77) and, then, exposure processing is performed (S79).

Phase Shift Focus Monitor

Phase shift focus monitor marks are formed on a process wafer in advance, and before processing in the exposure apparatus 200 (before transferring the process wafer into the exposure apparatus), by making alignment measurement of the phase shift focus monitor marks formed on the process wafer W, focus deviation at each mark position can be measured. Then, based on the measurement (pre-measurement) result, optimized correction values of focus offset and leveling offset can be calculated before exposure processing. A reticle pattern of the focus monitor is designed to be able to convert a focus error ΔZ to superimposition errors ΔX and ΔY by utilizing the fact that an image changes asymmetrically in accordance with a change of focus when using a shifter other than 180°. One chrome line is placed between a shifter portion and non-shifter portion. Note that a phase shift amount of the shifter portion is not 180°, but 90°. Focus offset and leveling offset are calculated by putting a large amount of phase shift focus monitor patterns in one shot and making in-line pre-measurement, and by notifying to the exposure apparatus 200, optimal focus correction can be made.

Apparatus Maintenance Improvement

The in-line measurement device 400 measures information on a line width and shape of a pattern formed on a wafer W and defects of the pattern, a quality of the pattern is evaluated and made to a score in accordance with the level, then, it is notified together with row signal waveform data to the exposure apparatus 200. Based on the evaluation result notified from the in-line measurement device 400, the exposure apparatus 200 specifies a defective part or a part close to defective of the pattern and, based on raw signal waveform data of the parts, various trace data, superimposition measurement data and EGA (alignment) calculation result are obtained, and a shot position to be analyzed is selected. Next, by obtaining the various trace data including a defective part and a part close to defective, superimposition measurement data and EGA (alignment) calculation result from the exposure apparatus, and correlation with pattern defects is analyzed. Here, the superimposition measurement data may be obtained from other measurement device than the exposure apparatus. As an analyzing content, focus trance data, exposure amount trace data and synchronization accuracy trace data are analyzed separately, and pattern size control performance is estimated. From the superimposition measurement data and EGA (alignment) calculation result, a superimposition control performance is estimated. When correlation with defects is observed, in accordance with need, operation parameters of the exposure apparatus 200 are corrected for maintenance of the apparatus. Below, each analyzing methods will be explained.

(1) Analysis of Pattern Size Control Based on Focus Trace Data

Focus trace data during exposure processing is obtained on the exposure apparatus 200 side. By reflecting a Z following error, pitch following error and roll following error of the focus trace to pre-measured shot flatness, (A) a Z average (mean) and (B) Z standard deviation (mod) are calculated. Line width values (an actually measured value by the SEM and OCD methods or a calculated value by a space image simulator) for each of the Z average and Z standard deviation are stored as a table for each image height (considering an effect of optical aberration mainly by image plane curvature). Furthermore, the line width value table files are hold for each exposure condition. As the exposure condition, an exposure wavelength $\lambda$, projection lens numerical aperture NA, illumination $\sigma$, illumination condition (normal illumination and modified illumination), kind of mask pattern (binary, halftone, Levenson, etc.), mask line width, target line width and pattern pitches etc. may be mentioned. The line width value table is referred to based on flatness measured for each shot and focus trace data during exposure processing, and a line width value under the corresponding condition is calculated. As a result, an actual line width value is estimated without actually measuring the pattern line width and, if line width abnormality is detected, defect prevention measures, such as a reduction of scan speed, update of level difference correction, change of a focus control method and maintenance of the apparatus, can be made in real time after exposure.

(2) Analysis of Pattern Size Control and Superimposition Control Based on Synchronization Accuracy Trace Data Synchronization accuracy indicates a following deviation amount (X, Y, $\theta$) of a reticle stage with respect to a wafer stage in an exposure slit region during scanning and is evaluated by a move average amount (mean) and a move standard deviation value (msd). The move average value (Xmean/Ymean) affects on disposition during scanning and affects on superimposition accuracy. The move standard deviation value (Xmsd/Ymsd) deteriorates contrast on the image plane and affects on pattern size accuracy. It is determined whether these values are within permissive values and, if exceeding the permissive values, defect prevention measures, such as a reduction of scan speed, update of level difference correction, change of a focus control method and maintenance of the apparatus, can be made in real time after exposure.

(3) Analysis of Pattern Size Control Based on Exposure Amount Trace Data

Exposure amount results of every certain time are recorded in the trace data. The exposure amount is evaluated by an exposure amount average in a alit region at each position during scanning. It is determined whether the value is within a permissive value and, if exceeding the permissive value, defeat prevention measures, such as a reduction of scan speed, change of a exposure amount control method and maintenance of the apparatus, can be made in real time after exposure.

(4) Analysis of Superimposition Control Based on Superimposition Measurement Data and EGA (Alignment) Calculation Result Data obtained by using a superimposition measurement device or a superimposition measurement system incorporated in the exposure apparatus is analyzed. It is determined whether a superimposition measurement result at a defective part is within a permissive value or not. Furthermore, it is determined whether residual components (nonlinear components) for making EGA (alignment) correction on superimposition deviation are within a permissive value of not. Also, EGA (alignment) calculation results are compared between wafers and lots to check if there is no large change.

Optimization of Measurement Condition (1) optimization of Measurement Condition of Pre-Measurement by Operation State of Exposure Apparatus For example, when calibration or retry arises in the exposure apparatus 200, exposure processing delays exactly for time taken thereby. In other words, even if time taken by pre-measurement is made longer exactly for that time, throughput of the exposure processing is not adversely affected. On the other hand, in the pre-measurement step, the larger the number of measuring items, measurement number and data amount, etc. are, the more precise analysis and accurate calculation of correction values, etc. become possible. Accordingly, in accordance with an operation state (state of suspension of exposure processing, etc.) of the exposure apparatus 200, it is preferable to optimize a measurement condition in the pre-measurement condition. Optimization in that case is preferably made so as to attain the largest possible number of measurement items, number of measurement points and measurement data amount in a range of not declining the throughput of the exposure processing. As a result, more precise analysis and accurate calculation of correction values become possible without giving adverse effects on the throughput and, furthermore, the exposure accuracy can be improved.

(2) Optimization of Measurement Condition of Pre-Measurement by Periodicity

The exposure system explained in the above embodiment is capable of making pre-measurement basically all process wafers to be transferred to the exposure apparatus 200 by the in-line measurement device 400 before transferring them into the exposure apparatus 200. It is also possible to make pre-measurement on all process wafers, find some sort of abnormal states (for example, a measurement candidate mark is immeasurable) from the measurement results and accumulate data of such abnormality occurrence states (timing and frequency of arising of abnormality or content of the abnormality).

By analyzing (evaluating) the data of abnormality occurrence states gathered as above, tendency of abnormality occurrence (timing and frequency of abnormality occurrence of each content of abnormality) can be presumed.

Here, by using abnormality occurrence states data, it is presumed that what kind of error (abnormality) tends to arise at what timing and what data (kinds of data) should be pre-measured in what amount (data amount) when the error arises (for example, for a purpose of helping to solve a cause of the abnormality occurrence). Then, based on the presumption, a pre-measurement condition is optimized.

For example, by focusing on a cycle, if what kind of abnormality arises at what frequency in the cycle is analyzed, measurement contents (kinds of data and data amount to be pre-measured) that should be pre-measured for each cycle can be optimized. As the cycle, a cycle of taking in processing wafers to the exposure apparatus in units of lot (cycle between lots), a cycle of wafers in a lot (every n-number of wafers) and a cycle over time (time, year, month and day), etc. may be considered.

(3) Optimization of Measurement Condition of Pre-Measurement by Error Frequency

When errors frequently arise in the previous step, a cause of the errors has to be specified. Thus, in the present invention, by optimizing a measurement condition in the pre-measurement stop in accordance with the number of errors, more specifically, making pre-measurement under an effective measurement condition for analyzing a cause of the trouble and abnormality, the cause of the trouble and abnormality can be more accurately specified.

(4) Optimization of Measurement Condition on Exposure Apparatus Side by Measurement Condition of Pre-Measurement For example, if the pre-measured results are quite preferable, it is considered unnecessary to collect same data as the pre-measurement in the exposure apparatus 200 and re-measurement of unnecessary data is wasteful. To eliminate such needlessness, based on the pre-measured data, it is preferable to optimize a collecting condition of the data including whether or not to collect relating data of the substrate at exposure in the exposure apparatus. Also, in addition to whether or not to collect data, collection (measurement) of the data itself is performed also on the exposure apparatus side, but it may be configured to increase/decrease (a measurement amount of the same data on the exposure apparatus is decreased if the pre-measurement results are preferable) a collection amount of the data (data amount, measurement amount) (based on the pre-measured result).

(5) Optimization of Measurement Condition of Pre-Measurement by Measurement Condition of Exposure Apparatus For example, if data to be collected in the exposure apparatus is also collected in the pre-measurement, the same data is collected doubly and is not effective in some case. Accordingly, by optimizing a data collection condition in the pre-measurement stop based on a collection condition of data to be collected at exposure in the exposure apparatus 200, for example, by preventing double collection, high efficiency can be attained in data collecting.

Device Production Method

Next, a production method of a device of using the exposure system in the lithography step will be explained.

FIG. 16 is a flowchart showing production stops of an electronic device, such as IC, LSI or other semiconductor chip, liquid crystal panel, CCD, thin film magnetic head and micro-machine. As shown in FIG. 16, in the production steps of an electronic device, first, functions and performance of the device is designed, such that circuit of an electronic device is designed, a pattern for realizing the functions is designed (step S81), next, a mask with a designed circuit pattern formed thereon is produced (step S32). On the other hand, silicon or other material is used to produce a wafer (silicon substrate) (step S83).

Next, by using the mask produced in the step S82 and the wafer produced in the step S83, an actual circuit, etc. is formed on the wafer by a lithography technique, etc. (step S84). Specifically, first, a thin film over an insulation film, electrode wiring film or a semiconductor film is formed on the wafer surface (step S841), next, a photosensitive agent (resist) is coated allover the thin film by using a resist coating device (coater) (step S642). Next, the resist coated substrate is loaded on a wafer holder of the exposure apparatus and the mask produced in the step S83 is loaded on a reticle stage, then, a pattern formed on the mask is transferred by being reduced on the wafer (step S843). At this time, in the exposure apparatus, respective shot regions on the wafer are successively aligned by the alignment method according to the present invention explained above, and the pattern of the mask is successively transferred to the respective shot regions.

When exposure is completed, the wafer is unloaded from the wafer holder and developed by using a developing device (developer) (step S844). As a result, a resist image of the mask pattern is formed on the wafer surface. Then, the wafer finished with the development step is subjected to etching processing by using an etching device (step S845), and resist remaining on the wafer surface is removed by using, for example, a plasma ashing device, etc. (step S846).

As a result, a pattern of an insulation film and electrode wiring, etc. is formed on each shot region on the wafer. By repeating the processing successively by changing a mask, an actual circuit, etc. is formed on the wafer. When the circuit, etc. is formed on the wafer, assembling as a device is performed next (step S85). Specifically, the wafer is diced to be respectively separate chips, the chips are mounted on a lead flame and package, bonding to connecting to electrodes is made, and packaging processing, such as resin sealing, etc. is performed. Then, an operation confirmation test, durability test and other inspection is conducted on a produced device (step S96), and the result is shipped, etc. as a completed device.

Note that the embodiment explained above is described to facilitate understanding of the present invention and is not to limit the present invention. Accordingly, respective elements disclosed in the above embodiments include all design modifications and equivalents belonging to the technical scope of the present invention.

Also, in the above embodiment, a step-and-repeat type exposure apparatus was taken as an example of an exposure apparatus, but the present invention can be applied to a step-and-scan type exposure apparatus. Also, in addition to exposure apparatuses to be used for producing semiconductor elements and liquid crystal display elements, the present invention can be applied to an exposure apparatus used for producing a plasma display, thin film magnetic head and image pickup divide (CCD, etc.), etc. and an exposure apparatus for transferring a circuit pattern of a glass substrate or a silicon wafer for producing a mask. Namely, the present invention can be applied regardless of an exposure type and use, etc. of the exposure apparatus.

Also, the present invention is not limited to a step-and-scan type exposure apparatus as in the above embodiment and may be applied in the same way to various types of exposure apparatuses, such as a step-and-repeat type and proximity type exposure apparatuses (X-ray exposure apparatus, etc.).

Also, the illumination light (energy beam) for exposure used in the exposure apparatus is not limited to an ultraviolet ray and may be an X-ray (including an EUV ray), a charged particle ray, such as an electron beam and ion beam. Also, an exposure apparatus used for producing a DNA chip, mask and reticle, etc. may be applied.

Furthermore, in the above embodiment, the case of applying the present invention to an exposure system was explained, but the present invention can be applied generally to devices performing alignment on an object, such as a transfer device, measurement device, inspection device and testing device.

Note that in the above embodiment, a light transmissive mask obtained by forming a predetermined light block pattern (or a phase pattern and dark pattern) on a light transmissive substrate or a light reflection mask obtained by forming a predetermined reflection pattern on a light reflection type substrate were used. But, instead of these masks, an electronic mask for forming a transmission pattern, reflection pattern or light emitting pattern based on electron data of a pattern to be exposed may be used. Such electronic masks are disclosed, for example, in the U.S. Pat. No. 6,778,257. Here, a publication of the U.S. Pat. No. 6,778,257 is incorporated for reference.

Note that the above electronic mask is a concept including both of a nonemissive image display element and self-emissive image display element. Here, nonemissive image display elements are also called spatial light modulators and are elements for spatially modulating a state of a light amplitude, phase or polarization, which are divided to transmissive spatial light modulators and reflection spatial light modulators. The transmissive type spatial light modulators include a transmissive liquid crystal display element and electrochromic display (ECD), etc. Also, the reflection spatial light modulators include a DMD (digital mirror device or digital micro-mirror device), reflection mirror array, reflection liquid crystal display device, electrophoretic display (EPD), electronic paper (or electronic ink) and grating light valve, etc.

Also, the self-emissive image display devices include a CRT (cathode ray tube), inorganic EL (electro luminescence) display, organic EL (electro luminescence) display, field emission display (FED), plasma display panel (PDP), solid light source chip having a plurality or light emission points, solid light source chip array obtained by arranging a plurality of chips in an array, and solid light source array obtained by incorporating a plurality of light emission points in one substrate (for example, a LED (light emitting diode) display, OLED (organic light emitting diode) display and LD (laser diode) display, etc.), etc. Note that when a fluorescent substance provided to each pixel of a well-known plasma display is removed, it becomes a self-emissive image display element for emitting a light in an ultraviolet range.

The present disclosure relates to the subject included in the Japanese Patent Application No. 2004-056167, and all of the disclosure is clearly incorporated here as references.

The invention claimed is:

1. An exposure method, comprising:
   pre-measuring a mark formed on a substrate before transferring the substrate into an exposure apparatus which exposes the substrate, the pre-measuring being performed on every substrate to be exposed by the exposure apparatus;
   notifying waveform data of the mark measured in said pre-measuring to at least one device among said exposure apparatus, an analyzing device provided separately from the exposure apparatus, and a management device positioned higher than the exposure apparatus and the analyzing device for managing at least one of the exposure apparatus and the analyzing device; and
   aligning and exposing the substrate in the exposure apparatus based on the waveform data of the mark notified in said notifying to at least one device among said exposure apparatus, said analyzing device and said management device, wherein
   said pre-measuring and said aligning are performed in parallel as pipeline processing.

2. The exposure method as set forth in claim 1, further comprising:
   evaluating the mark measured in said pre-measuring based on a predetermined evaluation criterion; wherein
   said notifying is capable of selecting notification of said waveform data and prohibition of the notification in accordance with an evaluation result in said evaluating.

3. The exposure method as set forth in claim 2, wherein said notifying notifies said evaluation result in the case of not notifying of said waveform data, and said aligning and exposing are performed based on at least one of said waveform data and said evaluation result notified in said notifying.

4. The exposure method as set forth in claim 1, further comprising selecting a mark from a plurality of marks formed on the substrate as an optimal mark to be measured for use for alignment of the substrate in said exposure apparatus based on at least one of said waveform data and said evaluation result notified in said notifying.

5. The exposure method as set forth in claim 1, further comprising selecting a measurement condition as an optimal measurement condition at the time of measuring the mark for use for alignment of the substrate in said exposure apparatus based on at least one of said waveform data and said evaluation result notified in said notifying.

6. The exposure method as set forth in claim 1, wherein said marks formed on said substrate include at least one of a pre-alignment mark or a contour characteristic part of the substrate for preliminarily aligning said substrate, a fine alignment mark for accurately aligning the substrate, and a search alignment mark for searching the fine alignment mark of the substrate.

7. The exposure method as set forth in claim 5, wherein said measurement condition includes the number of marks to be used for aligning said substrate in said exposure apparatus, a mark arrangement, a focus offset, an illumination condition used for the measurement and a statistic processing mode.

8. The exposure method as set forth in claim 2, wherein said evaluating generates an evaluation result made to be a score based on said predetermined evaluation criterion.

9. The exposure method as set forth in claim 1, further comprising:
   main measuring a mark formed on said substrate after the substrate is transferred into said exposure apparatus; and
   matching a mark evaluation criterion of a measurement device used for measuring in said pre-measuring and that of a measurement device used for measuring in said main measuring based on a measurement result of said main measuring and at least one of said waveform data and said evaluation result notified in said notifying step.

10. The exposure method as set forth in claim 1, wherein said pre-measuring is performed by a measurement device provided in a coating/developing device connected in-line to said exposure apparatus.

11. The exposure method as set forth in claim 1, wherein said pre-measuring is performed by a measurement device provided separately from said exposure apparatus.

12. An exposure system, comprising:
   a pre-measurement device which measures marks formed on a substrate before transferring the substrate to an exposure apparatus, the pre-measurement device being configured to measure marks on every substrate to be exposed by the exposure apparatus;

a notification device which notifies waveform data of the marks measured in said pre-measurement device to at least one device among said exposure apparatus, an analyzing device provided separately from the exposure apparatus, and a management device positioned higher than the exposure apparatus and the analyzing device which manages at least one of the exposure apparatus and the analyzing device, wherein the exposure apparatus aligns and exposes the substrate based on the waveform data of the mark notified by said notification device to at least one device among said exposure apparatus, said analyzing device and said management device, and said pre-measurement device and said exposure apparatus perform said pre-measurement, and said alignment and exposure in parallel as pipeline processing.

13. The exposure system as set forth in claim 12, further comprising:

an evaluation device which evaluates the marks measured in said pre-measurement device based on a predetermined evaluation criterion; wherein said notification device is capable of selecting notification of said pre-measurement result and/or said waveform data and prohibition of the notification in accordance with an evaluation result by said evaluation device.

* * * * *

UNITED STATES PATENT AND TRADEMARK OFFICE
CERTIFICATE OF CORRECTION

PATENT NO. : 7,728,953 B2 Page 1 of 1
APPLICATION NO. : 11/513161
DATED : June 1, 2010
INVENTOR(S) : Yuuki Ishii et al.

It is certified that error appears in the above-identified patent and that said Letters Patent is hereby corrected as shown below:

Cover Page reads:
"(75) Inventors: Hiroyuki Suzuki, Chofu (JP); Yuuiki Ishii, Yokohama (JP); Shinishi Okita, Nishi-tokyo (JP)"

Should read as follows:
--(75) Inventors: Yuuki Ishii, Yokohama (JP); Hiroyuki Suzuki, Chofu (JP); Shinishi Okita, Nishi-tokyo (JP)--

Signed and Sealed this

Thirty-first Day of August, 2010

David J. Kappos
*Director of the United States Patent and Trademark Office*